(12) United States Patent
Shibazaki

(10) Patent No.: US 8,705,008 B2
(45) Date of Patent: Apr. 22, 2014

(54) SUBSTRATE HOLDING UNIT, EXPOSURE APPARATUS HAVING SAME, EXPOSURE METHOD, METHOD FOR PRODUCING DEVICE, AND LIQUID REPELLANT PLATE

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/629,070

(22) PCT Filed: Jun. 8, 2005

(86) PCT No.: PCT/JP2005/010458
§ 371 (c)(1),
(2), (4) Date: Dec. 11, 2006

(87) PCT Pub. No.: WO2005/122219
PCT Pub. Date: Dec. 22, 2005

(65) Prior Publication Data
US 2007/0177125 A1    Aug. 2, 2007

(30) Foreign Application Priority Data

Jun. 9, 2004  (JP) .................................. 2004-171116
Jul. 12, 2004  (JP) .................................. 2004-205008

(51) Int. Cl.
*G03B 27/58* (2006.01)
(52) U.S. Cl.
USPC .......................................................... 355/72
(58) Field of Classification Search
USPC .................................... 355/72, 30, 53, 73–76
See application file for complete search history.

(56) References Cited

U.S. PATENT DOCUMENTS

| | | | |
|---|---|---|---|
| 4,346,164 A | 8/1982 | Tabarelli et al. |
| 4,480,910 A | 11/1984 | Takanashi et al. |
| 4,655,594 A | 4/1987 | Wittekoek et al. |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |

(Continued)

FOREIGN PATENT DOCUMENTS

| | | |
|---|---|---|
| CN | 1501175 A | 6/2004 |
| DE | 221 563 A1 | 4/1985 |

(Continued)

OTHER PUBLICATIONS

Japanese Patent Office, Notice of Reasons for Rejection mailed on Oct. 12, 2010 in Japanese Patent Application No. 2005-169547 w/English-language Translation.

(Continued)

*Primary Examiner* — Toan Ton
*Assistant Examiner* — Chia-how Michael Liu
(74) *Attorney, Agent, or Firm* — Oliff PLC

(57) ABSTRACT

A substrate holder includes a base; a first holding portion which is formed on the base and which attracts and holds a substrate; and a second holding portion which is formed on the base and which attracts and holds a plate member in the vicinity of the substrate attracted and held by the first holding portion. In an exposure apparatus including such a substrate holder, the plate can be exchanged easily, thereby making the maintenance of the apparatus easy. Consequently, such an exposure apparatus is suitable for immersion exposure.

38 Claims, 17 Drawing Sheets

(56) References Cited

U.S. PATENT DOCUMENTS

| | | |
|---|---|---|
| 5,825,043 A | 10/1998 | Suwa |
| 5,839,324 A | 11/1998 | Hara |
| 5,874,820 A | 2/1999 | Lee |
| 5,969,441 A | 10/1999 | Loopstra et al. |
| 5,999,589 A | 12/1999 | Chiba et al. |
| 6,151,102 A | 11/2000 | Nishi |
| 6,191,429 B1 | 2/2001 | Suwa |
| 6,208,407 B1 | 3/2001 | Loopstra |
| 6,341,007 B1 | 1/2002 | Nishi et al. |
| 6,400,441 B1 | 6/2002 | Nishi et al. |
| 6,513,796 B2 * | 2/2003 | Leidy et al. ............ 269/21 |
| 6,549,269 B1 | 4/2003 | Nishi et al. |
| 6,590,634 B1 | 7/2003 | Nishi et al. |
| 6,710,857 B2 | 3/2004 | Kondo |
| 6,778,257 B2 | 8/2004 | Bleeker et al. |
| 6,788,393 B2 | 9/2004 | Inoue |
| 6,801,301 B2 * | 10/2004 | Miyajima et al. ........ 355/72 |
| 6,875,987 B2 | 4/2005 | Kondo |
| 6,897,963 B1 | 5/2005 | Taniguchi et al. |
| 7,075,616 B2 | 7/2006 | Derksen et al. |
| 7,425,238 B2 | 9/2008 | Muto et al. |
| 2002/0041377 A1 | 4/2002 | Hagiwara et al. |
| 2002/0061469 A1 | 5/2002 | Tanaka |
| 2004/0160582 A1 | 8/2004 | Lof et al. |
| 2004/0165159 A1 | 8/2004 | Lof et al. |
| 2005/0219488 A1 | 10/2005 | Nei et al. |
| 2005/0259234 A1 | 11/2005 | Hirukawa et al. |
| 2006/0139614 A1 | 6/2006 | Owa et al. |

FOREIGN PATENT DOCUMENTS

| | | |
|---|---|---|
| DE | 224 448 A1 | 7/1985 |
| EP | 1 420 298 A2 | 5/2004 |
| EP | 1 420 299 A2 | 5/2004 |
| EP | 1 429 188 A2 | 6/2004 |
| EP | 1 486 828 A2 | 12/2004 |
| EP | 1 571 695 A1 | 9/2005 |
| EP | 1 670 039 A1 | 6/2006 |
| EP | 1 679 737 A1 | 7/2006 |
| EP | 1 699 072 A1 | 9/2006 |
| EP | 1 699 073 A1 | 9/2006 |
| JP | A-57-117238 | 7/1982 |
| JP | S58-202448 | 11/1983 |
| JP | S59-019912 | 2/1984 |
| JP | A-59-101835 | 6/1984 |
| JP | A-61-44429 | 3/1986 |
| JP | S62-065326 | 3/1987 |
| JP | S63-157419 | 6/1988 |
| JP | A-4-65603 | 3/1992 |
| JP | A 04-305915 | 10/1992 |
| JP | A 04-305917 | 10/1992 |
| JP | A 05-062877 | 3/1993 |
| JP | A-5-175098 | 7/1993 |
| JP | A-05-175098 | 7/1993 |
| JP | A 05-175098 | 7/1993 |
| JP | A-6-53120 | 2/1994 |
| JP | A 06-124873 | 5/1994 |
| JP | A-6-188169 | 7/1994 |
| JP | A-07-142559 | 6/1995 |
| JP | A-7-176468 | 7/1995 |
| JP | A 07-220990 | 8/1995 |
| JP | A-8-37149 | 2/1996 |
| JP | A-8-166475 | 6/1996 |
| JP | A-08-181054 | 7/1996 |
| JP | A 08-316125 | 11/1996 |
| JP | A-8-330224 | 12/1996 |
| JP | A-9-5463 | 1/1997 |
| JP | A-H10-135115 | 5/1998 |
| JP | A-H10-144593 | 5/1998 |
| JP | A-10-163099 | 6/1998 |
| JP | A-10-214783 | 8/1998 |
| JP | A 10-303114 | 11/1998 |
| JP | A 10-340846 | 12/1998 |
| JP | A-11-16816 | 1/1999 |
| JP | A 11-176727 | 7/1999 |
| JP | A 2000-058436 | 2/2000 |
| JP | A-2000-505958 | 5/2000 |
| JP | A 2001-044097 | 2/2001 |
| JP | A-2001-44097 | 2/2001 |
| JP | A-2001-319865 | 11/2001 |
| JP | A-2001-332609 | 11/2001 |
| JP | A-2002-14005 | 1/2002 |
| JP | A-2002-231622 | 8/2002 |
| JP | A-2003-249542 | 9/2003 |
| JP | A 2004-119497 | 4/2004 |
| JP | A-2004-140071 | 5/2004 |
| JP | A-2004-289127 | 10/2004 |
| JP | A-2004-289128 | 10/2004 |
| JP | A-2005-5707 | 1/2005 |
| WO | WO 99/49504 | 9/1999 |
| WO | WO 01/35168 A1 | 5/2001 |
| WO | WO 2004/019128 A2 | 3/2004 |
| WO | WO 2004/053953 A1 | 6/2004 |
| WO | WO 2004/053955 A1 | 6/2004 |
| WO | WO 2004/090577 A2 | 10/2004 |
| WO | WO 2004/112108 A1 | 12/2004 |
| WO | WO 2005/010611 A2 | 2/2005 |
| WO | WO 2005/055296 A1 | 6/2005 |
| WO | WO 2005/057636 A1 | 6/2005 |

OTHER PUBLICATIONS

English-language Translation of Japanese Patent Application No. 2004-119497.

May 24, 2011 Office Action issued in Japanese Patent Application No. 2005-169547 (with translation).

Jul. 20, 2011 Office Action issued in Israeli Patent Application No. 179937 (with translation).

May 2, 2012 Office Action issued in Korean Patent Application No. 2012-7002569 (with English-language translation).

Mar. 7, 2010 Office Action issued in Israeli Patent Application No. 179937 (with translation).

Mar. 10, 2008 Written Opinion issued in Singaporean Patent Application No. 200608521-1.

Sep. 20, 2005 International Search Report issued in International Application No. PCT/JP2005/010458 (with translation).

Sep. 20, 2005 Written Opinion of the International Searching Authority issued in International Application No. PCT/JP2005/010458 (with translation).

Sep. 5, 2008 Supplementary European Search Report issued in European Patent Application No. 05 74 8927.

Jul. 28, 2011 Office Action issued in Korean Patent Application No. 2006-7026606 (with translation).

Feb. 7, 2012 Communication Pursuant to Article 94(3) EPC issued in European Patent Application No. 05 748 927.0.

Jul. 23, 2012 Office Action issued in Korean Patent Application No. 2006-7026606 (with translation).

Mar. 6, 2013 Office Action issued in Korean Patent Application No. 2012-7002569 (with translation).

Mar. 8, 2013 Office Action issued in Korean Patent Application No. 2012-7030679 (with translation).

Apr. 3, 2013 Office Action issued in Chinese Patent Application No. 201110167423.9 (with translation).

Apr. 16, 2013 Office Action issued in Chinese Patent Application No. 201110167496.8 (with translation).

Aug. 8, 2013 Search Report issued in European Patent Application No. 13162896.8.

Sep. 11, 2012 Office Action issued in Japanese Patent Application No. 2010-277195 (with translation).

Oct. 22, 2013 Office Action issued in Japanese Patent Application No. 2012-082567 (with translation).

* cited by examiner

Fig. 9
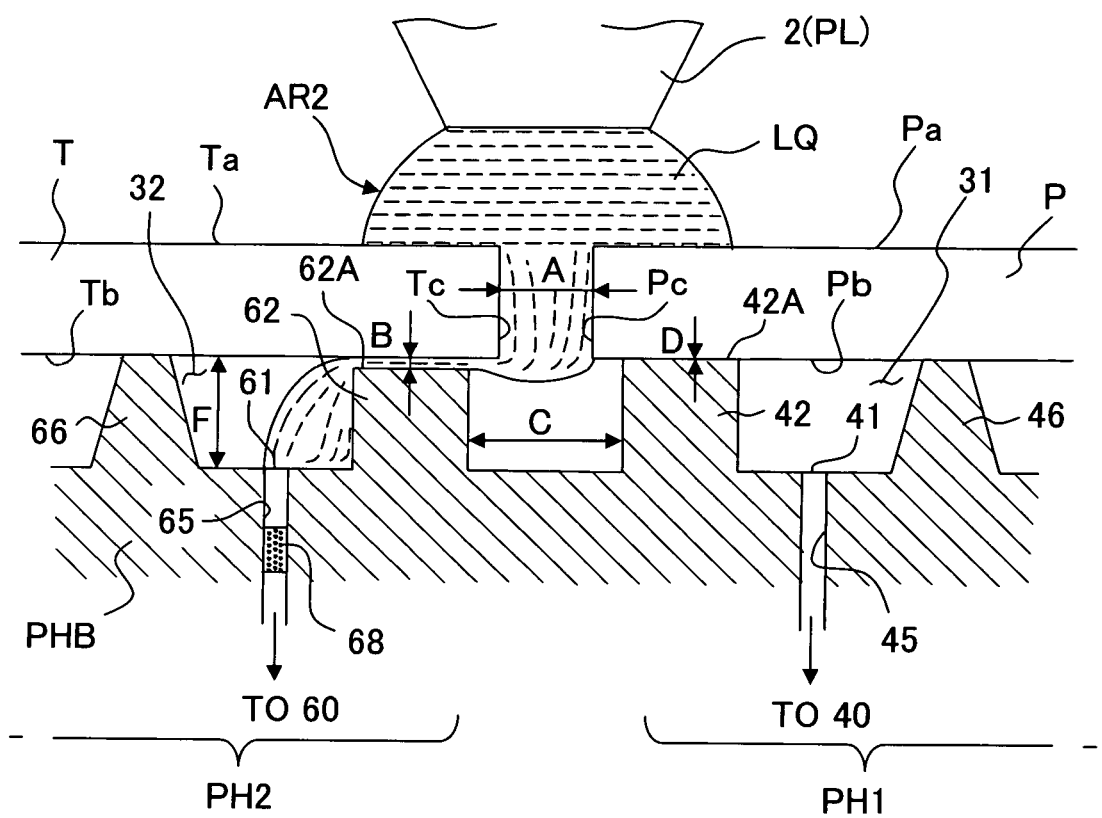
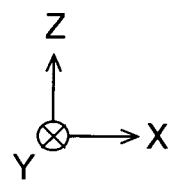

Fig. 15

SUBSTRATE HOLDING UNIT, EXPOSURE APPARATUS HAVING SAME, EXPOSURE METHOD, METHOD FOR PRODUCING DEVICE, AND LIQUID REPELLANT PLATE

TECHNICAL FIELD

The present invention relates to a substrate-holding unit for holding a process substrate, an exposure apparatus provided with the same, an exposure method, a method for producing a device, and a liquid-repelling plate.

BACKGROUND ART

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda/NA \quad (1)$$

$$\delta = \pm k_2 \cdot \lambda/NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. In view of the above, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and a surface of the substrate is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

As shown in FIG. 18, when the substrate P is subjected to the liquid immersion exposure, a situation arises such that a part or all of the liquid immersion area AR2' which covers the projection area AR1' of the projection optical system is formed outside the substrate P. In such a situation, the upper surface of the substrate stage PST' at a portion thereof around the substrate P makes contact with the liquid. Therefore, the member (or any coating thereof), which forms the upper surface of the substrate stage PST', is easily deteriorated and/or damaged. When the deterioration and/or the damage is caused as described above, an inconvenience arises such that the rate of operation of the exposure apparatus is lowered due to the execution of the maintenance operation such as the repair and/or the exchange of the substrate stage PST'.

When the edge area of the substrate P is subjected to the exposure in a state in which a part of the liquid immersion area AR2' is formed outside the substrate P, the following possibility may arise. That is, the liquid flows from the upper surface to a side of the back surface of the substrate through a gap (space or interstice) between the substrate and the substrate stage, and the liquid inflows into the space between the substrate and the substrate stage (substrate holder). In such a situation, a possibility arises such that the substrate stage cannot hold or retain the substrate satisfactorily. For example, the liquid, which has inflowed into the space between the back surface of the substrate and the substrate stage, behaves as a foreign matter. Therefore, there is such a possibility that the flatness of the supported substrate may be consequently deteriorated. In other situations, it is also conceived that any adhesion trace (so-called water mark) may be formed due to the vaporization of the inflowed liquid. The water mark also functions as a foreign matter. Therefore, there is such a possibility that the flatness of the supported substrate may be consequently deteriorated. Further, for example, there is also such a possibility that the following inconvenience may arise. That is, the substrate stage is thermally deformed due to the heat of vaporization brought about upon the vaporization of the liquid inflowed into the space between the substrate and the substrate stage.

DISCLOSURE OF THE INVENTION

Problem to Be Solved by the Invention

The present invention has been made taking the circumstances as described above into consideration, an object of which is to provide a substrate-holding unit and an exposure apparatus in which the maintenance operation can be executed with ease, as well as a method for producing a device by using the exposure apparatus. Another object of the present invention is to provide a liquid-repelling plate which is preferably usable for a liquid immersion exposure apparatus. Still another object of the present invention is to provide a substrate-holding unit and an exposure apparatus which make it possible to avoid any inflow of a liquid into a side of the back surface of a substrate, as well as a method for producing a device by using the exposure apparatus.

Means for Solving the Problem and Effect of the Invention

In order to achieve the objects as described above, the present invention adopts the following constructions.

According to a first aspect of the present invention, there is provided a substrate-holding unit which holds a process substrate; comprising a base member; a first holding portion which is formed in the base member and which attracts and holds the process substrate; and a second holding portion which is formed in the base member and which attracts and holds a plate in the vicinity of the process substrate attracted and held by the first holding portion.

According to the present invention, the plate, which is arranged in the vicinity of the process substrate attracted and held by the first holding portion, can be easily attached and detached with respect to the second holding portion. Therefore, for example, when the plate is deteriorated and/or damaged, only the plate can be exchanged with new one with ease. In this construction, the plate is attracted and held by the second holding portion. Therefore, it is possible to avoid any application of the local force, for example, to the plate and the base member. Therefore, it is possible to suppress the deformation of the plate and/or the base member. In this patent application, the term "process substrate" means a substrate to which various process treatments including the exposure process are to be applied. The term "process substrate" includes those obtained by coating, with a photoresist as the photosensitive material, the substrate to be used for various ways of use, including, for example, the semiconductor wafer for producing the semiconductor device, the substrate for the liquid crystal display (LCD), the ceramic wafer for the thin film magnetic head, and the master plate or the master disk (synthetic silica glass, silicon wafer) for the mask or the reticle to be used for the exposure apparatus.

According to a second aspect of the present invention, there is provided an exposure apparatus which exposes a process substrate by projecting an image of a pattern onto the process substrate, the exposure apparatus comprising: a first plate; a second plate; and a substrate-holding unit including a first holding portion which attracts and holds the process substrate, a second holding portion which attracts and holds the first plate in the vicinity of the process substrate attracted and held by the first holding portion, and a third holding portion which attracts and holds the second plate in the vicinity of the process substrate attracted and held by the first holding portion.

According to the present invention, the first and second plates, which are arranged in the vicinity of the process substrate attracted and held by the first holding portion, can be easily attached and detached with respect to the third holding portion. Therefore, for example, when the first and the second plates are damaged, they can be exchanged with new plates with ease. It is also possible to exchange only any one of the first plate and the second plate. It is possible to exchange only an arbitrary plate of the plurality of plates. In this construction, the first and second plates, which forms the upper surface of the substrate-holding unit, are attracted and held by the second and third holding portions, respectively. Therefore, it is possible to prevent, for example, the first and second plates and the base member from any application of the local force. Therefore, it is possible to suppress the deformation of the first plate, the second plates and/or the base member.

According to the present invention, there is provided a method for producing a device, comprising using the exposure apparatus as described above. According to the present invention, the exposure process and the measurement process can be performed satisfactorily. Therefore, it is possible to provide the device having desired performance.

According to a third aspect of the present invention, there is provided a liquid-repelling plate to be used for an exposure apparatus which exposes a process substrate by radiating an exposure light beam through a liquid onto the process substrate held by a substrate-holding unit; wherein the liquid-repelling plate is attracted and held by the substrate-holding unit to form a flat portion, which has a liquid-repellent surface, in the vicinity of the process substrate attracted and held by the substrate-holding unit.

According to the present invention, the flat portion, which has the liquid-repellent surface, can be formed in the vicinity of the process substrate. Therefore, even when the edge area of the process substrate is subjected to the exposure, the liquid immersion area can be maintained satisfactorily. For example, when the liquid repellence of the liquid-repelling plate is deteriorated, it is possible to maintain the liquid-repelling performance of the surface of the flat portion formed in the vicinity of the process substrate by merely exchanging the liquid-repelling plate with a new liquid-repelling plate. Therefore, it is possible to suppress the remaining of the liquid on the substrate-holding unit. Even when the liquid remains, it is possible to recover the liquid smoothly. Therefore, it is possible to avoid the occurrence of the inconvenience which would be otherwise caused by the vaporization of the remaining liquid, for example, such that the environment (temperature, humidity), in which the substrate is placed, is varied, the substrate and/or the substrate-holding unit is thermally deformed, the optical paths for various measuring beams for measuring, for example, the position information about the substrate, are varied, the adhesion trace (so-called water mark) of the liquid is formed, and/or the like.

According to a fourth aspect of the present invention, there is provided a substrate-holding unit which holds a process substrate to be irradiated with an exposure light beam through a liquid, the substrate-holding unit comprising: a base member; a first holding portion which is formed in the base member and which holds the process substrate; a second holding portion which is formed in the base member and which holds a plate in the vicinity of the process substrate held by the first holding portion; and a liquid recovery port which is formed on the base member and which recovers the liquid inflowed through a gap between the process substrate held by the first holding portion and the plate held by the second holding portion.

According to the present invention, the plate, which is arranged in the vicinity of the process substrate held by the first holding portion, can be easily attached and detached with respect to the second holding portion. Therefore, for example, when the plate is deteriorated and/or damaged, only the plate can be exchanged with new one with ease. Further, the liquid, inflowed through the gap between the process substrate held by the first holding portion and the plate held by the second holding portion, can be recovered by the liquid recovery port. Therefore, it is possible to avoid the inconvenience which would be otherwise caused such that the liquid flows from the upper surface to arrive at a side of the back surface of the substrate.

According to a fifth aspect of the present invention, there is provided a substrate-holding unit which holds a process substrate to be irradiated with an exposure light beam through a liquid, the substrate-holding unit comprising: a base member; a first holding portion which is formed in the base member and which holds the process substrate; and a second holding portion which is formed in the base member and which holds a plate in the vicinity of the process substrate held by the first holding portion; wherein the plate, which is held by the second holding portion, has a first surface which is substantially flush with a surface of the process substrate, and a second surface which is opposite to a back surface of the process substrate at a circumferential edge of the process substrate held by the first holding portion.

According to the present invention, the plate, which is arranged in the vicinity of the process substrate held by the first holding portion, can be easily attached and detached with respect to the second holding portion. Therefore, for example, when the plate is deteriorated and/or the damaged, only the plate can be exchanged with new one with ease. Further, the plate has the first surface which is substantially flush with the surface of the process substrate. Therefore, even when a part of the liquid immersion area formed on the process substrate is disposed on the plate, the liquid immersion area can be maintained satisfactorily. Further, the plate has the second surface, which is opposite to or facing the back surface of the process substrate, at the circumferential edge of the process substrate. Therefore, it is possible to avoid the inconvenience which would be otherwise caused such that the liquid, which inflows through the gap between the process substrate held by the first holding portion and the plate held by the second holding portion, flows from the upper surface to arrive at the side of the back surface of the substrate.

According to the present invention, there is provided an exposure apparatus comprising the substrate-holding unit as described above, wherein the exposure apparatus exposes the process substrate by radiating the exposure light beam through the liquid onto the process substrate held by the substrate-holding unit.

According to the present invention, the plate, which is arranged in the vicinity of the process substrate held by the first holding portion, can be easily attached and detached with respect to the second holding portion. Therefore, for example, when the plate is damaged or broken, the plate can be exchanged with a new plate with ease. Further, the liquid is prevented from causing any inflow into the side of the back surface of the substrate. Therefore, the exposure can be performed accurately in a state in which the substrate is satisfactorily held by the substrate-holding unit.

According to the present invention, there is provided a method for producing a device, comprising using the exposure apparatus as described above. According to the present invention, the exposure process and the measurement process can be performed satisfactorily. Therefore, it is possible to provide the device having desired performance.

According to a sixth aspect of the present invention, there is provided a substrate stage which is movable while holding a process substrate to be irradiated with an exposure light beam; the substrate stage comprising a base member; a plate; a first holding portion which is formed in the base member and which detachably holds the process substrate; and a second holding portion which is formed in the base member and which detachably holds the plate in the vicinity of the process substrate held by the first holding portion. According to the present invention, the plate is detachably held by the second holding portion provided for the base member on the substrate stage. Therefore, the plate is held in a satisfactory state. It is easy to perform the operation for exchanging the plate.

According to a seventh aspect of the present invention, there is provided an exposure method for exposing a process substrate with a predetermined pattern, the exposure method comprising: placing the process substrate in a substrate holder on a flat surface thereof, with a predetermined gap between the process substrate and the flat surface; exposing the process substrate by radiating an exposure light beam onto the process substrate through a liquid; and recovering the liquid inflowed through the gap, after completion of exposure process for the exposed process substrate. According to the exposure method of the present invention, it is possible to avoid the influence on the exposure operation, which would be otherwise exerted, for example, by the vibration caused by the liquid recovery operation.

BRIEF DESCRIPTION OF THE DRAWINGS

FIG. 9 schematically shows a situation in which the liquid is recovered through a liquid recovery port of the substrate holder.

FIG. 15 shows a side sectional view illustrating the substrate holder of the sixth embodiment.

BEST MODE FOR CARRYING OUT THE INVENTION

The exposure apparatus according to the present invention will be explained below with reference to the drawings. However, the present invention is not limited thereto.

First Embodiment

Figure 1:
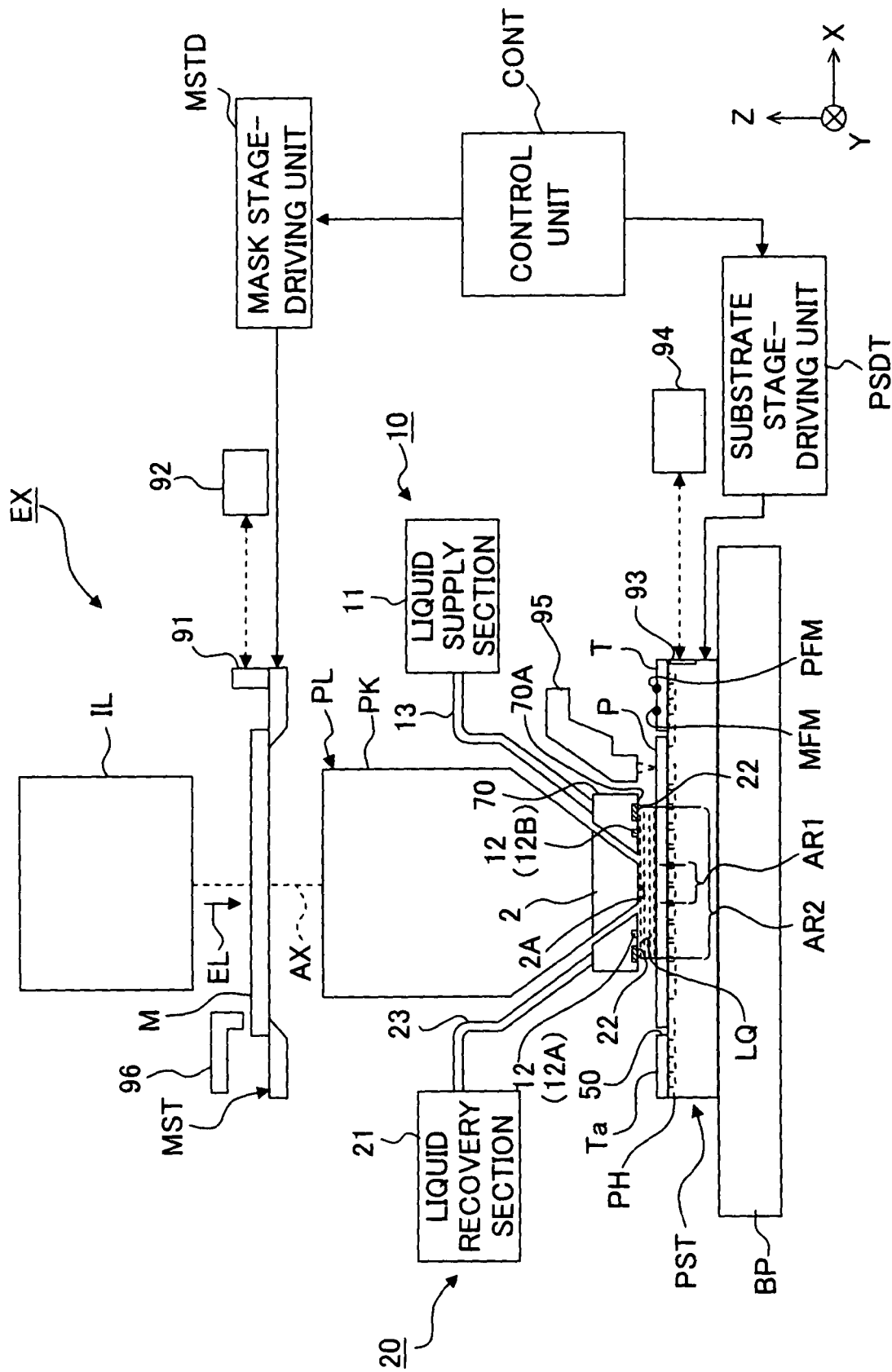
FIG. 1 shows a schematic arrangement illustrating an embodiment of the exposure apparatus of the present invention.

FIG. 1 shows a schematic arrangement illustrating a first embodiment of the exposure apparatus according to the present invention. With reference to FIG. 1, the exposure apparatus EX includes a mask stage MST which is movable while supporting a mask M, a substrate stage PST which has a substrate holder (substrate-holding unit) PH which holds or retains a substrate and which is capable of moving the substrate P held by the substrate holder PH, an illumination optical system IL which illuminates, with an exposure light beam EL, the mask M supported by the mask stage MST, a projection optical system PL which projects an image of a pattern of the mask M illuminated with the exposure light beam EL onto the substrate P supported by the substrate stage PST, and a control unit CONT which integrally controls the operation of the entire exposure apparatus EX.

The exposure apparatus EX of the embodiment of the present invention is the liquid immersion exposure apparatus in which the liquid immersion method is applied in order that the exposure wavelength is substantially shortened to improve the resolution and the depth of focus is substantially widened. The exposure apparatus EX includes a liquid supply mechanism 10 which supplies the liquid LQ onto the substrate P, and a liquid recovery mechanism 20 which recovers the liquid LQ disposed on the substrate P. In the embodiment of the present invention, pure or purified water is used as the liquid LQ. The exposure apparatus EX forms a liquid immersion area AR2 locally on at least a part of the substrate P including a projection area AR1 of the projection optical system PL by the liquid LQ supplied from the liquid supply mechanism 10 at least during the period in which an image of the pattern of the mask M is being transferred onto the substrate P, the liquid immersion area AR2 being larger than the projection area AR1 and smaller than the substrate P. Specifically, the exposure apparatus EX is operated as follows. That is, a space between the surface (exposure surface) of the substrate P and an optical element 2 disposed at the end portion on a side of the image plane of the projection optical system PL is filled with the liquid LQ. The image of the pattern of the mask M is projected onto the substrate P held by the substrate holder PH to expose the substrate P therewith via the projection optical system PL and the liquid LQ disposed between the projection optical system PL and the substrate P.

The embodiment of the present invention will now be explained as exemplified by a case using the scanning type exposure apparatus (so-called scanning stepper), as the exposure apparatus EX, in which the substrate P is exposed with the pattern formed on the mask M while synchronously moving the mask M and the substrate P in mutually different directions (opposite directions) in the scanning directions. In the following explanation, the Z axis direction is the direction which is coincident with an optical axis AX of the projection optical system PL, the X axis direction is the synchronous movement direction (scanning direction) for the mask M and the substrate P in a plane perpendicular to the Z axis direction, and the Y axis direction (non-scanning direction) is the direction which is perpendicular to the Z axis direction and the X axis direction. The directions of rotation (inclination) about the X axis, the Y axis, and the Z axis are designated as $\theta X$, $\theta Y$, and $\theta Z$ directions respectively. The term "substrate" referred to herein is the process substrate to which various process treatments including the exposure process are to be applied, which includes those obtained by coating a semiconductor wafer surface with a photoresist as a photosensitive material. The term "mask" includes a reticle formed with a device pattern to be subjected to the reduction projection onto the substrate.

The illumination optical system IL is provided so that the mask M, which is supported on the mask stage MST, is illuminated with the exposure light beam EL. The illumination optical system IL includes, for example, an exposure light source which radiates the exposure light beam EL, an optical integrator which uniformizes the illuminance of the exposure light beam EL radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped, and the like. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid LQ is pure water in this embodiment, through which the exposure light beam EL is transmissive even when the exposure light beam EL is the ArF excimer laser beam. The emission line (g-ray, h-ray, i-ray) and the far ultraviolet light beam (DUV light beam) such as the KrF excimer laser beam (wavelength: 248 nm) are also transmissive through pure water.

The mask stage MST is movable while holding the mask M. The mask M is fixed, for example, by the vacuum attraction (or the electrostatic attraction). The mask stage MST is two-dimensionally movable in the plane perpendicular to the optical axis AX of the projection optical system PL, i.e., in the XY plane, and it is finely rotatable in the $\theta Z$ direction. The mask stage MST is driven by a mask stage-driving unit MSTD such as a linear motor. The mask stage-driving unit MSTD is controlled by the control unit CONT.

A movement mirror 91, which is movable together with the mask stage MST, is provided on the mask stage MST. A laser interferometer 92 is provided at a position opposite to or facing the movement mirror 91. The movement mirror 91 is the mirror for the laser interferometer 92 to measure the position of the mask stage MST. The position in the two-dimensional direction (XY directions) and the angle of rotation in the $\theta Z$ direction (including the angles of rotation in the $\theta X$, $\theta Y$ directions in some situations as well) of the mask M on the mask stage MST are measured in real-time by the laser interferometer 92. The result of the measurement of the laser interferometer 92 is outputted to the control unit CONT. The control unit CONT drives the mask stage-driving unit MSTD on the basis of the result of the measurement obtained by the laser interferometer 92 to thereby control the position of the mask M supported on the mask stage MST.

The projection optical system PL projects the pattern on the mask M onto the substrate P at a predetermined projection magnification $\beta$ to perform the projection exposure. The projection optical system PL is constructed of a plurality of optical elements including the optical element 2 provided at the end portion on the side of the substrate P. The optical elements are supported by a barrel PK. In this embodiment, the projection optical system PL is the reduction system in which the projection magnification $\beta$ is, for example, ¼, ⅕, or ⅛. The projection optical system PL may be any one of the 1× magnification system and the magnifying system. The projection optical system PL may be any one of the catadioptric system including dioptric and catoptric elements, the dioptric system including no catoptric element, and the catoptric system including no dioptric element. The optical element 2, which is disposed at the end portion of the projection optical system PL of this embodiment, is provided detachably (exchangeably) with respect to the barrel PK. The liquid LQ of the liquid immersion area AR2 makes contact with the optical element 2.

The substrate stage PST includes a substrate holder PH which attracts and holds the substrate P, and a plate member T which is held by the substrate holder PH. The substrate stage PST is two-dimensionally movable in the XY plane on the base BP, and it is finely rotatable in the $\theta Z$ direction. Further, the substrate stage PST is movable in the Z axis direction, the θX direction, and the θY direction as well. That is, the substrate P, which is held by the substrate holder PH, is movable in the Z axis direction, the θX and θY directions (directions of inclination), the two-dimensional direction (XY directions), and the θZ direction.

The substrate stage PST is driven by a substrate stage-driving unit PSTD including, for example, a linear motor. The substrate stage-driving unit PSTD is controlled by the control unit CONT. Therefore, the position (focus position) in the Z axis direction and the position in the direction of inclination of the substrate P held by the substrate holder PH, the position in the XY direction of the substrate P held by the substrate holder PH, and the position in the θZ direction of the substrate P held by the substrate holder PH are controlled by the control unit CONT by the aid of the substrate stage-driving unit PSTD. The mechanism for moving the substrate stage PST is disclosed, for example, in Japanese Patent Application Laid-open Nos. 9-5463 and 59-101835.

The substrate holder PH is provided with a movement mirror 93 which is movable with respect to the projection optical system PL together with the substrate holder PH. A laser interferometer 94 is provided at a position opposite to or facing the movement mirror 93. The movement mirror 93 is the mirror for the laser interferometer 94 in order to measure the position of the substrate stage PST (substrate holder PH). The position in the two-dimensional direction and the angle of rotation in the θZ direction of the substrate stage PST are measured in real-time by the laser interferometer 94. When the position of the substrate stage PST is measured by the laser interferometer 94, the position in the two-dimensional direction and the angle of rotation in the θZ direction of the substrate P are measured. Although not shown, the exposure apparatus EX is provided with a focus/leveling-detecting system for detecting the position information about the surface of the substrate P held by the substrate holder PH of the substrate stage PST as disclosed, for example, in Japanese Patent Application Laid-open No. 8-37149. The focus/leveling-detecting system detects the position information in the Z axis direction of the surface of the substrate P and the information about the inclination in the θX and θY directions of the substrate P.

The measurement result of the laser interferometer 94 is outputted to the control unit CONT. The light-receiving result of the focus/leveling-detecting system is also outputted to the control unit CONT. The control unit CONT controls the focus position and the angle of inclination of the substrate P by driving the substrate stage-driving unit PSTD on the basis of the detection result of the focus/leveling-detecting system so that the surface of the substrate P is adjusted to match the image plane of the projection optical system PL. Further, the control unit CONT drives the substrate stage PST by the aid of the substrate stage-driving unit PSTD in a two-dimensional coordinate system defined by the laser interferometer 94 on the basis of the measurement result of the laser interferometer 94 so as to control the position of the substrate P in the X axis direction and the Y axis direction.

A substrate alignment system 95, which detects an alignment mark on the substrate P or a reference mark PFM provided on the substrate stage PST as described later on, is provided in the vicinity of the end portion of the projection optical system PL. The substrate alignment system 95 of this embodiment adopts the FIA (field image alignment) system in which an illumination light beam such as white light is radiated from a halogen lamp onto the mark while allowing the substrate stage PST to stand still so that an obtained image of the mark is photographed in a predetermined image pickup field by an image pickup element to measure the position of the mark by the image processing, as disclosed, for example, in Japanese Patent Application Laid-open No. 4-65603 (corresponding to U.S. Pat. No. 5,493,403).

A mask alignment system 96, which detects a reference mark MFM, provided on the substrate holder PH as described later on, via the mask M and the projection optical system PL, is provided in the vicinity of the mask stage MST. The mask alignment system 96 of this embodiment adopts the VRA (visual reticle alignment) system in which a light beam is radiated onto the mark so that image data of the mark photographed, for example, by a CCD camera is subjected to the image processing to detect the mark position, as disclosed, for example, in Japanese Patent Application Laid-open No. 7-176468.

The liquid supply mechanism 10 supplies the predetermined liquid LQ to the side of the image plane of the projection optical system PL. The liquid supply mechanism 10 includes a liquid supply section 11 which is capable of feeding the liquid LQ, and a supply tube 13 which has one end connected to the liquid supply section 11. The liquid supply section 11 includes, for example, a tank for accommodating the liquid LQ, a pressurizing pump, and a filter unit for removing any foreign matter and bubbles contained or present in the liquid LQ, and the like. The liquid supply operation of the liquid supply section 11 is controlled by the control unit CONT. When the liquid immersion area AR2 is formed on the substrate P, the liquid supply mechanism 10 supplies the liquid LQ onto the substrate P. It is also allowable to substitutively use, for example, the equipment of the factory in which the exposure apparatus EX is installed, rather than providing at least a part or parts of, for example, the tank, the pressurizing pump, the filter unit, and the like for the exposure apparatus EX.

The liquid recovery mechanism 20 recovers the liquid LQ on the side of the image plane of the projection optical system PL. The liquid recovery mechanism 20 includes a liquid recovery section 21 which is capable of recovering the liquid LQ, and a recovery tube 23 which has one end connected to the liquid recovery section 21. The liquid recovery section 21 includes, for example, a vacuum system (suction unit) such as a vacuum pump, a gas/liquid separator which separates the gas and the recovered liquid LQ from each other, a tank for accommodating the recovered liquid LQ, and the like. It is also allowable to use, for example, the equipment of the factory in which the exposure apparatus EX is installed, rather than providing all of, for example, the vacuum system, the gas/liquid separator, the tank, and the like for the exposure apparatus EX. The liquid recovery operation of the liquid recovery section 21 is controlled by the control unit CONT. In order to form the liquid immersion area AR2 on the substrate P, the liquid recovery mechanism 20 recovers a predetermined amount of the liquid LQ on the substrate P supplied from the liquid supply mechanism 10.

A nozzle member 70 is arranged in the vicinity of the optical element 2 which makes contact with the liquid LQ and which is included in the plurality of optical elements constructing the projection optical system PL. The nozzle member 70 is an annular member which is provided to surround the side surface of the optical element 2 at a position over or above the substrate P (substrate stage PST). A gap is formed between the nozzle member 70 and the optical element 2. The nozzle member 70 is supported by a predetermined support mechanism so that the nozzle member 70 is isolated from the optical element 2 in terms of the vibration. The nozzle member 70 is constructed such that the liquid LQ does not inflow or infiltrate into the gap, and no bubble enters into and is mixed with the liquid LQ through the gap. The nozzle member 70 is formed of, for example, stainless steel.

The nozzle member 70 includes supply ports 12 which are arranged over or above the substrate P (substrate stage PST) and which are arranged opposite to the surface of the substrate P. In this embodiment, the nozzle member 70 has the two supply ports 12A, 12B. The supply ports 12A, 12B are provided on the lower surface 70A of the nozzle member 70.

A supply flow passage, through which the liquid LQ to be supplied onto the substrate P is allowed to flow, is formed in the nozzle member 70. One end of the supply flow passage of the nozzle member 70 is connected to the other end of the supply tube 13. The other end of the supply flow passage is connected to the supply ports 12A, 12B respectively. In this case, the supply flow passage, which is formed in the nozzle member 70, has the other end which is branched from an intermediate position to be connectable to the plurality of (two) supply ports 12A, 12B respectively.

The nozzle member 70 includes a recovery port 22 which is provided over or above the substrate P (substrate stage PST) and which is arranged opposite to the surface of the substrate P. In this embodiment, the recovery port 22 is formed to be annular so that the recovery port 22 surrounds the supply ports 12 and the optical element 2 of the projection optical system PL (projection area AR1) on the lower surface 70A of the nozzle member 70.

A recovery flow passage, through which the liquid LQ recovered by the recovery port 22 is allowed to flow, is formed in the nozzle member 70. One end of the recovery flow passage of the nozzle member 70 is connected to the other end of the recovery tube 23. The other end of the recovery flow passage is connected to the recovery port 22. In this case, the recovery flow passage, which is formed in the nozzle member 70, includes an annular flow passage which is adapted to the recovery port 22, and a manifold flow passage which collects the liquid LQ allowed to flow through the annular flow passage.

In this embodiment, the nozzle member 70 constructs a part of the liquid supply mechanism 10 and a part of the liquid recovery mechanism 20. The supply ports 12A, 12B, which construct the liquid supply mechanism 10, are provided at the positions on the both sides in the X axis direction, respectively, with the projection area AR1 of the projection optical system PL intervening therebetween. The recovery port 22, which constructs the liquid recovery mechanism 20, is provided outside the liquid supply ports 12A, 12B of the liquid supply mechanism 10 with respect to the projection area AR1 of the projection optical system PL. That is, the recovery port 22 is arranged at the position separated farther from the projection area AR1 with respect to the liquid supply ports 12A, 12B. In this embodiment, the projection area AR1 of the projection optical system PL is set to have a rectangular shape as viewed in a plan view in which the Y axis direction is the longitudinal direction and the X axis direction is the transverse direction.

The operation of the liquid supply section 11 is controlled by the control unit CONT. The control unit CONT is capable of controlling the liquid supply amount per unit time to be provided by the liquid supply section 11. When the liquid LQ is supplied onto the substrate P, then the control unit CONT feeds the liquid LQ from the liquid supply section 11, and the liquid LQ is supplied onto the substrate P from the supply ports 12A, 12B provided over or above the substrate P via the supply flow passage formed in the nozzle member 70 and the supply tube 13. The liquid LQ is supplied from the both sides of the projection area AR1 by the aid of the supply ports 12A, 12B.

The liquid recovery operation of the liquid recovery section 21 is controlled by the control unit CONT. The control unit CONT is capable of controlling the liquid recovery amount per unit time to be recovered by the liquid recovery section 21. The liquid LQ on the substrate P, which is to be recovered from the recovery port 22 provided over or above the substrate P, is recovered by the liquid recovery section 21 via the recovery tube 23 and the recovery flow passage formed in the nozzle member 70. For example, the number, the shape, and the arrangement of the supply ports 12A, 12B and the recovery port 22 are not limited to those described above. Any structure may be adopted provided that the optical path for the exposure light beam EL is filled with the liquid LQ.

The lower surface (liquid contact surface) 2A of the optical element 2 of the projection optical system PL and the lower surface (liquid contact surface) 70A of the nozzle member 70 are liquid-attractive or lyophilic (water-attractive or hydrophilic). In this embodiment, the optical element 2 is formed of calcium fluoride having a high affinity for pure water. Therefore, it is possible to allow the pure water to make tight contact with the substantially entire surface of the liquid contact surface 2A of the optical element 2. On the other hand, in this embodiment, the liquid supply mechanism 10 supplies pure water as the liquid LQ. Therefore, it is possible to enhance the tight contact performance between the liquid LQ and the liquid contact surface 2A of the optical element 2, and it is possible to reliably fill the optical path between the optical element 2 and the substrate P with the liquid LQ. The optical element 2 may be formed of silica glass having a high affinity for water. The affinity for the liquid LQ may be further enhanced by performing a water-attracting (liquid-attracting) treatment to the liquid contact surface 2A of the optical element 2 and the liquid contact surface 70A of the nozzle member 70. The liquid-attracting treatment includes a treatment in which a liquid-attractive material such as $MgF_2$, $Al_2O_3$, or $SiO_2$ is provided on the liquid contact surface. Alternatively, as the liquid-attracting treatment (water-attracting treatment), for example, a thin film may be provided with a substance having a molecular structure with large polarity such as alcohol, because the liquid LQ is water having the large polarity in this embodiment. Alternatively, the nozzle member 70 may be formed of hydrophilic titanium which has a high affinity for water.

Figure 2:
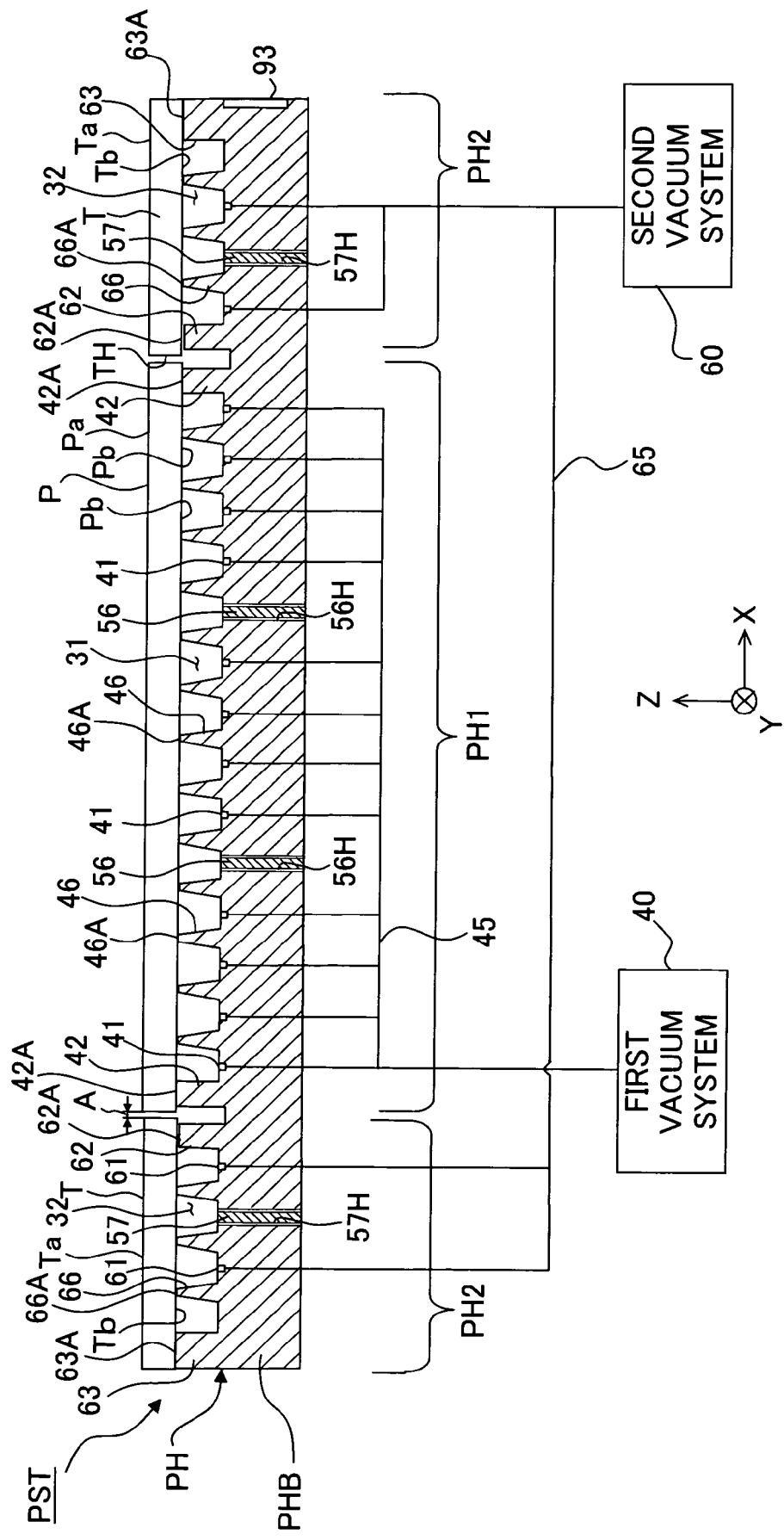
FIG. 2 shows a side sectional view illustrating an embodiment of a substrate holder.
Figure 3:
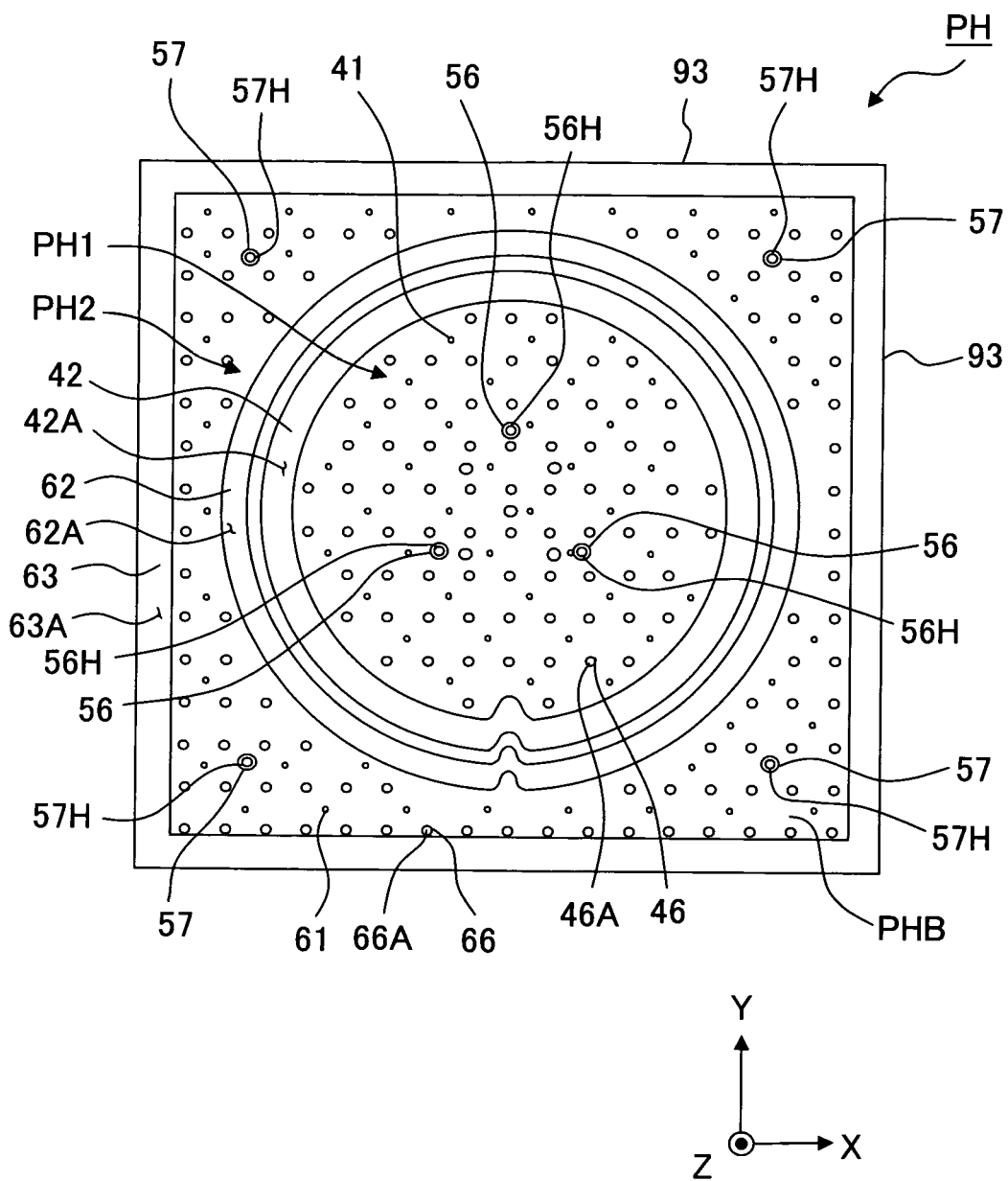
FIG. 3 shows a plan view illustrating the embodiment of the substrate holder.
Figure 4:
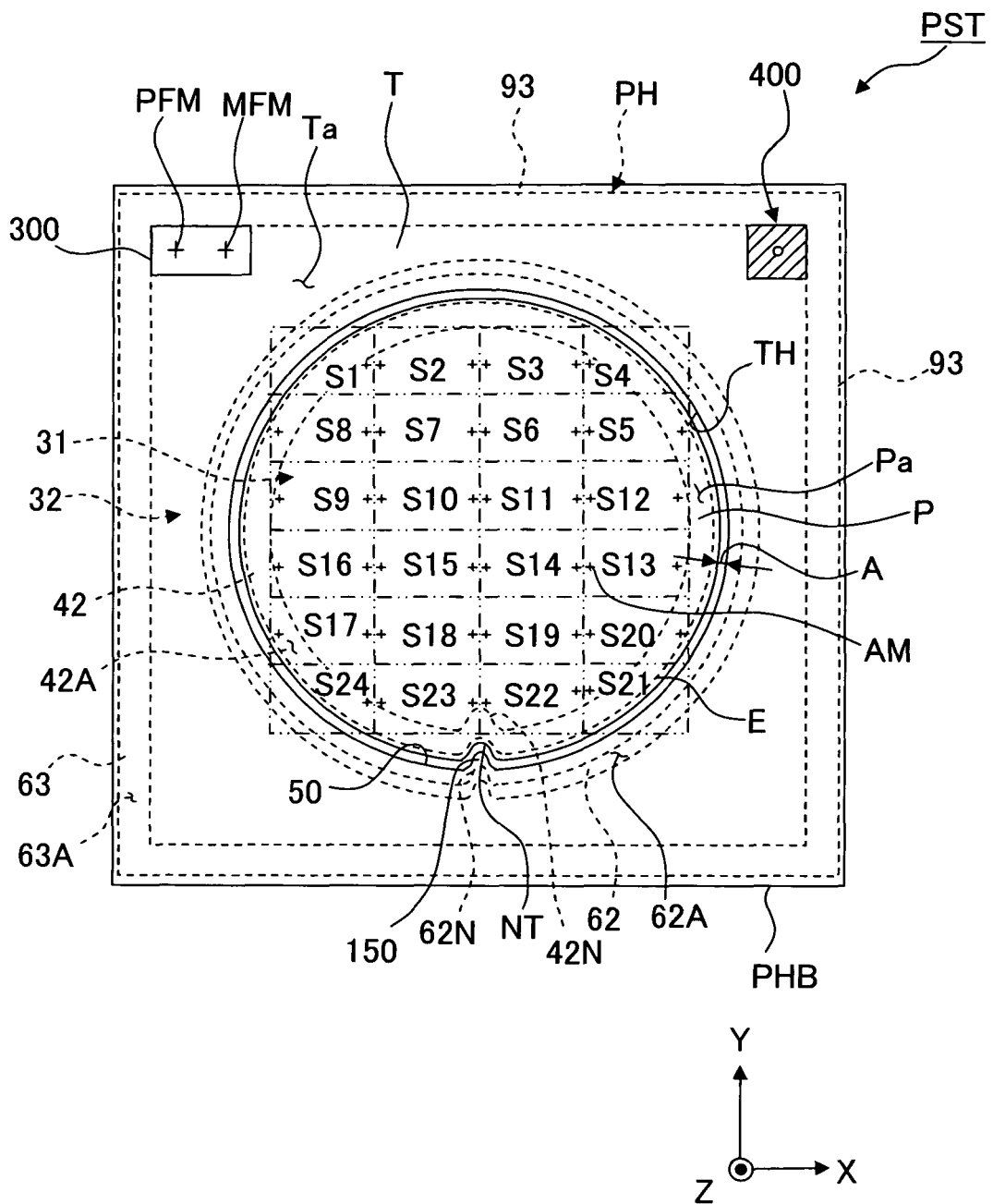
FIG. 4 shows a plan view illustrating a substrate stage.

Next, an explanation will be made about an embodiment of the substrate stage PST (substrate holder PH) with reference to FIGS. 2, 3, and 4. FIG. 2 shows a side sectional view illustrating the substrate holder PH which attracts and holds the substrate P and the plate member T as described later on. FIG. 3 shows a plan view illustrating the substrate holder PH as viewed from an upper position. FIG. 4 shows a plan view illustrating the substrate stage PST as viewed from an upper position.

With reference to FIG. 2, the substrate holder PH includes a base member PHB, a first holding portion PH1 which is formed in the base member PHB and which attracts and holds the substrate P, and a second holding portion PH2, which is formed in the base member PHB and which attracts and holds the plate member T, arranged in the vicinity of the substrate P attracted and held by the first holding portion PH1. The base member PHB of the substrate holder PH is movable. The plate member T is the member distinct or separate from the base member PHB. The plate member T is provided detachably with respect to the base member PHB of the substrate holder PH, and is exchangeable. In this embodiment, the state, in which the plate member T is attracted and held by the base member PHB, is referred to as the substrate stage PST.

The plate member T is arranged in the vicinity of the substrate P held by the first holding portion PH1 on the substrate holder PH. The surface Ta of the plate member T held by the second holding portion PH2 is arranged around the surface Pa of the substrate P held by the first holding portion PH1. The surface Ta and the back surface Tb of the plate member T are flat surfaces (flat portions) respectively. The plate member T has a thickness approximately same as that of the substrate P. The surface (flat surface) Ta of the plate member T held by the second holding portion PH2 is substantially flush with the surface Pa of the substrate P held by the first holding portion PH1. That is, the plate member T, which is held by the second holding portion PH2, forms the flat surface Ta, which is substantially flush with the surface Pa of the substrate P, around the substrate P held by the first holding portion PH1. In this embodiment, the upper surface of the substrate stage PST is formed to be the flat surface (full flat surface) approximately entirely in a region including the flat surface Ta of the held plate member T and the surface Pa of the held substrate P when the substrate P is held.

As shown in FIGS. 3 and 4, the base member PHB of the substrate holder PH is formed to be rectangular as viewed in a plan view. The movement mirror 93 for laser interferometers 94, which is provided to measure the position of the base member PHB (substrate holder PH), is formed at each on the two mutually perpendicular side surfaces of the base member PHB included in the substrate holder PH.

As shown in FIG. 4, the outer shape of the plate member T is formed to be rectangular as viewed in a plan view in accordance with the shape of the base member PHB. The plate member T has a substantially circular hole TH which is formed at a central portion thereof so that the substrate P can be arranged therein. That is, the plate member T is a substantially annular member, which is arranged to surround the substrate P held by the first holding portion PH1 of the substrate holder PH. The surface Ta of the plate member T held by the second holding portion PH2 is arranged around the substrate P held by the first holding portion PH1 so that the substrate P is surrounded thereby.

In FIG. 4, the outer shape of the plate member T is formed to be rectangular as viewed in a plan view so that the outer shape is approximately coincident with the outer shape of the base member PHB. However, the plate member T can be made larger than the base member PHB as well. In this case, the circumferential edge of the rectangular plate member T overhangs with respect to the outer side surface of the base member PHB. Therefore, it is possible to prevent the liquid from adhering to the mirror surface, for the interferometer, formed on the outer side surface of the base member PHB.

As shown in FIGS. 2 and 3, the first holding portion PH1 of the substrate holder PH includes a first convex support portion 46 which is formed on the base member PHB, an annular first circumferential wall portion 42 which is formed on the base member PHB to surround the circumference of the first support portions 46, and a first suction port 41 which is formed on the base member PHB at the inside of the first circumferential wall portion 42. The first support portion 46 is formed as a plurality of first support portions 46 uniformly at the inside of the first circumferential wall portion 42. In this embodiment, the first support portions 46 include a plurality of support pins. The first suction port 41 is provided to attract and hold the substrate P. The first suction port 41 is formed as a plurality of first suction ports 41 which are provided on the upper surface of the base member PHB at the inside of the first circumferential wall portion 42, at a plurality of predetermined positions respectively, except at positions at which the first support portions 64 are provided. In this embodiment, the plurality of first suction ports 41 are arranged uniformly at the inside of the first circumferential wall portion 42. The first circumferential wall portion 42 is formed to have a substantially annular shape corresponding to the shape of the substrate P. The upper surface 42A of the first circumferential wall portion 42 is formed opposite to or facing an edge area on the back surface Pb of the substrate P.

The first suction ports 41 are connected to a first vacuum system 40 via flow passages 45 respectively. The first vacuum system 40 provides the negative pressure in a first space 31 which is surrounded by the base member PHB, the first circumferential wall portion 42, and the back surface of the substrate P. The first vacuum system 40 includes a vacuum pump. As described above, the first support portions 46 include the support pins. In this embodiment, the first holding portion PH1 constructs a part of the so-called pin chuck mechanism. The first circumferential wall portion 42 functions as the outer wall portion to surround the first space 31 including the first support portions 46. The control unit CONT drives the first vacuum system 40 to attract and hold the substrate P on the first support portions 46 by sucking the gas (air) present or existing in the first space 31 surrounded by the base member PHB, the first circumferential wall portion 42, and the substrate P so as to provide the negative pressure in the first space 31.

The second holding portion PH2 of the substrate holder PH includes a substantially annular second circumferential wall portion 62 which is formed on the base member PHB to surround the first circumferential wall portion 42 of the first holding portion PH1, an annular third circumferential wall portion 63 which is provided outside the second circumferential wall portion 62 and which is formed on the base member PHB to surround the second circumferential wall portion 62, a second convex support portion 66 which is formed on the base member PHB between the second circumferential wall portion 62 and the third circumferential wall portion 63, and a second suction port 61 which is formed on the base member PHB between the second circumferential wall portion 62 and the third circumferential wall portion 63. The second circumferential wall portion 62 is provided outside the first circumferential wall portion 42 with respect to the first space 31. The third circumferential wall portion 63 is provided further outside the second circumferential wall portion 62. The second support portion 66 is formed as a plurality of second support portions 66 uniformly between the second circumferential wall portion 62 and the third circumferential wall portion 63. In this embodiment, the second support portions 66 include a plurality of support pins. The second suction ports 61 are provided to attract and hold the plate member T, and are provided on the upper surface of the base member PHB between the second circumferential wall portion 62 and the third circumferential wall portion 63, at a plurality of predetermined positions respectively, except for positions at which the second support portions 66 are arranged. In this embodiment, the second suction port 61 is formed as a plurality of suction ports 61 arranged uniformly between the second circumferential wall portion 62 and the third circumferential wall portion 63. The second circumferential wall portion 62 is formed to be substantially annular corresponding to the shape of the hole TH of the plate member T. The third circumferential wall portion 63 is formed to substantially rectangular and annular corresponding to the outer shape of the plate member T. The upper surface 62A of the second circumferential wall portion 62 is formed opposite to or facing a back surface Tb of the plate member T in an inner edge area in the vicinity of the hole TH of the plate member T. The upper surface 63A of the third circumferential wall portion 63 is formed opposite to or facing the back surface Tb of the plate member T in an outer edge area of the plate member T.

The upper surfaces of the first circumferential wall portion 42, the second circumferential wall portion 62, and the third circumferential wall portion 63 have relatively great widths in the drawings respectively. However, the widths are actually not more than 2 mm, for example, about 0.1 mm.

The second suction ports 61 are connected to a second vacuum system 60 via flow passages 65 respectively. The second vacuum system 60 provides the negative pressure in the second space 32 which is surrounded by the base member PHB, the second and third circumferential wall portions 62, 63, and the plate member T. The second vacuum system 60 includes a vacuum pump. As described above, the second support portions 66 include the support pins. In this embodiment, the second holding portion PH2 constructs a part of the so-called pin chuck mechanism. The second and third circumferential wall portion 62, 63 function as the outer wall portions to surround the second space 32 including the second support portions 66. The control unit CONT drives the second vacuum system 60 to attract and hold the plate member T on the second support portions 66 by sucking the gas (air) present in the second space 32 surrounded by the base member PHB, the second and third circumferential wall portions 62, 63, and the plate member T to provide the negative pressure in the second space 32.

In this embodiment, the pin chuck mechanism is adopted to attract and hold the substrate P. However, it is also allowable to adopt any other chuck mechanism. Similarly, the pin chuck mechanism is adopted to attract and hold the plate member T. However, it is also allowable to adopt any other chuck mechanism.

In this embodiment, the vacuum suction mechanism is adopted to attract and hold each of the substrate P and the plate member T. However, at least one of them may be held by using any other mechanism such as the electrostatic suction mechanism.

The first vacuum system 40 for providing the negative pressure in the first space 31 and the second vacuum system 60 for providing the negative pressure in the second space 32 are independent from each other. The control unit CONT is capable of individually controlling the respective operations of the first vacuum system 40 and the second vacuum system 60. It is possible to independently perform the suction operation for the first space 31 effected by the first vacuum system 40 and the suction operation for the second space 32 effected by the second vacuum system 60 respectively. For example, the substrate P can be exchanged while holding the plate member T to the second holding portion PH2. The pressure of the first space 31 and the pressure of the second space 32 can be made different from each other by the control unit CONT as well, by controlling the first vacuum system 40 and the second vacuum system 60 respectively.

As shown in FIGS. 2 and 4, a gap (interstice) A of about 0.1 to 1.0 mm is formed between the outer edge portion of the substrate P held by the first holding portion PH1 and the inner edge portion (on the side of the hole TH) of the plate member T provided around the substrate P. In this embodiment, the gap A is about 0.3 mm. When the gap A between the edge portion of the substrate P and the edge portion of the plate member T is set to be about 0.1 to 1.0 mm, i.e., when the inner diameter of the hole TH is made larger than the outer diameter of the substrate P by about 0.2 to 2.0 mm, then the liquid LQ hardly flows into the gap A owing to the surface tension of the liquid LQ, even when the liquid immersion area AR2 of the liquid LQ is formed on the gap A. The liquid LQ can be held under or below the projection optical system PL by the plate member T even when an edge area E of the substrate P is subjected to the exposure.

As shown in FIG. 4, the substrate P of this embodiment is has a notch portion NT which formed in the substrate P and which is a cutout for the positional adjustment. The shape of the plate member T is designed depending on the outer shape of the substrate P (shape of the notch portion NT) so that the gap between the substrate P and the plate member T at the notch portion NT is also set to about 0.1 to 1.0 mm. That is, the gap A of about 0.1 to 1.0 mm is secured between the plate member T and the entire region of the edge portion of the substrate P including the notch portion NT. Specifically, the plate member T is provided with a projection 150 which protrudes toward the inside of the hole TH to correspond to the shape of the notch portion NT of the substrate P. A convex portion 62N, which is adapted to the shape of the projection 150 of the plate member T, is formed for each of the second circumferential wall portion 62 of the second holding portion PH2 and the upper surface 62A thereof. The projection 150 functions as a gap-adjusting portion to decrease the gap between the surface Ta of the plate member T and the surface Pa of the notch portion NT of the substrate P held by the first holding portion PH1. In this case, the projection 150 is a part of the plate member T, and is formed to be integrated with the plate member T. However, the plate member T and the projection 150 may be provided separately, and the projection 150 may be exchangeable with respect to the plate member T.

A concave portion 42N, which is adapted to the shapes of the convex portion 62N of the second circumferential wall portion 62 and the notch portion NT of the substrate P, is formed for each of the first circumferential wall portion 42 of the first holding portion PH1 and the upper surface 42A thereof. The concave portion 42N of the first circumferential wall portion 42 is provided at the position opposite to or facing the convex portion 62N of the second circumferential wall portion 62. A predetermined gap is formed between the concave portion 42N and the convex portion 62N.

This embodiment has been explained as exemplified by the notch portion NT as the cutout of the substrate P by way of example. However, when the cutout is absent, or when an orientation flat portion (orientation flat) is formed as the cutout for the substrate P, then the plate member T, the first circumferential wall portion 42, and the second circumferential wall portion 62 may be allowed to have shapes adapted to the outer shape of the substrate P, and the predetermined gap A may be secured between the substrate P and the plate member T disposed therearound.

When the notch portion NT is absent in the substrate P, or when the notch portion NT is sufficiently small, then it is also allowable that the projection 150 is not provided for the plate member. In this case, it is also allowable that the concave portion 42N and the convex portion 62N are not provided.

The second suction ports 61, which are formed on the base member PHB, function as the liquid recovery ports for recovering the liquid LQ inflowed through the gap A between the substrate P held by the first holding portion PH1 and the plate member T held by the second holding portion PH2. As described above, the second holding portion PH2 holds the plate member T so that the second space 32 is formed on the side of the back surface Tb of the plate member T. The second suction ports 61 are formed on the side of the back surface Tb of the plate member T held by the second holding portion PH2, which also function to recover the liquid LQ inflowed through the gap A into the second space 32 disposed on the side of the back surface Tb of the plate member T.

Figure 5:
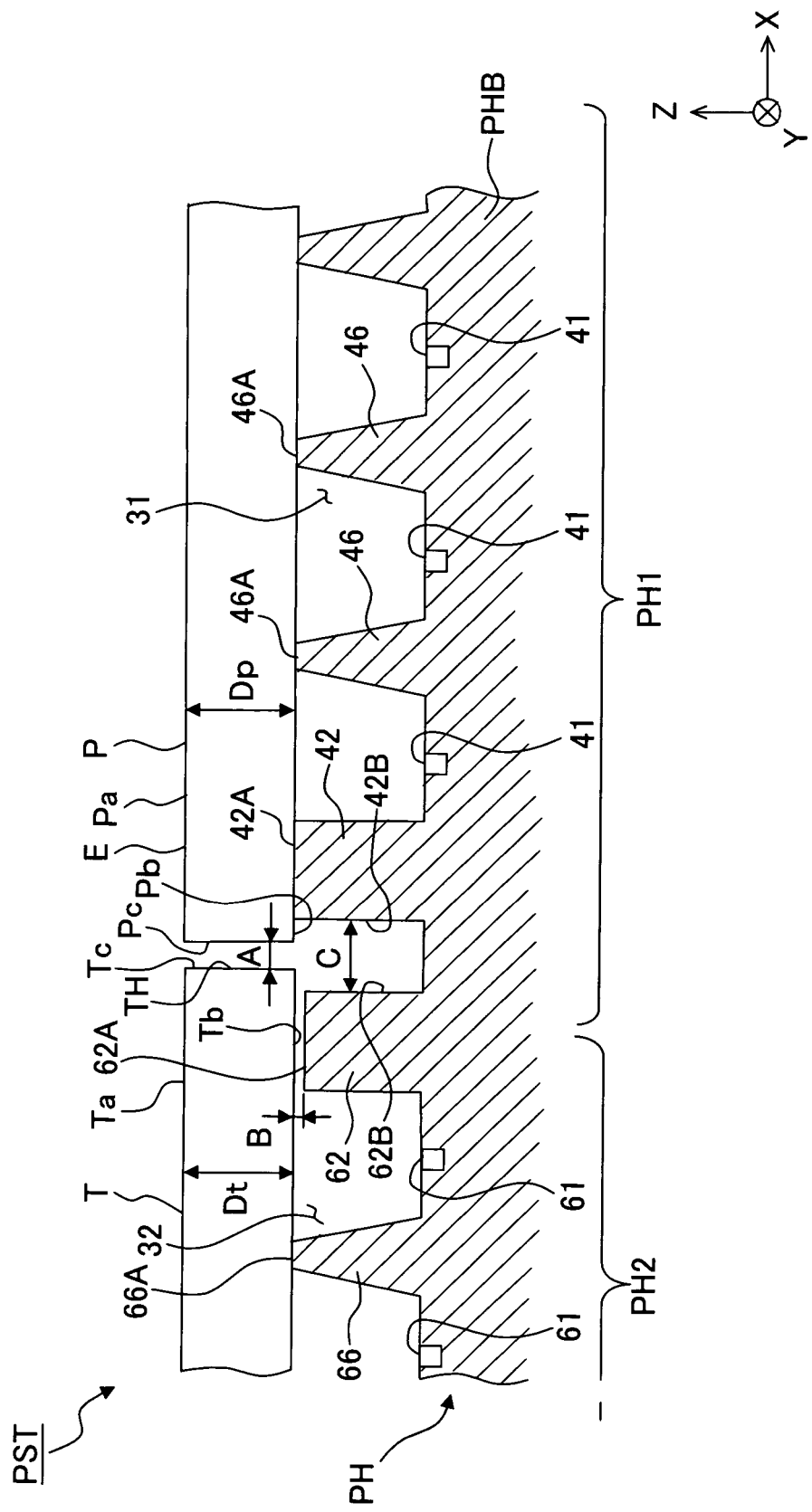
FIG. 5 shows a magnified view illustrating main components shown in FIG. 2.

FIG. 5 shows a magnified sectional view illustrating main components of the substrate holder PH which holds the substrate P and the plate member T. With reference to FIG. 5, the gap A of about 0.1 to 1.0 mm is secured between the side surface Pc of the substrate P and the side surface Tc of the plate member T opposite to or facing the side surface Pc as described above. The upper surface 42A of the first circumferential wall portion 42 and the upper surface 62A of the second circumferential wall portion 62 are the flat surfaces. Although not shown in FIG. 5, the upper surface 63A of the third circumferential wall portion 63 is also the flat surface.

In this embodiment, the first support portions 46 of the first holding portion PH1 are formed to have a height which is same as that of the first circumferential wall portion 42, or the first support portions 46 are formed to be slightly higher than the first circumferential wall portion 42. That is, the position of the upper surface 46A of the first support portion 46 of the first holding portion PH1 in relation to the Z axis direction is the same as the position of the upper surface 42A of the first circumferential wall portion 42 in relation to the Z axis direction, or slightly higher than the position of the upper surface 42A of the first circumferential wall portion 42 in relation to the Z axis direction. Accordingly, when the first space 31 is allowed to have the negative pressure, it is possible to make tight contact between the back surface Pb of the substrate P and the upper surface 42A of the first circumferential wall portion 42. Accordingly, the back surface Pb of the substrate P is supported by the upper surfaces 46A of the first support portions 46. When the back surface Pb of the substrate P makes tight contact with the upper surface 42A of the first circumferential wall portion 42, it is possible to avoid the inflow of the liquid LQ into the first space 31 through any space between the back surface Pb of the substrate P and the upper surface 42A of the first circumferential wall portion 42, even if the liquid LQ inflows through the gap A into the side of the back surface Pb of the substrate P.

The second support portions 66 of the second holding portion PH2 are formed to be slightly higher than the second circumferential wall portion 62. In other words, the second circumferential wall portion 62 of the second holding portion PH2 is formed to be lower than the second support portions 66. That is, the position of the upper surface 66A of the second support portion 66 in relation to the Z axis direction is slightly higher than the position of the upper surface 62A of the second circumferential wall portion 62 in relation to the Z axis direction. A predetermined gap B is formed between the back surface Tb of the plate member T and the upper surface 62A of the second circumferential wall portion 62 even in a state in which the second space 32 is allowed to have the negative pressure and the plate member T is attracted and held on the second support portions 66. The gap B is smaller than the gap A, which is not more than 50 μm, for example, about several μm (for example, 3 μm). Although not shown in FIG. 5, the third circumferential wall portion 63 is formed to be slightly lower than the second support portion 66, or the third circumferential wall portion 63 is formed to have approximately the same height as that of the second support portion 66. When the second space 32 is allowed to have the negative pressure, the upper surface 63A of the third circumferential wall portion 63 makes tight contact with the back surface Pb of the substrate P. The negative pressure in the second space 32 is maintained because of the gap B is slight between the back surface Tb of the plate member T and the upper surface 62A of the second circumferential wall portion 62.

The height of the second support portion 66 and the height of the second circumferential wall portion 62 can be determined so that the back surface Tb of the plate member T and the upper surface 62A of the second circumferential wall portion 62 make tight contact with each other. The height of the second support portion 66 and the height of the third circumferential wall portion 63 can be also determined so that an extremely small gap is formed between the back surface Tb of the plate member T and the upper surface 63A of the third circumferential wall portion 63.

A gap C is formed between the first circumferential wall portion 42 and the second circumferential wall portion 62. In this case, the outer diameter of the annular first circumferential wall portion 42 (first holding portion PH1) is formed to be smaller than the outer diameter of the substrate P. Therefore, the circumferential edge portion of the substrate P overhangs to the outside of the first circumferential wall portion 42, for example, by about 0.5 to 1.5 mm. The gap C is larger than the gap A, and is, for example, about 1.5 to 2.5 mm.

With reference to FIG. 5, the thickness Dp of the substrate P is approximately the same as the thickness Dt of the plate member T. The upper surface 42A of the first circumferential wall portion 42, the upper surface 46A of the first support portion 46, the upper surface 66A of the second support portion 66, the upper surface 62A of the second circumferential wall portion 62, and the upper surface 63A of the third circumferential wall portion 63 have approximately the same height, although they are slightly different from each other in the height. The surface Pa of the substrate P held by the first holding portion PH1 is approximately flush with the surface Ta of the plate member T held by the second holding portion PH2.

In this embodiment, the plate member T is formed of silica glass (glass). As shown in FIG. 4, a reference portion 300, which is provided with reference marks MFM, PFM for defining the position of the substrate P with respect to the image of the pattern of the mask M to be formed via the projection optical system PL, is provided at a predetermined position on the surface Ta of the plate member T. The reference marks PFM, MFM are formed in a predetermined positional relationship by using a predetermined material such as chromium or the like, on the plate member T composed of silica glass. The reference mark PFM is detected by the substrate alignment system 95, and the reference mark MFM is detected by the mask alignment system 96. It is also allowable to provide only any one of the reference mark MFM and the reference mark PFM.

A reference plate 400, which is to be used as a reference plane for the focus/leveling-detecting system, is provided at a predetermined position on the surface Ta of the plate member T. The upper surface of the reference portion 300 and the upper surface of the reference plate 400 are substantially flush with the surface Pa of the substrate P held by the first holding portion PH1.

The surface (flat portion) Ta, the back surface Tb, and the side surface Tc of the plate member T formed of silica glass are coated with a liquid-repellent material respectively. The reference portion 300 having the reference marks MFM, PFM and the reference plate 400 are also coated with the liquid-repellent material. The upper surface of the reference portion 300 and the upper surface of the reference plate 400 are also liquid-repellent. The liquid-repellent material includes, for example, acrylic resin materials and fluorine-based resin materials such as polytetrafluoroethylene. The plate member T formed of silica glass is applied (coated) with the liquid-repellent material as described above. Accordingly, the surface Ta, the back surface Tb, and the side surface Tc of the plate member T are liquid-repellent with respect to the liquid LQ respectively. In this embodiment, the plate member T made of silica glass is coated with "CYTOP" produced by Asahi Glass Co., Ltd. In order to make the plate member T to be liquid-repellent, a thin film, which is formed of the liquid-repellent material as described above, may be stuck or adhered to the plate member T. A material, which is not dissolvable in the liquid LQ, is used as the liquid-repellent material to provide the liquid repellence. The plate member T itself may be formed of a liquid-repellent material (for example, a fluorine-based material). Alternatively, the plate member T may be formed of, for example, stainless steel, and the liquid-repelling treatment may be performed to at least a part or parts of the surface Ta, the back surface Tb, and the side surface Tc.

An opening may be provided at a predetermined position of the plate member T, and an upper surface of an optical sensor may be exposed from the opening. Such an optical sensor includes, for example, an uneven illuminance sensor as disclosed in Japanese Patent Application Laid-open No. 57-117238, a spatial image-measuring sensor as disclosed in Japanese Patent Application Laid-open No. 2002-14005 (corresponding to U.S. patent application Publication No. 2002/0041377), and a radiation amount sensor (illuminance sensor) as disclosed in Japanese Patent Application Laid-open No. 11-16816 (corresponding to U.S. patent application Publication No. 2002/0061469). When the optical sensor as described above is provided, the upper surface of the optical sensor is also made to be substantially flush with the surface Ta of the plate member T and the surface Pa of the substrate P. The upper surface of the optical sensor is also liquid-repellent by coating the upper surface with the liquid-repellent material.

The surface Pa, which is the exposure surface of the substrate P, is coated with the photoresist (photosensitive material). In this embodiment, the photosensitive material is a photosensitive material for the ArF excimer laser, and has the liquid repellence (water repellence, contact angle: 80° to 85°). In this embodiment, the side surface Pc of the substrate P is subjected to the liquid-repelling treatment (water-repelling treatment). Specifically, the side surface Pc of the substrate P is also coated with the photosensitive material which has the liquid repellence as described above. Accordingly, it is possible to more reliably avoid the inflow of the liquid LQ through the gap A between the side surface Pc of the substrate P and the plate member T which has the liquid-repellent surface Ta. Further, the back surface Pb of the substrate P is also subjected to the liquid-repelling treatment by coating the back surface Pb with the photosensitive material. The material, which is used to make the back surface Pb and the side surface Pc of the substrate P to be liquid-repellent, is not limited to the photosensitive material as described above. It is also allowable to use any predetermined liquid-repellent material. For example, the upper layer of the photosensitive material, with which the surface Pa as the exposure surface of the substrate P is coated, is coated with a protective layer (film for protecting the photosensitive material from the liquid) which is called "top coat layer" in some cases. When the material for forming the top coat layer (for example, a fluorine-based resin material) is liquid-repellent (water-repellent), the side surface Pc and the back surface Pb of the substrate P may be coated with the material for forming the top coat layer. Of course, it is also allowable to perform the coating with any liquid-repellent material other than the photosensitive material and the material for forming the top coat layer.

It is not necessarily indispensable that the surface Pa of the substrate P is liquid-repellent. It is also possible to use a resist having a contact angle of about 60° to 80° with respect to the liquid LQ. The liquid-repelling treatment is also not necessarily indispensable for the side surface Pc and the back surface Pb of the substrate P. That is, it is also allowable that the surface Pa, the back surface Pb, and the side surface Pc of the substrate P are not liquid-repellent. It is also allowable that at least one of them is liquid-repellent, if necessary.

At least a part of the surface of the base member PHB of the substrate holder PH is also subjected to the liquid-repelling treatment to be liquid-repellent. In this embodiment, the upper surface 42A of the first circumferential wall portion 42 of the first holding portion PH1, the upper surface 46A of the first support portion 46, and the side surface 42B (surface opposite to or facing the second circumferential wall portion 62), which are included in the base member PHB of the substrate holder PH, are liquid-repellent. The upper surface 62A of the second circumferential wall portion 62 of the second holding portion PH2, the upper surface 66A of the second support portion 66, and the side surface 62B (surface opposite to or facing the first circumferential wall portion 42) are liquid-repellent. The liquid-repelling treatment for the substrate holder PH includes a treatment in which the coating is performed with the liquid-repellent material such as the fluorine-based resin material or the acrylic resin material as described above, or the thin film formed of the liquid-repellent material as described above is stuck. It is also allowable that the base member PHB, which includes the first circumferential wall portion 42 and the second circumferential wall portion 62 of the substrate holder PH, is entirely formed of a liquid-repellent material (for example, a fluorine-based resin). Alternatively, the coating may be performed with the photosensitive material as described above or the material for forming the top coat layer, in order to make the substrate holder PH and the plate member T to be liquid-repellent. The back surface Pb and the side surface Pc of the substrate P may be coated with the material (for example, the fluorine-based resin material and the acrylic resin material) used for the liquid-repelling treatment for the substrate holder PH. When it is difficult to provide the liquid repellence for the surface of the substrate P in view of the processing or in view of the accuracy, it is also allowable that any surface area of the base member PHB is not liquid-repellent.

The base member PHB is provided with holes 56H to arrange a first lifting member 56 for moving the substrate P upwardly and downwardly with respect to the base member PHB. The holes 56H are provided at three positions inside the first circumferential wall portion 42 (i.e., inside the first space 31) (see FIG. 3). The control unit CONT controls the upward/downward movement of the first lifting member 56 by the aid of an unillustrated driving unit.

The base member PHB is provided with holes 57H to arrange a second lifting member 57 for moving the plate member T upwardly and downwardly with respect to the base member PHB. In this embodiment, the holes 57H are provided at four positions disposed between the second circumferential wall portion 62 and the third circumferential wall portion 63 (i.e., inside the second space 32) (see FIG. 3). The control unit CONT controls the upward/downward movement of the second lifting member 57 by the aid of an unillustrated driving unit.

Figure 6:
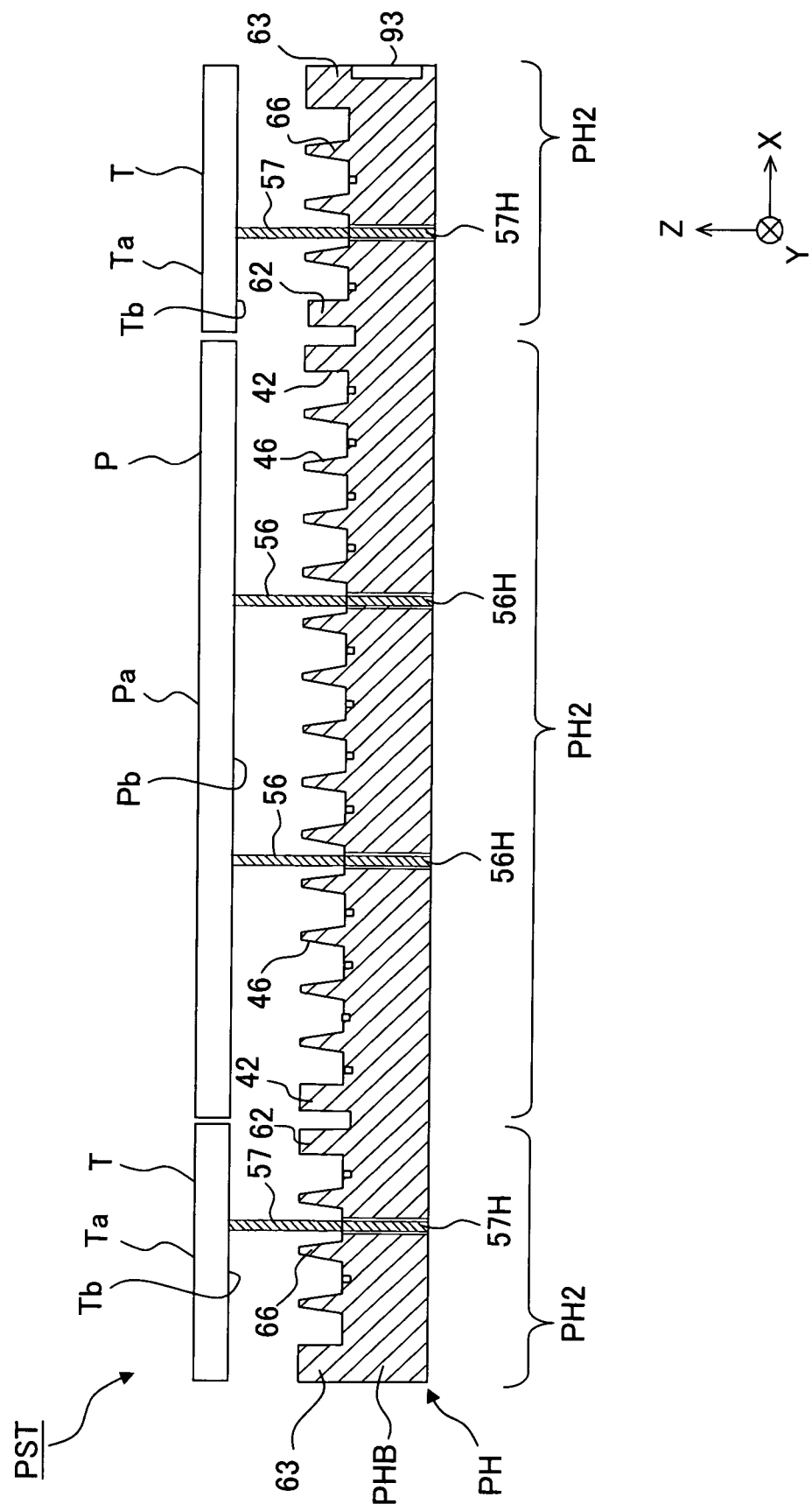
FIG. 6 shows a state in which a substrate and a plate member are separated from the substrate holder.

As shown in FIG. 6, the first lifting member 56 is capable of upwardly movable in a state in which the back surface Pb of the substrate P is held. When the first lifting member 56 is moved upwardly while holding the back surface Pb of the substrate P, the substrate P can be separated from the first holding portion PH1. Similarly, the second lifting member 57 is capable of upwardly movable in a state in which the back surface Tb of the plate member T is held. As described above, the plate member T is the member which is distinct from the base member PHB, and the plate member T is provided detachably with respect to the base member PHB of the substrate holder PH. Therefore, when the second lifting member 57 is moved upwardly while holding the back surface Tb of the plate member T, the plate member T can be separated from the second holding portion PH2.

When the plate member T is exchanged, then the control unit CONT releases the plate member T from being attracted and held by the second holding portion PH2, and then the second lifting member 57 is moved upwardly. The second lifting member 57 is moved upwardly in a state in which the back surface Tb of the plate member T is held. An unillustrated transport arm enters the space between the base member PHB of the substrate holder PH and the plate member T having been moved upwardly by the second lifting member 57, and the transport arm supports the back surface Tb of the plate member T. The transport arm unloads the plate member T from the base member PHB (second holding portion PH2) of the substrate holder PH.

On the other hand, when a new plate member T is attached onto the base member PHB of the substrate holder PH, the control unit CONT loads the new plate member T onto the base member PHB of the substrate holder PH by using the transport arm. In this situation, the second lifting member 57 has been moved upwardly. The transport arm transfers the plate member T to the second lifting member 57 having been moved upwardly. The second lifting member 57 is moved downwardly while holding the plate member T transferred from the transport arm. After moving the second lifting member 57 downwardly to install or place the plate member T onto the second holding portion PH2, the control unit CONT drives the second vacuum system 60 to provide the negative pressure in the second space 32. Accordingly, the plate member T is attracted and held by the second holding portion PH2.

The positional adjustment for the plate member T with respect to the base member PHB may be performed such that a mechanical reference is provided for at least one of the base member PHB and the plate member T to use the mechanical reference therefor. Alternatively, a dedicated alignment sensor may be provided to use the sensor therefor. For example, marks are provided beforehand for the base member PHB and the plate member T respectively. The respective marks are optically detected to adjust the relative positions of the base member PHB and the plate member T on the basis of the detection result. Accordingly, it is possible to attract and hold the plate member T at the predetermined position of the base member PHB.

When the substrate P, which has been subjected to the exposure process, is unloaded, then the control unit CONT releases the substrate P from being attracted and held by the first holding portion PH1, and then the first lifting member 56 is moved upwardly. The first lifting member 56 is moved upwardly in a state in which the back surface Pb of the substrate P is held. An unillustrated transport arm enters the space between the base member PHB of the substrate holder PH and the substrate P having been moved upwardly by the first lifting member 56, so as to hold the back surface Pb of the substrate P. The transport arm unloads (unloads) the substrate P from the base member PHB (first holding portion PH1) of the substrate holder PH.

On the other hand, when a new substrate P, which is to be subjected to the exposure process, is loaded onto the base member PHB of the substrate holder PH, the control unit CONT loads the new substrate P onto the base member PHB of the substrate holder PH by using the transport arm. In this situation, the first lifting member 56 has been moved upwardly. The transport arm transfers the substrate P to the first lifting member 56 having been moved upwardly. The first lifting member 56 is moved downwardly while holding the substrate P transferred from the transport arm. After moving the first lifting member 56 downwardly to install or place the substrate P onto the first holding portion PH1, the control unit CONT drives the first vacuum system 40 to provide the negative pressure in the first space 31. Accordingly, the substrate P is attracted and held by the first holding portion PH1.

As described above, the control unit CONT is capable of independently performing the suction operation of the first vacuum system 40 and the suction operation of the second vacuum system 60. Therefore, it is possible to independently perform, at distinct timings, the operation for effecting the attraction and holding and the operation for releasing the attraction and holding of the first holding portion PH1 in accordance with the loading and the unloading of the substrate P and the operation for effecting the attraction and holding and the operation for releasing the attraction and holding of the second holding portion PH2 in accordance with the loading and the unloading of the plate member T.

In this embodiment, the second lifting member 57 is provided in order to attach and detach the plate member T with respect to the base member PHB. Therefore, it is possible to smoothly perform the exchange operation (unload operation) for the plate member T.

This embodiment is constructed such that the plate member T can be automatically exchanged by using the second lifting member 57. However, it is also possible to omit the second lifting member 57. In this case, the exchange of the plate member T is carried out, for example, by an operator in a state in which the plate member T is released from the attraction.

Figure 7:
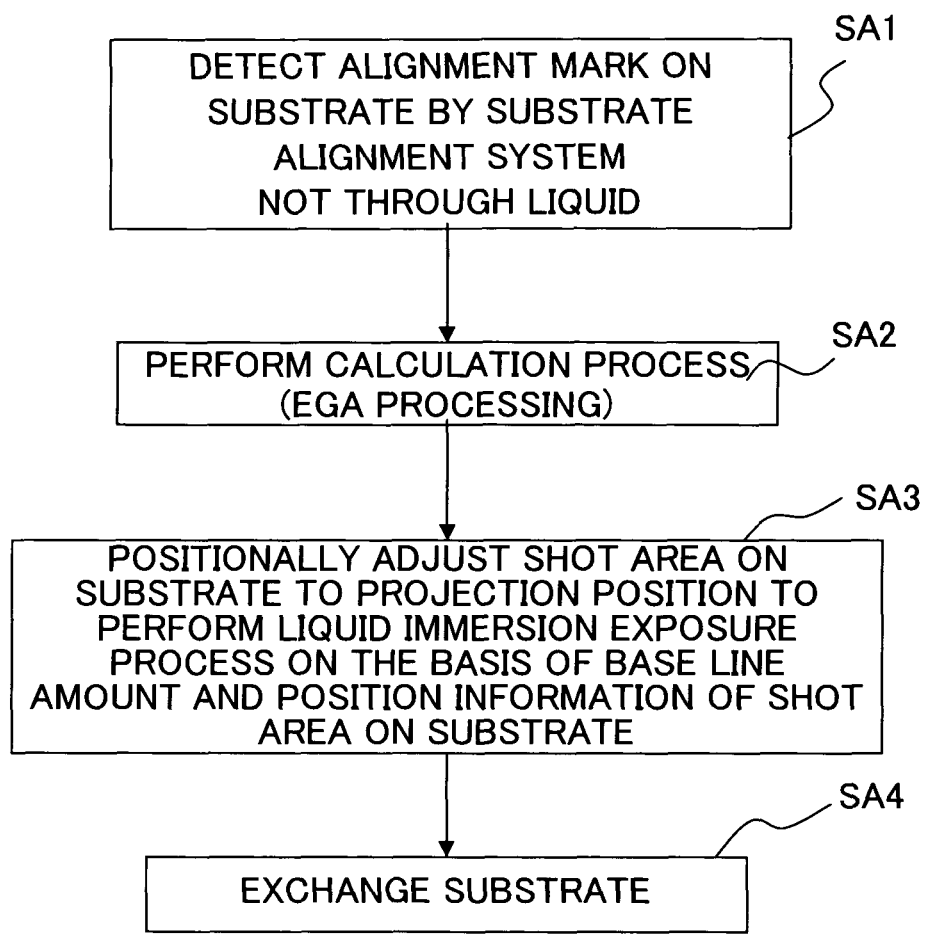
FIG. 7 shows a flow chart showing an example of the exposure procedure.

Next, an explanation will be made with reference to a flow chart shown in FIG. 7 about a method for exposing the substrate P by using the exposure apparatus EX described above.

The following assumption is set forth. That is, the image formation characteristic of the projection optical system PL through the liquid LQ is measured before the exposure of the substrate P by using the optical sensor disposed on the substrate stage PST as described above. The process for adjusting the image formation characteristic (calibration) of the projection optical system PL is performed on the basis of the obtained measurement result. The positional relationship (base line amount) is measured between the detection reference position of the substrate alignment system 95 and the projection position of the image of the pattern by using, for example, the substrate alignment system 95 and the mask alignment system 96.

The exposure apparatus EX of the embodiment of the present invention performs the projection exposure for the substrate P with the image of the pattern of the mask M while moving the mask M and the substrate P in the X axis direction (scanning direction). During the scanning exposure, a part of the image of the pattern of the mask M is projected onto the projection area AR1 via the projection optical system PL and the liquid LQ of the liquid immersion area AR2. The mask M is moved at the velocity V in the −X direction (or in the +X direction), in synchronization with which the substrate P is moved at the velocity $\beta \cdot V$ ($\beta$ represents the projection magnification) in the +X direction (or in the −X direction) with respect to the projection area AR1. As shown in FIG. 4, a plurality of shot areas S1 to S24 are set in a matrix form on the substrate P. After the exposure is completed for one shot area, the next shot area is moved to the acceleration start position in accordance with the stepping movement of the substrate P. The scanning exposure process is successively performed thereafter for the respective shot areas S1 to S24 while moving the substrate P in accordance with the step-and-scan manner.

When the substrate P is loaded on the substrate holder PH to which the plate member T is attracted and held in the second holding portion PH2 thereof, the control unit CONT successively detects a plurality of alignment marks AM formed on the substrate P not through the liquid, by using the substrate alignment system 95 (Step SA1). The position of the substrate stage PST (substrate holder PH), at which the substrate stage PST is located when the substrate alignment system 95 detects the alignment mark AM, is measured by the laser interferometer 94. Accordingly, the position information is measured for the respective alignment marks AM in the coordinate system defined by the laser interferometer 94. The detection result of the position information of the alignment mark AM detected by using the substrate alignment system 95 and the laser interferometer 94 is outputted to the control unit CONT. The substrate alignment system 95 has a detection reference position in the coordinate system defined by the laser interferometer 94. The position information of the alignment mark AM is detected as the deviation from the detection reference position.

Subsequently, the control unit CONT determines a position information about each of the shot areas S1 to S24 on the substrate P by the calculation processing (EGA processing) on the basis of the detection result of the position information about the alignment marks AM (Step SA2). In this embodiment, the position information about the shot areas S1 to S24 is determined in accordance with the so-called EGA (enhanced global alignment) system as disclosed, for example, in Japanese Patent Application Laid-open No. 61-44429.

When the process as described above is completed, the control unit CONT moves the substrate stage PST so that the liquid immersion area AR2, which is formed on a side of the image plane of the projection optical system PL, is moved onto the substrate P. Accordingly, the liquid immersion area AR2 is formed between the projection optical system PL and the substrate P. After forming the liquid immersion area AR2 on the substrate P, the image of the pattern is successively projected onto the plurality of shot areas, respectively, on the substrate P to perform the liquid immersion exposure (Step SA3). More specifically, the substrate stage PST is moved on the basis of the position information about the respective shot areas S1 to S24 determined in Step SA2 and the positional relationship (base line amount) between the projection position of the image of the pattern and the detection reference position of the substrate alignment system 95 stored by the control unit CONT so as to perform the liquid immersion exposure process for the respective shot areas S1 to S24 while positionally adjusting the image of the pattern to the respective shot areas S1 to S24 on the substrate P.

When the scanning exposure is completed for each of the shot areas S1 to S24 on the substrate P, the exposed substrate P is unloaded from the substrate stage PST, and an unexposed substrate is loaded on the substrate stage PST by the control unit CONT, while retaining the liquid LQ on the side of the image plane of the projection optical system PL or after recovering the liquid LQ on the side of the image plane of the projection optical system PL (Step SA4).

For example, when the shot areas S1, S4, S21, S24 and the like, which are provided in the edge area E of the substrate P, are subjected to the liquid immersion exposure, or when the reference mark MFM of the reference portion 300 is measured through the liquid LQ as described above, then a part or all of the liquid immersion area AR2 of the liquid LQ is formed on the surface Ta of the plate member T. When the optical sensor is provided on the substrate holder PH as described above, a part or all of the liquid immersion area AR2 of the liquid LQ is also formed on the surface Ta of the plate member T, when the measurement is performed through the liquid LQ by using the optical sensor. In such a situation, the liquid LQ can be satisfactorily recovered by using the liquid recovery mechanism 20, because the surface Ta of the plate member T is liquid-repellent. It is possible to suppress the occurrence of the inconvenience which would be otherwise caused such that the liquid LQ remains on the plate member T. If the liquid LQ remains on the plate member T, for example, the plate member T is deformed, and/or the environment (temperature, humidity), in which the substrate P is placed, is fluctuated due to the vaporization of the remaining liquid LQ. For example, the optical path is varied for various measuring light beams for measuring, for example, the position information of the substrate P, and the inconvenience of the deterioration of the exposure accuracy is caused. Further, the following possibility may arise. That is, the adhesion trace of the liquid (so-called water mark) is consequently formed on the plate member T after the vaporization of the remaining liquid, thereby causing any factor of the pollution or contamination of, for example, the reference portion 300. In this embodiment, the liquid LQ is prevented from being remaining on the plate member T. Therefore, it is possible to avoid the deterioration of the exposure accuracy and the measurement accuracy which would be otherwise caused by the remaining liquid LQ.

When the shot area, which is provided in the edge area E of the substrate P, is subjected to the exposure, a part of the liquid immersion area AR2 formed on the substrate P is formed on the plate member T. However, the surface Pa of the substrate P is substantially flush with the surface Ta of the plate member T, and there is substantially no difference in height between the edge portion of the substrate P and the surface Ta of the plate member T provided therearound. Therefore, the shape of the liquid immersion area AR2 can be maintained satisfactorily. It is possible to suppress the occurrence of the inconvenience which would be otherwise caused, for example, such that the liquid LQ of the liquid immersion area AR2 outflows and/or any bubble enters to and is mixed with the liquid LQ of the liquid immersion area AR2.

When the shot area, which is provided in the edge area E of the substrate P, is subjected to the exposure, the liquid immersion area AR2 of the liquid LQ is formed on the gap A. However, the gap A is set to have the value of not more than the predetermined value, which is about 0.1 to 1.0 mm in this embodiment. The surface Pa of the substrate P and the surface Ta of the plate member T are liquid-repellent, and the side surface Pc of the substrate P and the side surface Tc of the plate member T which form the gap A are liquid-repellent. Therefore, the inflow of the liquid LQ of the liquid immersion area AR2, which would be otherwise caused through the gap A into the side of the back surface Pb of the substrate P and/or the side of the back surface Tb of the plate member T, is suppressed owing to the surface tension of the liquid LQ. Further, in this embodiment, the gap A is secured between the substrate P and the plate member T at the notch portion (cutout) NT of the substrate P as well. Therefore, the inflow of the liquid LQ through the vicinity of the notch portion NT is also avoided.

Even if the liquid LQ inflows into the side of the back surface Pb of the substrate P and/or the side of the back surface Tb of the plate member T through the gap A, the second space 32 is prevented from the inflow of the liquid LQ through the gap B, because the back surface Tb of the plate member T is liquid-repellent, and the upper surface 62A, of the second circumferential wall portion 62, opposite to or facing the back surface Tb is liquid-repellent as well. Therefore, it is possible to avoid any inflow of the liquid LQ into the second vacuum system 60 via the second suction ports 61 disposed inside the second space 32. Further, the back surface Pb of the substrate P makes tight contact with the upper surface 42A of the first circumferential wall portion 42 opposite to or facing the back surface Pb. Therefore, the first space 32 is also prevented from the inflow of the liquid LQ. Therefore, it is also possible to avoid any inflow of the liquid LQ into the first vacuum system 40 via the first suction ports 41 disposed inside the first space 31.

When a shot area, which is provided in the edge area E of the substrate P, is subjected to the exposure, then the projection area AR1 protrudes to the outside of the substrate P, and the exposure light beam EL is radiated onto the surface Ta of the plate member T. There is such a possibility that the liquid repellence of the surface Ta may be deteriorated by the radiation of the exposure light beam EL. In particular, when, the liquid-repellent material, with which the plate member T is coated, is the fluorine-based resin, and the exposure light beam EL is the ultraviolet light beam, then the liquid repellence of the plate member T is easily deteriorated (is easily to be lyophilic). In this embodiment, the plate member T is provided detachably with respect to the second holding portion PH2, and is exchangeable. Therefore, the control unit CONT is operated so that the plate member T, which has the surface Ta with the deteriorated liquid repellence, is exchanged with a new plate member T (having sufficient liquid repellence), depending on the degree of deterioration of the liquid repellence of the plate member T (or the surface Ta). Accordingly, it is possible to avoid the occurrence of the inconvenience which would be otherwise caused, for example, such that the liquid LQ inflows through the gap between the plate member T and the substrate P, and the liquid LQ remains on the plate member T.

As for the timing at which the plate member T is exchanged, the plate member T can be exchanged at previously prescribed predetermined intervals, for example, every time when a predetermined number of substrates are processed or every time when a predetermined time interval elapses. Alternatively, the relationship between the radiation amount of the exposure light beam EL (radiation time, illuminance) and the liquid repellence level of the plate member T may be determined beforehand by any experiment or simulation. The timing, at which the plate member T is exchanged, may be set on the basis of the determined result. The timing, at which the plate member T is exchanged, is determined depending on the deterioration of the liquid repellence of the surface of the plate member. The deterioration of the liquid repellence can be evaluated, for example, by observing the surface visually or microscopically, by dripping a liquid droplet onto the evaluation surface to observe the state of the liquid droplet visually or microscopically, or by measuring the contact angle of the liquid droplet. The evaluation as described above, which is related to the totalized radiation amount (totalized number of pulses) of the ultraviolet light beam such as the exposure light beam, is previously recorded in the control unit CONT. Accordingly, the relation can be used by the control unit CONT to determine the service life of the plate T, i.e., the exchange time (timing or period).

In this case, the plate member T, which forms the upper surface of the substrate holder PH, is attracted and held by the second holding portion PH2. Therefore, it is possible to avoid the application of any local force, for example, to the plate member T and the base member PHB, for example, as compared with a case in which the plate member T and the base member PHB are connected to each other by using bolts or the like. Therefore, it is possible to suppress the deformation of the plate member T and the base member PHB. It is possible to satisfactorily maintain the flatness of the plate member T and the substrate P.

Figure 8:
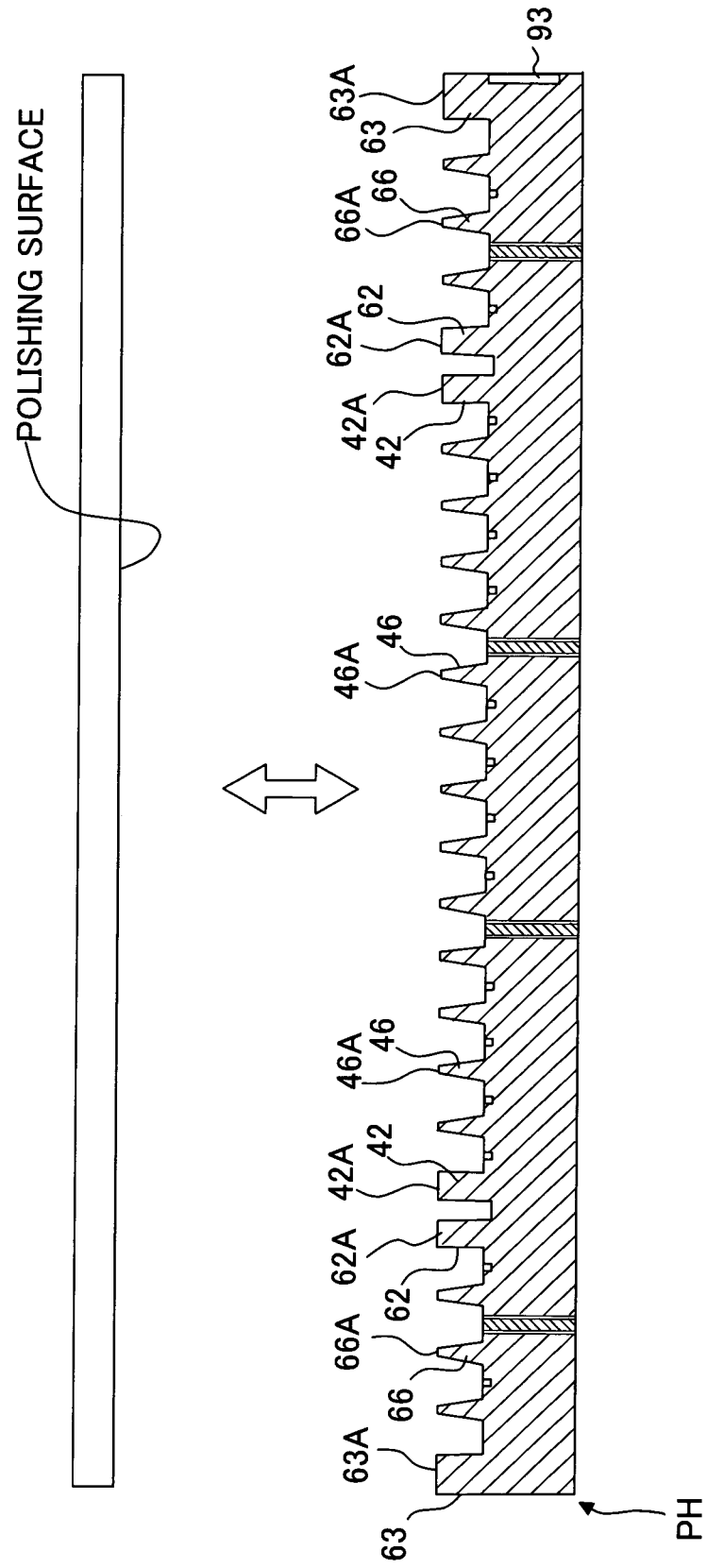
FIG. 8 schematically shows a situation in which the substrate holder is subjected to the polishing treatment.

In the substrate holder PH of this embodiment, as described above, the upper surface 42A of the first circumferential wall portion 42, the upper surface 46A of the first support portion 46, the upper surface 66A of the second support portion 66, the upper surface 62A of the second circumferential wall portion 62, and the upper surface 63A of the third circumferential wall portion 63 have approximately the same height, although they are slightly different in height from one another. In this case, the plate member T, which is provided to form the upper surface of the substrate holder PH, is formed detachably with respect to the second holding portion PH2. Therefore, as schematically shown in FIG. 8, even when the predetermined treatment such as the polishing treatment is performed to the respective upper surfaces 42A, 46A, 62A, 63A, 66A when the substrate holder PH is produced, the respective upper surfaces 42A, 46A, 62A, 63A, 66A can be treated or processed with satisfactory operability. For example, when the first holding portion PH1 is formed to be lower than the second holding portion PH2, it is not easy to perform the polishing treatment for the upper surface of the first holding portion PH1, because the first holding portion PH1 is recessed as compared with the second holding portion PH2, although the polishing treatment can be smoothly performed to the upper surface of the second holding portion PH2. In this embodiment, the upper surface of the first holding portion PH1 and the upper surface of the second holding portion PH2 have approximately same height. Therefore, the treatment can be smoothly performed to the upper surface of the first holding portion PH1 and the upper surface of the second holding portion PH2 respectively. When the polishing treatment is performed, the polishing treatment can be performed substantially simultaneously to the upper surface of the first holding portion PH1 and the upper surface of the second holding portion PH2 respectively. Therefore, the treatment can be performed with satisfactory operability.

In the embodiment described above, the surfaces of the surface Ta, the side surface Tc, and the back surface Tb of the plate member T are entirely coated with the liquid-repellent material on account of the liquid-repelling treatment. However, the side surface Tc and the back surface Tb can be made liquid-repellent selectively, if necessary. For example, it is also allowable to adopt such a construction in which the liquid-repelling treatment is performed only for an area for forming the gap A, i.e., the side surface Tc of the plate member T and for an area for forming the gap B, i.e., the area of the back surface Tb of the plate member T opposite to or facing the upper surface 62A of the second circumferential wall portion 62. Alternatively, when the gap B is sufficiently small, and the liquid repellence (contact angle) of the material for the coating to perform the liquid-repelling treatment is sufficiently large, then the possibility is further lowered to allow the liquid LQ to flow into the second space 32 through the gap A. Therefore, it is also allowable to adopt such a construction that the liquid-repelling treatment is not performed to the back surface Tb, of the plate member T, which forms the gap B, and only the side surface Tc of the plate member T is subjected to the liquid-repelling treatment.

In this embodiment, as shown in FIG. 9, the height of the second support portions 66 and the height of the second circumferential wall portion 62 of the second holding portion PH2 are set so that the liquid LQ, which inflows through the gap A, is introduced or drawn into the side of the back surface Tb of the plate member T, when the liquid LQ is inflowed through the gap A formed between the substrate P held by the first holding portion PH1 and the plate member T held by the second holding portion PH2. In other words, the gap B is set between the upper surface 62A of the second circumferential wall portion 62 of the second holding portion PH2 and the back surface Tb of the plate member T attracted and held by the second support portions 66 so that the liquid LQ, which is inflowed through the gap A, is introduced into the side of the back surface Tb of the plate member T in accordance with the suction operation effected by the second suction ports 61 formed on the side of the back surface Tb of the plate member T. Further, a gap F is optimally set between the back surface Tb of the plate member T supported by the second support portions 66 and the upper surface of the base member PHB opposite to or facing the back surface Tb so that the liquid LQ, which is inflowed through the gap A, is introduced into the side of the back surface Tb of the plate member T in accordance with the suction operation effected by the second suction ports 61 formed on the side of the back surface Tb of the plate member T. In this embodiment, the gap F is about 50 μm. The back surface Pb of the substrate P and the upper surface 42A of the first circumferential wall portion 42 make tight contact with each other. Therefore, when the gas, which is present in the second space 32, is sucked through the second suction ports 61, an air or gas stream, which is directed from the space outside the second circumferential wall portion 62 toward the second space 32, is generated in the gap B formed between the back surface Tb of the plate member T and the upper surface 62A of the second circumferential wall portion 62. Accordingly, even when the liquid LQ of the liquid immersion area AR2 inflows into the gap A, then the inflowed liquid LQ does not advance further to arrive at the side of the back surface Pb of the substrate P, and the liquid LQ flows through the gap B into the second space 32 formed on the side of the back surface Tb of the plate member T, to be recovered from the second suction ports 61 formed on the side of the back surface Tb of the plate member T.

This embodiment is constructed such that the gap B is formed continuously at the outside of the substrate P to surround the substrate P along the edge of the substrate P. Therefore, even when the liquid LQ inflows from any position of the gap A including the vicinity of the notch portion (cutout) NT of the substrate P, then the liquid LQ can be allowed to flow through the gap B into the second space 32 disposed outside the substrate P, and the liquid LQ can be smoothly recovered from the second suction ports 61.

As described above, even when the liquid LQ inflows through the gap A, then the inflowed liquid LQ does not advance further to arrive at (flow into) the side of the back surface Pb of the substrate P, and the liquid LQ is introduced into the side of the back surface Tb of the plate member T through the gap B. Therefore, it is possible to avoid the occurrence of the inconvenience which would be otherwise caused, for example, such that the flatness of the substrate P is deteriorated due to the liquid LQ flowing and arriving at the side of the back surface Pb of the substrate P.

On the other hand, the exchange frequency of the plate member T is small as compared with the substrate P, and the high flatness is not required for the plate member T as compared with the substrate P. Therefore, no inconvenience arises even when the liquid LQ flows to arrive at the side of the back surface Tb of the plate member T.

This embodiment is constructed such that the second suction ports 61 for attracting and holding the plate member T are also used as the liquid recovery ports for recovering the liquid LQ inflowed through the gap A. In this construction, the second holding portion PH2 attracts and holds the plate member T at least during the exposure of the substrate P. Therefore, in this construction, the second suction ports (liquid recovery ports) 61 always recover the liquid LQ inflowed through the gap A at least during the exposure of the substrate P. Therefore, it is possible to reliably avoid the liquid LQ inflowed through the gap A further flowing toward the side of the back surface Pb of the substrate P. If the liquid LQ inflows into the side of the back surface Pb of the substrate P, there is a fear that the substrate P is adhered to the first holding portion PH1 by the liquid LQ, and that the substrate P cannot be smoothly moved upwardly by the first lifting member 56. However, it is possible to avoid the occurrence of the inconvenience as described above by avoiding the inflow of the liquid LQ to the side of the back surface Pb of the substrate P.

In this embodiment, as shown in FIG. 9, a porous member 68 is arranged in the flow passage 65, connected to each of the second suction ports 61, at an intermediate position thereof. The liquid LQ, which is recovered from the second suction port 61 and which is allowed to flow through the flow passage 65, is captured by the porous member 68. Accordingly, it is possible to avoid the inconvenience which would be otherwise caused such that the liquid LQ flows into the second vacuum system 60. The liquid LQ, which is captured by the porous member 68, is vaporized in the flow passage 65. The liquid LQ is recovered in a minute amount by the second suction port 61, and the liquid LQ, which is captured by the porous member 68, can be vaporized in the flow passage 65. A mesh member may be arranged in the flow passage 65 in place of the porous member 68. Alternatively, it is also possible to avoid the inflow of the liquid LQ into the second vacuum system 60 such that a gas/liquid separator, which separates the gas from the liquid LQ recovered from the second suction port 61, is provided to the flow passage 65, which connects each of the second suction ports 61 to the second vacuum system 60, at an intermediate position of the flow passage 65. Further alternatively, a buffer space, which is larger than other areas, may be provided to the flow passage 65 in a predetermined area disposed at an intermediate position of the flow passage 65. The liquid LQ may be captured by the buffer space to avoid the inflow of the liquid LQ into the second vacuum system 60.

In this embodiment, the back surface Pb of the substrate P and the upper surface 42A of the first circumferential wall portion 42 are allowed to make tight contact with each other, i.e., a gap D between the back surface Pb of the substrate P and the upper surface 42A of the first circumferential wall portion 42 is made to be substantially zero. Accordingly, it is possible to more reliably avoid such an inconvenience that the liquid LQ, which inflows through the gap A, would inflow into the first space 31 through the space between the back surface Pb of the substrate P and the upper surface 42A of the first circumferential wall portion 42. On the other hand, when the gap D is formed between the back surface Pb of the substrate P and the upper surface 42A of the first circumferential wall portion 42, then the gap B, the gap D, the negative pressure in the first space 31, and the negative pressure in the second space 32 are set so that the suction force to suck the liquid LQ into the gap B is larger than the suction force to suck the liquid LQ into the gap D. Accordingly, the liquid LQ, which is inflowed through the gap A, can be smoothly introduced into the side of the back surface Tb of the plate member T. It is thus possible to avoid the inconvenience which would be otherwise caused such that the liquid LQ, which inflowed through the gap A, flowing further and arriving at the side of the back surface Pb of the substrate P.

In the embodiment described above, the plurality of second suction ports 61 are formed substantially uniformly on the upper surface of the base member PHB (surface opposite to or facing the back surface Tb of the plate member T) between the second circumferential wall portion 62 and the third circumferential wall portion 63. However, it is also allowable that parts of the second suction ports 61, which are included in the plurality of second suction ports 61, are formed, for example, in a slit-shaped form along the second circumferential wall portion 62 on the upper surface of the base member PHB between the second circumferential wall portion 62 and the third circumferential wall portion 63, at portions in the vicinity of the second circumferential wall portion 62. Accordingly, it is possible to more smoothly recover the liquid LQ flowed into the second space 32 through the gap B.

In the embodiment described above, the second circumferential wall portion 62 is formed to be annular as viewed in a plan view, and the gap B is formed continuously to surround the substrate P. However, the gap B may be formed discontinuously by allowing the height of the second circumferential wall portion 62 to differ partially.

In the embodiment described above, the second space 32 is formed to attract and hold the plate member T by forming the second circumferential wall portion 62 and the third circumferential wall portion 63 on the base member PHB. However, annular circumferential wall portions (second outer wall portions) may be provided at a plurality of positions outside the first circumferential wall portion 42. Then, spaces, which are surrounded by the annular circumferential wall portions, may be allowed to have the negative pressure respectively. Accordingly, the plate member T may be held on a plurality of convex members (pin-shaped members) arranged outside the annular circumferential wall portions. In this case, when suction ports for the liquid LQ are provided outside the annular circumferential wall portions, the liquid LQ, which inflowed through the gap A, can be recovered from the suction ports. In particular, by optimizing the gap F, which is defined between the back surface Tb of the plate member T and the upper surface of the base member PHB opposite to or facing the back surface T, the liquid LQ which inflows through the gap A can be sucked and recovered via the suction ports provided on the side of the back surface Tb of the plate member T, without allowing the liquid LQ flow from the upper surface to arrive at the side of the back surface Pb of the substrate P.

In the embodiment described above, the plate member T and the substrate holder PH can be separated from each other. However, the plate member T and the substrate holder PH may be formed as an integrated body. On the other hand, when the plate member T and the substrate holder PH are provided as mutually independent members, and the plate member T is held by the second holding portion PH2, then it is possible to form the gap B with ease. Further, it is possible to smoothly perform the treatment in order to provide the liquid repellence, for example, for the upper surface 62A of the second circumferential wall portion 62 and the second support portion 66.

In the embodiment described above, the thickness of the substrate P is approximately same as the thickness of the plate member T, and the position of the gap B in relation to the Z axis direction is approximately the same as that of the gap D. However, it is also allowable to set mutually different positions. For example, the position of the gap B in relation to the Z axis direction may be higher than the position of the gap D. Accordingly, the liquid LQ, which inflows through the gap A, can be recovered from the second suction port 61 via the gap B, before the liquid LQ arrives at the back surface of the substrate P (gap D). It is possible to more reliably avoid the inflow of the liquid LQ into the first space 31 on the side of the back surface Pb of the substrate P.

In the embodiment described above, the upper surface 62A of the second circumferential wall portion 62 and the back surface Tb of the plate member T opposite to or facing the upper surface 62A are substantially parallel to the XY plane (i.e., the horizontal plane). However, the upper surface 62A and the back surface Tb may be inclined with respect to the XY plane while securing the gap B. In the embodiment described above, the back surface Tb of the plate member T is opposite to or facing the entire region of the upper surface 62A of the second circumferential wall portion 62. However, the diameter of the second circumferential wall portion 62 may be slightly smaller than the hole TH of the plate member T, or the width of the upper surface 62A may be increased, or a portion of the upper surface 62A of the second circumferential wall portion 62 may be opposite to or facing the gap A (or the back surface Pb of the substrate P).

In the embodiment described above, the concave portion is formed between the first circumferential wall portion 42 and the second circumferential wall portion 62 to form the gap C. However, the first circumferential wall portion 42 may be continued to the second circumferential wall portion 62. That is, one circumferential wall portion having a wide width may be provided instead of the first circumferential wall portion 42 and the second circumferential wall portion 62. In this case, the negative pressure in the second space may be different from the negative pressure in the first space so that the liquid LQ, which inflows through the gap A, is introduced into the gap B. Alternatively, a difference in height or an inclination may be provided on the upper surface of the circumferential wall portion so that a gap B', which is formed between the upper surface of the wide width circumferential wall portion and the back surface Pb of the substrate P is different from a gap D' which is formed between the upper surface of the circumferential wall portion and the back surface Tb of the plate member T.

The foregoing embodiment has been explained as exemplified by the case using the liquid immersion exposure apparatus for projecting the image of the pattern of the mask M onto the substrate P through the liquid LQ, as an example. However, it is of course possible to apply the present invention to a general dry exposure apparatus for projecting the image of the pattern of the mask M onto the substrate P not through the liquid LQ. The plate member T, which forms the upper surface of the substrate stage PST, is attracted and held by the second holding portion PH2, and the plate member T is detachable (exchangeable) with respect to the base member PHB. Therefore, for example, when any foreign matter (impurity) adheres to or pollutes the plate member T and/or the reference portion 300, or when the plate member T and/or the reference portion 300 is damaged or broken, then the plate member T can be smoothly exchanged with a new plate member.

Second Embodiment

Next, an explanation will be made about a second embodiment of the substrate stage PST (substrate holder PH). In the following explanation, the constitutive components, which are the same as or equivalent to those of the first embodiment described above, are designated by the same reference numerals, any explanation of which will be simplified or omitted. Modified embodiments, which are common to those of the first embodiment, will be omitted from the explanation as well.

Figure 10:
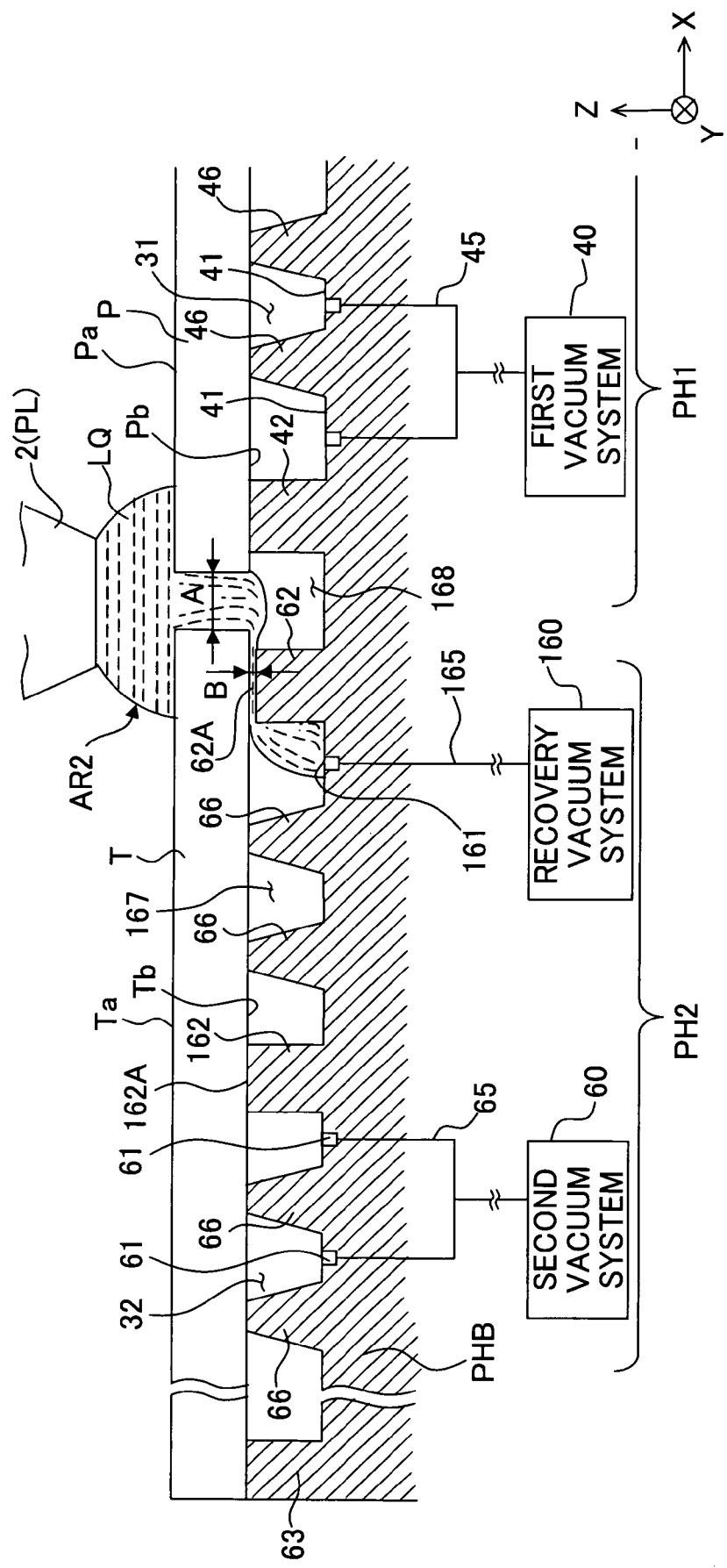
FIG. 10 shows another embodiment (second embodiment) of the substrate holder.

With reference to FIG. 10, an intermediate circumferential wall portion 162, which is substantially annular as viewed in a plan view and which is provided to surround the second circumferential wall portion 62, is provided on the upper surface of the base member PHB between the second circumferential wall portion 62 and the third circumferential wall portion 63. The intermediate circumferential wall portion 162 is formed to be slightly lower than the second support portion 66 or have approximately the same height as that of the second support portion 66. An upper surface 162A of the intermediate circumferential wall portion 162 and the back surface Tb of the plate member T substantially make tight contact with each other. The second space 32 is formed by the base member PHB, the intermediate circumferential wall portion 162, the third circumferential wall portion 63, and the plate member T. The second suction ports 61, which are connected via the flow passages 65 to the second vacuum system 60, are formed on the upper surface of the base member PHB at a portion thereof corresponding to the second space 32 (on the upper surface of the base member PHB between the intermediate circumferential wall portion 162 and the third circumferential wall portion 63). The second vacuum system 60 provides the negative pressure in the second space 32 by sucking the gas present in the second space 32 from the second suction ports 61 to attract and hold the plate member T.

A space 167, which is distinct or different from the second space 32, is formed by the base member PHB, the second circumferential wall portion 62, the intermediate circumferential wall portion 162, and the plate member T. A liquid recovery port 161, which is provided to recover the liquid LQ inflowed through the gap A, is formed on the upper surface of the base member PHB at a portion thereof between the second circumferential wall portion 62 and the intermediate circumferential wall portion 162. The liquid recovery port 161 is formed in a slit-shaped form and as a plurality of liquid recovery ports 161 formed along the second circumferential wall portion 62 in the vicinity of the second circumferential wall portion 62, on the upper surface of the base member PHB at a portion thereof between the second circumferential wall portion 62 and the intermediate circumferential wall portion 162. The liquid recovery ports 161 are connected to a recovery vacuum system 160 via flow passages 165. The control unit CONT is capable of independently controlling the operations of the first vacuum system 40, the second vacuum system 60, and the recovery vacuum system 160 respectively.

The second support portions 66, which support the back surface Tb of the plate member T, are provided between the second circumferential wall portion 62 and the intermediate circumferential wall portion 162. It is also allowable that the second support portions 66 are absent or omitted between the second circumferential wall portion 62 and the intermediate circumferential wall portion 162. The upper surface 162A of the intermediate circumferential wall portion 162 may be made liquid-repellent in the same manner as the upper surface 62A of the second circumferential wall portion 62. It is also allowable that a minute gap is formed between the upper surface 162A of the intermediate circumferential wall portion 162 and the back surface Tb of the plate member T.

In the embodiment shown in FIG. 10, the control unit CONT allows the substrate P and the plate member T to be attracted and held by the first and second holding portions PH1, PH2 respectively by driving the first and second vacuum systems 40, 60 to provide the negative pressure in the first and second spaces 31, 32 respectively, during a predetermined period of time including the period in which the substrate P is exposed. In this case, the control unit CONT stops the driving of the recovery vacuum system 160 during the exposure of the substrate P.

There is such a possibility that the liquid LQ remains at the inside of the gap A and on the gap A by performing the liquid immersion exposure for the substrate P. There is also such a possibility that the liquid LQ, which inflows through the gap A, may stay in the space 168 between the first circumferential wall portion 42 and the second circumferential wall portion 62. The control unit CONT exchanges the exposed substrate P with a new substrate P as explained with reference to FIG. 6, after the completion of the exposure of the substrate P. The control unit CONT starts the driving of the recovery vacuum system 160, immediately before the substrate P is detached from the first holding portion PH1, to suck and recover the liquid LQ allowed to remain, for example, in the space 168 through the gap B and the liquid recovery ports 161 (this operation is continued after Step SA3 shown in FIG. 7). The driving of the recovery vacuum system 160 may be continued during the exchange of the substrate P. However, when the new substrate P is placed on the substrate-holding portion PH1, it is desirable that the driving of the recovery vacuum system 160 is stopped in order to avoid, for example, any positional deviation of the substrate P caused, for example, by the vibration. The flow passage 165, which connects the liquid recovery port 161 and the recovery vacuum system 160, is provided with the gas/liquid separator or the like as described above. Therefore, even when the liquid LQ is recovered via the liquid recovery ports 161, the recovery vacuum system 160 is prevented from any inflow of the liquid LQ.

As described above, when the liquid recovery ports 161 for recovering the liquid LQ inflowed through the gap A are provided on the base member PHB separately from the second suction ports 61 for providing the negative pressure in the second space 32 surrounded by the base member PHB, the intermediate circumferential wall portion 162, the third circumferential wall portion 63, and the plate member T, it is possible to independently perform the operation to attract and hold the plate member T using the second suction ports 62 and the operation to recover the liquid using the liquid recovery ports 161 respectively. Therefore, it is possible to stop the driving of the recovery vacuum system 160 during the exposure of the substrate P. Therefore, it is possible to suppress the fluctuation of the liquid immersion area AR2 during the exposure and the influence of the vibration on the exposure which would be otherwise caused by the driving of the recovery vacuum system 160.

In the embodiment explained with reference to FIG. 10, when the influence of the vibration on the exposure and the fluctuation of the liquid immersion area AR2 during the exposure, due to the driving of the recovery vacuum system 160, are small, it is also allowable to drive the recovery vacuum system 160 during the exposure of the substrate P. By doing so, the second holding portion PH2 can attract and hold the plate member T more stably owing to the negative pressure in the space 167 provided by the recovery vacuum system 160 in combination with the negative pressure in the second space 32 provided by the second vacuum system 60. When the recovery driving system 160 is driven during the exposure of the substrate P, the liquid LQ, which inflows through the gap A during the exposure of the substrate P, can be satisfactorily recovered via the gap B and the liquid recovery ports 161. Therefore, it is possible to more reliably avoid the inflow of the liquid LQ into the first space 31 on the side of the back surface Pb of the substrate P.

In this case, the suction amount (suction force), which is brought about through the liquid recovery ports 161 during the exposure of the substrate P, may be made smaller than the suction amount (suction force) which is brought about through the liquid recovery ports 161 after the exposure of the substrate P so that no problem is caused by the fluctuation of the liquid immersion area AR2 during the exposure and the influence of the vibration on the exposure caused by the driving of the recovery vacuum system 160.

In the first and second embodiments described above, the gap B, which is formed between the upper surface 62A of the second circumferential wall portion 62 of the second holding portion PH2 and the back surface Tb of the plate member T, can also function to adjust the liquid recovery amount of the suction ports (61, 161), because the gap B serves as the recovery port (recovery nozzle) to recover the liquid LQ inflowed from the gap A through the suction ports (61, 161) formed at the inside of the second circumferential wall portion 62. Therefore, it is desirable that the size of the gap B is optimally set so that the state of the liquid immersion area AR2 is not fluctuated by the increase in the amount of the liquid LQ inflowed through the gap A.

Third Embodiment

Figure 11:
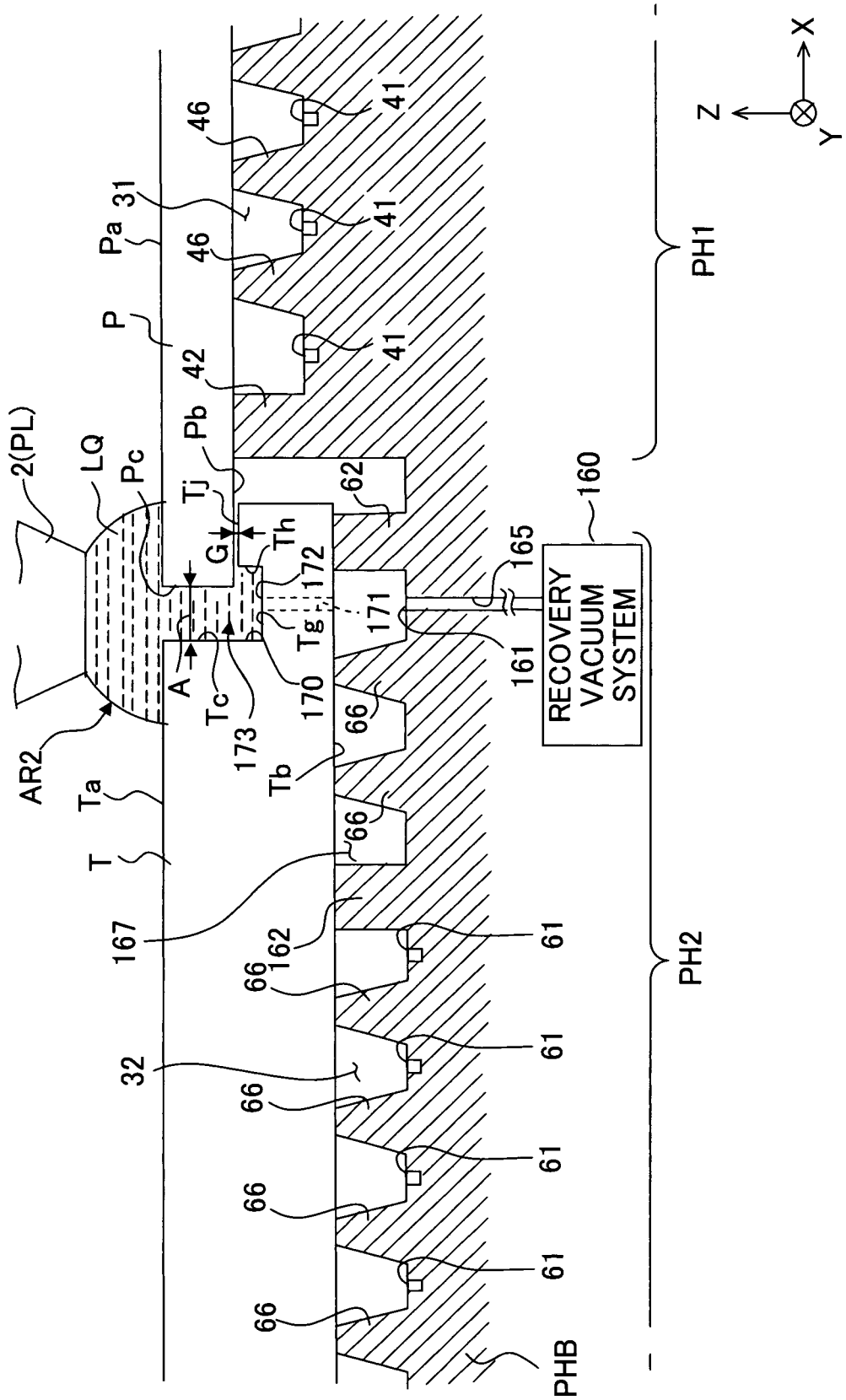
FIG. 11 shows another embodiment (third embodiment) of the substrate holder.

FIG. 11 shows a third embodiment. Constructions and modified embodiments, which are common to those of the first and second embodiments, will be explained in a simplified manner or omitted from the explanation. With reference to FIG. 11, a plate member T, which is held by the second holding portion PH2, has a surface (first surface) Ta which is substantially flush with the surface Pa of the substrate P held by the first holding portion PH1, a side surface Tc which is opposite to or facing the side surface Pc of the substrate P, a liquid-receiving surface Tg which is provided along the side surface Tc and which is substantially parallel to the surface Ta, and an opposing surface (second surface) Tj which is opposite to or facing the back surface Pb of the substrate P at the circumferential edge portion of the substrate P held by the first holding portion PH1. The surface Ta of the plate member T is formed to surround the surface Pa of the substrate P in the same manner as in the embodiment described above. The opposing surface Tj of the plate member T is formed to be annular so that the opposing surface Tj is disposed along the circumferential edge portion of the substrate P. That is, the plate member T, which is held by the second holding portion PH2, forms the surface Ta and the opposing surface Tj along the circumferential edge of the substrate P held by the first holding portion PH1. In this embodiment, the gap A is also formed between the edge of the surface Pa of the substrate P and the edge of the surface Ta of the plate member T. The gap A is 0.1 to 1.0 mm.

The receiving surface Tg is provided at a position below or lower than the gap A between the substrate P and the plate member T (at a position below or lower than the back surface Pb of the substrate P). The opposing surface Tj is provided at the position (on the +Z side) above or higher than that of the receiving surface Tg in relation to the Z axis direction. A recess 170, which is capable of holding or retaining the liquid LQ, is defined by the side surface Tc, the receiving surface Tg, and an inner side surface Th which is connected to the opposing surface Tj and which is opposite to or facing the side surface Tc. The recess 170 can hold the liquid LQ inflowed through the gap A. The liquid LQ, which is inflowed through the gap A formed between the edge of the surface Pa of the substrate P and the edge of the surface Ta of the plate member T, is held in a space 173 formed by the side surface Pc of the substrate P, and the side surface Tc and the receiving surface Tg of the plate member T.

The back surface Pb of the substrate P held by the first holding portion PH1 makes no contact with the opposing surface Tj of the plate member T held by the second holding portion PH2. A predetermined gap G is formed between the back surface Pb of the substrate P and the opposing surface Tj of the plate member T. The spacing distance of the gap G, which is formed between the back surface Pb of the substrate P held by the first holding portion PH1 and the opposing surface Tj of the plate member T held by the second holding portion PH2, is set so that no liquid LQ is inflowed into the gap G. In this embodiment, the spacing distance of the gap G is set to be about 50 µm. Accordingly, even when the liquid LQ inflows through the gap A, the liquid LQ is prevented from any leakage through the gap G to the outside of the space 173 (to the side of the back surface Pb of the substrate P).

The surface Ta, the back surface Tb, and the side surface Tc of the plate member T have the liquid repellence in the same manner as in the embodiment described above. Further, the receiving surface Tg, the inner side surface Th, and the opposing surface Tj of the plate member T also have the liquid repellence. Further, the surface Pa, the back surface Pb, and the side surface Pc of the substrate P have the liquid repellence as well. As described above, the spacing distance of the gap G is set so that no liquid LQ is allowed to make any inflow thereinto. However, the back surface Pb of the substrate P and the opposing surface Tj of the plate member T, which form the gap G, are liquid-repellent. Therefore, it is possible to more reliably avoid the leakage of the liquid LQ to the outside of the plate member T through the gap G.

As described above, in order to avoid the inflow of the liquid LQ through the gap G, it is desirable that the opposing surface Tj of the plate member T is liquid-repellent. However, it is not necessarily indispensable that the side surface Tc, the receiving surface Tg, and the inner side surface Th are liquid-repellent. These surfaces may be liquid-repellent appropriately and selectively.

The second holding portion PH2, which holds the plate member T, has the intermediate circumferential wall portion 162 which is provided between the second circumferential wall portion 62 and the third circumferential wall portion 63 in the same manner as in the embodiment explained with reference to FIG. 10. The second space 32 is formed by the base member PHB, the intermediate circumferential wall portion 162, the third circumferential wall portion 63, and the plate member T. The second suction ports 61 are formed on the upper surface of the base member PHB at a portion thereof corresponding to the second space 32. The second vacuum system 60 (not shown in FIG. 11) sucks the gas present in the second space 32 through the second suction ports 61 to provide the negative pressure in the second space 32. Accordingly, the plate member T is attracted and held.

The space 167 is formed by the base member PHB, the second circumferential wall portion 62, the intermediate circumferential wall portion 162, and the plate member T. The liquid recovery ports 161, which are connected via the flow passages 165 to the recovery vacuum system 160, are formed on the upper surface of the base member PHB at a portion thereof corresponding to the space 167. Passages 171, through which the liquid LQ is allowed to flow, are formed in the plate member T at positions opposite to or facing the liquid recovery ports 161, respectively. The flow passages 171 are holes which inflow through the receiving surface Tg and the back surface Tb of the plate member T. The liquid LQ, which is held in the space 173, flows through the flow passages 171 to the space 167. The liquid LQ, which inflows through the gap A formed between the edge of the surface Pa of the substrate P and the edge of the surface Ta of the plate member T, is recovered from the liquid recovery ports 161 formed in the space 167 via recovery ports 172 which are formed on the receiving surface Tg of the plate member T and which are connected to the upper ends of the flow passages 171.

In the embodiment shown in FIG. 11, the control unit CONT drives the first and second vacuum systems 40, 60 (not shown in FIG. 11) to provide the negative pressure in the first and second spaces 31, 32 during a predetermined period of time including the period in which the substrate P is exposed. Accordingly, the substrate P and the plate member T are attracted and held by the first and second holding portions PH1, PH2 respectively. In this embodiment, the control unit CONT stops the driving of the recovery vacuum system 160 during the exposure of the substrate P.

For example, when the liquid LQ inflows through the gap A during the liquid immersion exposure for the substrate P, the liquid LQ is pooled in the space 173. The control unit CONT exchanges the exposed substrate P with a new substrate P, after the completion of the exposure of the substrate P, as explained with reference to FIG. 6. The control unit CONT starts the driving of the recovery vacuum system 160 before separating the substrate P from the first support portions 46, and the gas in the space 167 is sucked through the liquid recovery ports 161. Accordingly, the space 167 is allowed to have the negative pressure. When the negative pressure is provided in the space 167, the liquid LQ, which is pooled in the space 173, flows into the flow passages 171 from the recovery ports 172 of the plate member T. Then, the liquid LQ flows toward the space 167. The liquid LQ, which is allowed to flow toward the space 167, is sucked and recovered through the liquid recovery ports 161 formed on the base member PHB in the space 167.

As described above, the liquid LQ, which inflows through the gap A, can be held by the plate member T. The liquid LQ can be recovered through the liquid recovery ports 172 formed in the plate member T at a predetermined timing, for example, during the exchange of the substrate P. The driving of the recovery vacuum system 160 is stopped during the exposure of the substrate P. Therefore, it is possible to suppress the fluctuation of the liquid immersion area AR2 during the exposure and the influence of the vibration on the exposure which would be otherwise caused by the driving of the recovery vacuum system 160.

It is also allowable that the driving of the recovery vacuum system 160 is continued during the exchange of the substrate P. However, when a new substrate P is placed on the substrate-holding portion PH1, it is desirable that the driving of the recovery vacuum system 160 is stopped in order to avoid, for example, any positional deviation of the substrate P caused, for example, by the vibration. It is also allowable that the recovery vacuum system 160 is driven during the exposure of the substrate P. However, in this case, it is appropriate to decrease the negative pressure in the space 167 so that no influence is exerted on the exposure accuracy and the liquid immersion area AR2 is not fluctuated.

Fourth Embodiment

Figure 12:
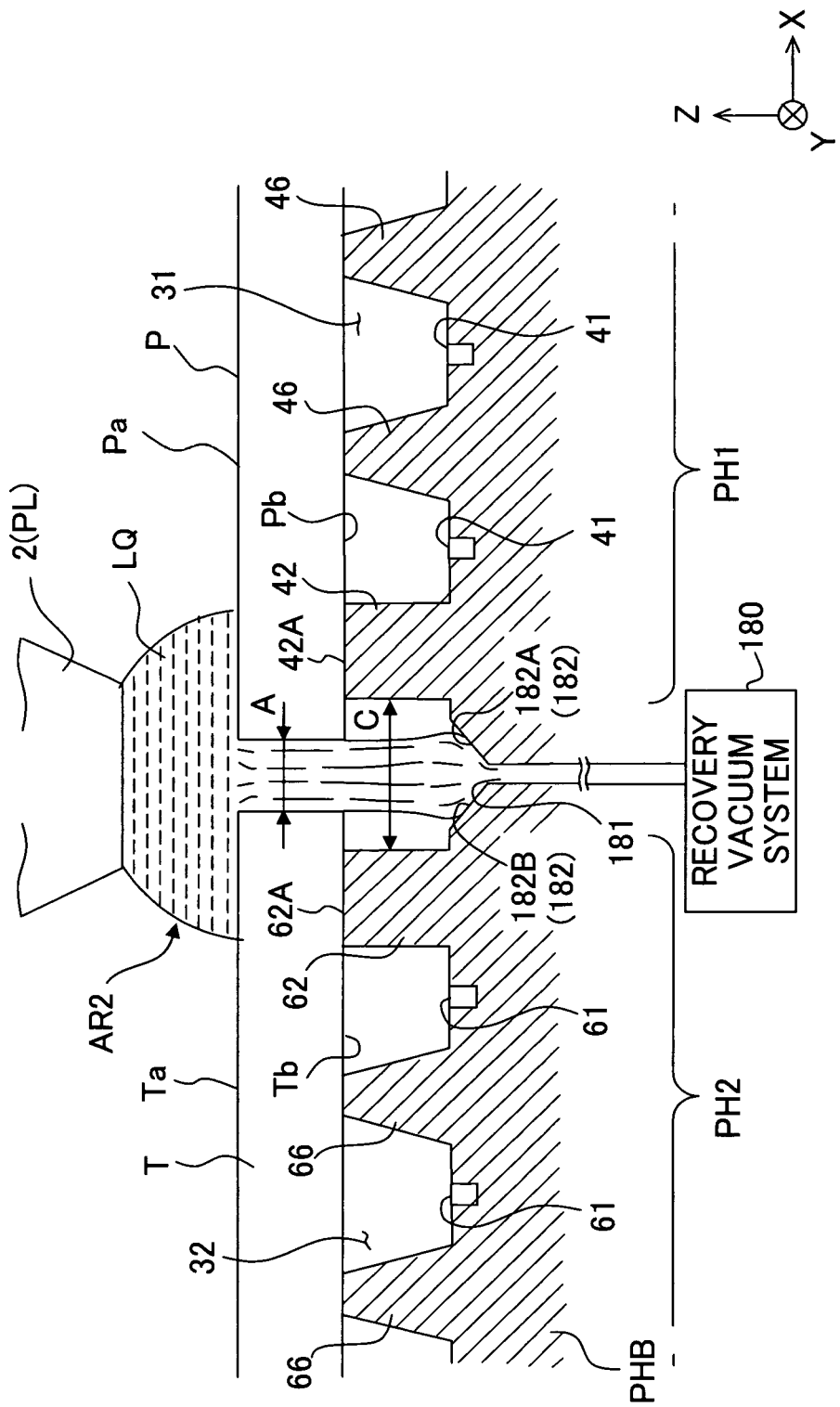
FIG. 12 shows another embodiment (fourth embodiment) of the substrate holder.

FIG. 12 shows a fourth embodiment. Constructions and modified embodiments, which are common to those of the first embodiment and the modified embodiments thereof, will be explained in a simplified manner or omitted from the explanation. With reference to FIG. 12, a liquid recovery port 181, which is provided to recover the liquid LQ inflowed through the gap A formed between the substrate P held by the first holding portion PH1 and the plate member T held by the second holding portion PH2, is provided on the base member PHB at a portion thereof outside the first space 31 and the second space 32. Specifically, the liquid recovery port 181 is provided on the upper surface of the base member PHB, at a portion between the first circumferential wall portion 42.of the first holding portion PH1 and the second circumferential wall portion 62 of the second holding portion PH2. The liquid recovery port 181 is provided at a position substantially opposite to or facing the gap A. The liquid recovery port 181 is formed as a plurality of liquid recovery ports 181 formed in a slit form and along the first circumferential wall portion 42 (second circumferential wall portion 62) as viewed in a plan view. The liquid recovery ports 181, which are formed for the base member PHB, are connected to a recovery vacuum system 180.

An inclined surface. 182 is formed on the upper surface of the base member PHB to collect, in the liquid recovery ports 181, the liquid LQ inflowed through the gap A formed between the substrate P held by the first holding portion PH1 and the plate member T held by the second holding portion PH2. The inclined surface 182 includes a first inclined surface 182A which is inclined downwardly from the first circumferential wall portion 42 toward the liquid recovery port 181, and a second inclined surface 182B which is inclined downwardly from the second circumferential wall portion 62 toward the liquid recovery port 181. In this embodiment, the upper surface 62A of the second circumferential wall portion 62 substantially makes tight contact with the back surface Tb of the plate member T.

In the embodiment shown in FIG. 12, the control unit CONT drives the first and second vacuum systems 40, 60 (not shown in FIG. 12) to provide the negative pressure in the first and second spaces 31, 32 during a predetermined period of time including the period in which the substrate P is exposed. Accordingly, the substrate P and the plate member T are attracted and held by the first and second holding portions PH1, PH2 respectively. In this procedure, the control unit CONT stops the driving of the recovery vacuum system 180 during the exposure of the substrate P.

Even when the liquid LQ inflows through the gap A during the liquid immersion exposure of the substrate P, for example, the liquid LQ, which inflows through the gap A, stays on the gap A, in the gap A, or in the space defined between the first circumferential wall portion 42 and the second circumferential wall portion 62 without making any inflow into the first space 31 on the side of the back surface Pb of the substrate P and the second space 32 on the side of the back surface Tb of the plate member T, because the substantially tight contact is brought about between the upper surface 42A of the first circumferential wall portion 42 and the back surface Pb of the substrate P and between the upper surface 62A of the second circumferential wall portion 62 and the back surface Tb of the plate member T, and because the upper surface 42A of the first circumferential wall portion 42 and the upper surface 62A of the second circumferential wall portion 62 are subjected to the liquid-repelling treatment respectively. The control unit CONT exchanges the exposed substrate P with a new substrate P after the completion of the exposure of the substrate P as explained with reference to FIG. 6. The control unit CONT starts the driving of the recovery vacuum system 180, before detaching the substrate P from the first support portions 46, to suck and recover the liquid LQ from the liquid recovery ports 181. The inclined surface 182 is formed on the base member PHB in order to collect the liquid LQ in the liquid recovery ports 181. Therefore, the liquid LQ is satisfactorily recovered through the liquid recovery ports 181.

The recovery vacuum system 180 stops the driving during the exposure of the substrate P. Therefore, it is possible to suppress the fluctuation of the liquid immersion area AR2 during the exposure and the influence of the vibration on the exposure caused by the driving of the recovery vacuum system 180.

When the gap C between the first circumferential wall portion 42 and the second circumferential wall portion 62 is made larger than the gap A between the side surface Pc of the substrate P and the side surface Tc of the plate member T, i.e., when the protruding widths of the substrate P and the plate member T from the circumferential wall portions 42, 62, respectively, are increased, then it is possible to more reliably avoid the inflow of the liquid LQ into the first space 31 on the side of the back surface Pb of the substrate P and the second space 32 on the side of the back surface Tb of the plate member T.

It is also allowable that the driving of the recovery vacuum system 180 is continued during the exchange of the substrate P. However, when a new substrate P is placed on the substrate-holding portion PH1, it is desirable to stop the driving of the recovery vacuum system 180 in order to avoid, for example, any positional deviation of the substrate P caused, for example, by the vibration.

It is also allowable that the recovery vacuum system 180 is driven during the exposure of the substrate P. However, in such a case, it is appropriate to decrease the suction force brought about by the recovery vacuum system 180 so that the exposure accuracy is not deteriorated and the liquid immersion area AR2 is not fluctuated.

In this embodiment, the upper surface 62A of the second circumferential wall portion 62 and the back surface Tb of the plate member T substantially make tight contact with each other. However, it is also allowable that a minute gap B is formed. In this case, it is desirable that the liquid LQ, which inflows into the inside of the second circumferential wall portion 62, is recovered as described in the first and second embodiments.

Fifth Embodiment

Figure 13:
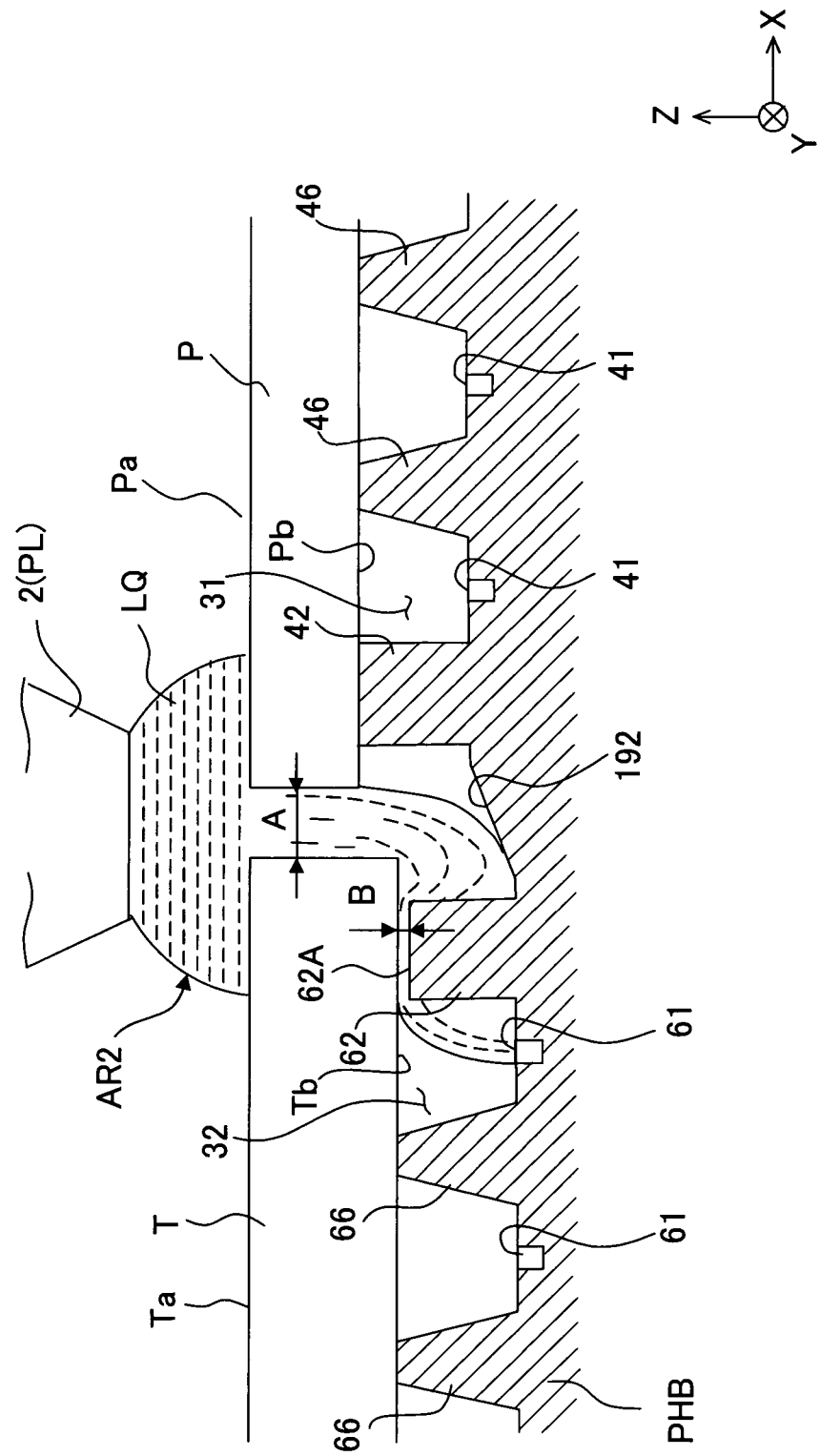
FIG. 13 shows another embodiment (fifth embodiment) of the substrate holder.

FIG. 13 shows a fifth embodiment of the present invention. The fifth embodiment is a modified embodiment of the first embodiment. Portions or parts, which are common to those of the first embodiment, will be explained in a simplified manner or omitted from the explanation. With reference to FIG. 13, the liquid recovery ports, which are provided to recover the liquid LQ inflowed through the gap A, are also used as the second suction ports 61 formed inside the second space 32 in order to attract and hold the plate member T in the same manner as in the embodiment shown in FIG. 9. An inclined surface 192, which is inclined downwardly from the first circumferential wall portion 42 (first space 31) toward the second circumferential wall portion 62 (second space 32), is formed on the upper surface of the base member PHB at a portion thereof outside the first space 31 and the second space 32. The inclined surface 192 is formed at a position substantially opposite to or facing the gap A. The inclined surface 192 functions to collect the liquid LQ, inflowed through the gap A, toward the side of the second circumferential wall portion 62.

The liquid LQ, which inflows through the gap A, for example, during the exposure of the substrate P, flows into the second space 32 via the gap B and the space between the first circumferential wall portion 42 and the second circumferential wall portion 62, and the liquid LQ is sucked and recovered from the second suction ports 61. The inclined surface 192 is formed on the upper surface of the base member PHB at a portion thereof between the first circumferential wall portion 42 and the second circumferential wall portion 62. Therefore, the liquid LQ can be gathered toward the second circumferential wall portion 62. Therefore, the liquid LQ, which inflows through the gap A, can be satisfactorily sucked and recovered from the second suction ports 61.

Also in the embodiment shown in FIG. 13, the intermediate circumferential wall portion 162 may be arranged as in the second embodiment. The flow passage for recovering the liquid LQ can be also provided between the first circumferential wall portion 42 and the second circumferential wall portion 62 as in the fourth embodiment shown in FIG. 12.

In the embodiment described above, the upper surface and the side surface of the second circumferential wall portion 62 are liquid-repellent. However, when the inflow of the liquid LQ into the back surface side of the plate member T is permitted, there is no need to make the upper surface and the side surface of the second circumferential wall portion 62 to be liquid-repellent. On the contrary, the upper surface and the side surface of the second circumferential wall portion 62 may be made liquid-attractive or lyophilic. In this case, it is also allowable to provide, for example, a recovery port for recovering the liquid LQ on a side of the back surface of the plate member T.

In the embodiment described above, the plate member T is formed with one plate-shaped member. However, the upper surface of the substrate stage PST may be formed with a plurality of plate members. Further, the function to adjust the position (height) and/or the inclination of the plate member T in the Z axis direction may be added to the second holding portion PH2 so that the surface Ta of the plate member T is substantially flush with the surface Pa of the substrate P.

Sixth Embodiment

Next, an explanation will be made about another embodiment of the substrate stage PST (substrate holder PH), especially about a modification of the first embodiment. In the following explanation, the constitutive components, which are the same as or equivalent to those of the embodiments described above, are designated by the same reference numerals, any explanation of which will be simplified or omitted.

Figure 14:
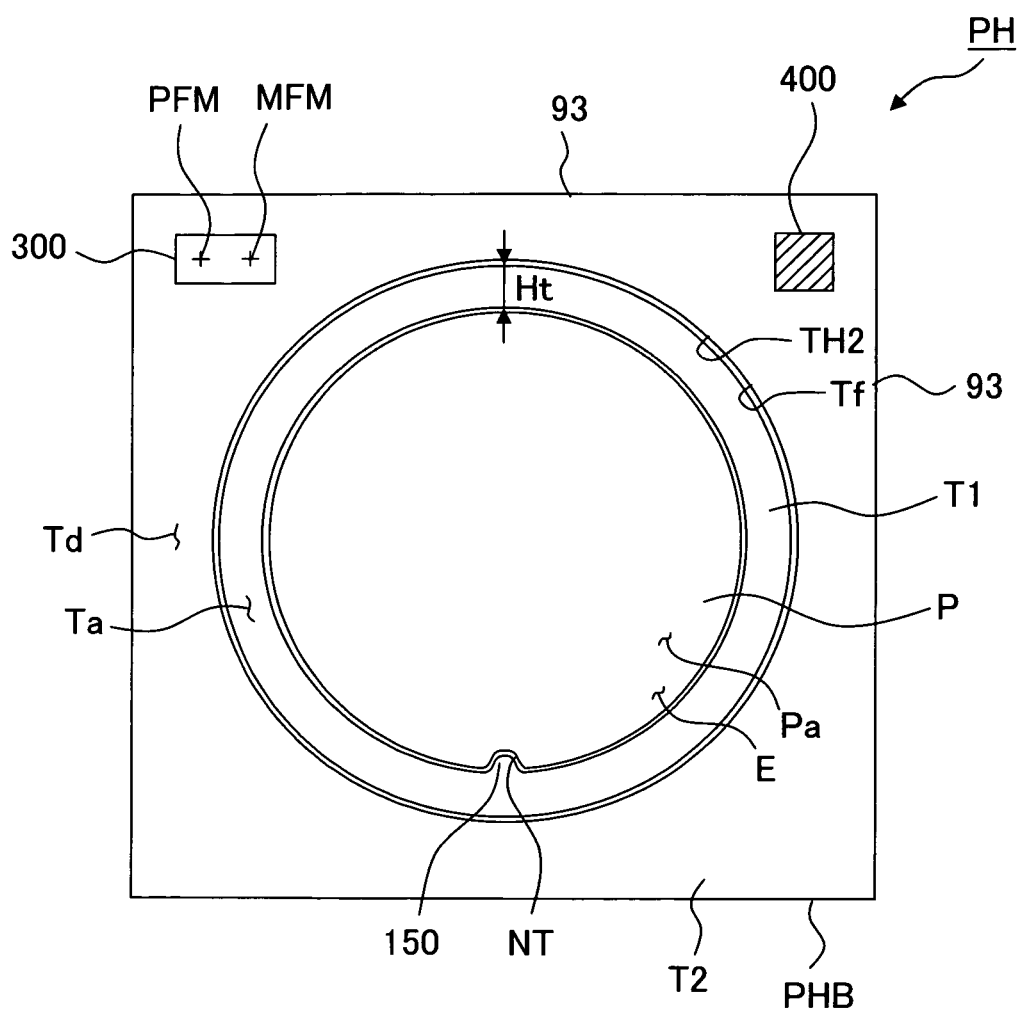
FIG. 14 shows another embodiment (sixth embodiment) of the substrate holder.
Figure 15:
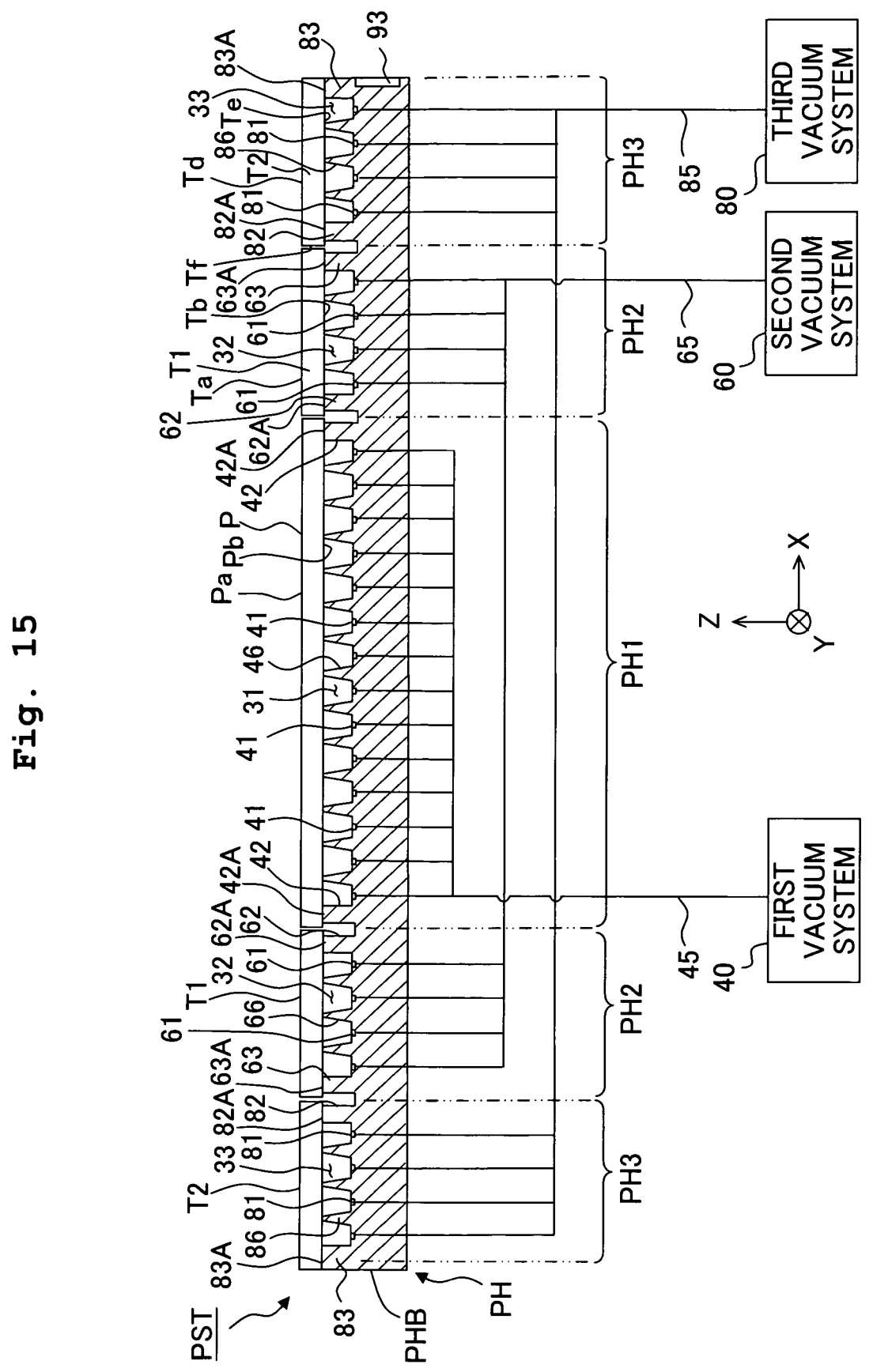

FIG. 14 shows a plan view illustrating a substrate stage PST of this embodiment. FIG. 15 shows a side sectional view illustrating the substrate stage PST (substrate holder PH). With reference to FIGS. 14 and 15, the substrate holder PH includes a base member PHB, a first holding portion PH1 which is formed in the base member PHB and which attracts and holds the substrate P, a second holding portion PH2 which is formed in the base member PHB and which attracts and holds a first plate member T1 in the vicinity of the substrate P attracted and held by the first holding portion PH1, and a third holding portion PH3 which is formed in the base member PHB and which attracts and holds a second plate member T2 in the vicinity of the substrate P attracted and held by the first holding portion PH1. The first plate member T1 and the second plate member T2 are distinct or separate from the base member PHB. The first plate member T1 and the second plate member T2 are provided detachably with respect to the base member PHB of the substrate holder PH, and are exchangeable.

The first plate member T1 is arranged in the vicinity of the substrate P held by the first holding portion PH1. The surface Ta of the first plate member T1 held by the second holding portion PH2 is arranged in the vicinity of the surface Pa of the substrate P held by the first holding portion PH1. A surface Ta and a back surface Tb of the first plate member T1 are flat surfaces (flat portions). The surface Td and the back surface Te of the second plate member T2 are also flat surfaces (flat portions).

As shown in FIG. 14, the first plate member T1 is a substantially annular member, and is arranged to surround the substrate P held by the first holding portion PH1. The surface Ta of the first plate member T1 held by the second holding portion PH2 is arranged around the substrate P held by the first holding portion PH1, and is formed to surround the substrate P. That is, the first plate member T1 forms the flat surface Ta around the substrate P held by the first holding portion PH1.

As shown in FIG. 14, the outer shape of the second plate member T2 is formed to be rectangular as viewed in a plan view to extend along the shape of the base member PHB. The second plate member T2 has a substantially circular hole TH2 formed at a central portion thereof to make it possible to arrange the substrate P and the first plate member T1 in the hole TH2. That is, the second plate member T2 is a substantially annular member. The second plate member T2 is arranged around the substrate P held by the first holding portion PH1 and the first plate member T1 held by the second holding portion PH2, and is arranged to surround the substrate P and the first plate member T1. The second plate member T2, which is held by the third holding portion PH3, forms the flat surface Td at the outside of the first plate member T1 with respect to the substrate P held by the first holding portion PH1.

Each of the first plate member T1 and the second plate member T2 has a thickness which is approximately same as that of the substrate P. The surface (flat surface) Ta of the first plate member T1 held by the second holding portion PH2, the surface (flat surface) Td of the second plate member T2 held by the third holding portion PH3, and the surface Pa of the substrate P held by the first holding portion PH1 are substantially flush with one another. That is, the surface of the first plate member T1 and the surface of the second plate member T2 form the flat portion which is substantially flush with the surface of the substrate P around the substrate P.

The surface Ta of the first plate member T1 and the surface Td of the second plate member T2 are liquid-repellent with respect to the liquid LQ. Further, the back surface Tb of the first plate member T1 and the back surface Te of the second plate member T2 are also liquid-repellent with respect to the liquid LQ.

The base member PHB of the substrate holder PH is formed to be rectangular as viewed in a plan view. Movement mirrors 93 for laser interferometers 94 for measuring the position of the base member PHB (substrate holder PH) are formed on two mutually perpendicular side surfaces of the base member PHB of the substrate holder PH. That is, also in this embodiment, the upper surface of the substrate stage PST is formed so that the flat surface (full flat surface) is provided approximately entirely in a region including the surface Pa of the held substrate P when the substrate P is held.

As shown in FIG. 15, the first holding portion PH1 of the substrate holder PH includes a first convex support portion 46 which is formed on the base member PHB, an annular first circumferential wall portion 42 which is formed on the base member PHB to surround the circumference of the first support portions 46, and a first suction port 41 which is formed on the base member PHB at the inside of the first circumferential wall portion 42. The first support portion 46 and the first suction port 41 are formed as a plurality of first support portions 46 and a plurality of first suction ports 41, respectively, and uniformly at the inside of the first circumferential wall portion 42 respectively. The upper surface 42A of the first circumferential wall portion 42 is opposite to or facing the back surface Pb of the substrate P. The first suction ports 41 are connected to a first vacuum system 40 via flow passages 45 respectively. The control unit CONT drives the first vacuum system 40 to attract and hold the substrate P on the first support portions 46 by providing the negative pressure in the first space 31 by sucking the gas (air) present in the first space 31 surrounded by the base member PHB, the first circumferential wall portion 42, and the substrate P.

The second holding portion PH2 of the substrate holder PH includes a substantially annular second circumferential wall portion 62 which is formed on the base member PHB to surround the first circumferential wall portion 42 of the first holding portion PH1, an annular third circumferential wall portion 63 which is provided outside the second circumferential wall portion 62 and which is formed on the base member PHB to surround the second circumferential wall portion 62, a second convex support portion 66 which is formed on the base member PHB between the second circumferential wall portion 62 and the third circumferential wall portion 63, and a second suction port 61 which is formed on the base member PHB between the second circumferential wall portion 62 and the third circumferential wall portion 63. The second circumferential wall portion 62 is provided outside the first circumferential wall portion 42 with respect to the first space 31. The third circumferential wall portion 63 is provided further outside the second circumferential wall portion 62. The second support portion 66 and the second suction port 61 are formed as a plurality of second support portions 66 and a plurality of second suction ports 61, respectively, and uniformly between the second circumferential wall portion 62 and the third circumferential wall portion 63 respectively. The upper surface 62A of the second circumferential wall portion 62 and the upper surface 63A of the third circumferential wall portion 63 are opposite to or facing the back surface Tb of the first plate member T1. The second suction ports 61 are connected to a second vacuum system 60 via flow passages 65 respectively. The control unit CONT drives the second vacuum system 60 to attract and hold the first plate member T1 on the second support portions 66 by providing the negative pressure in the second space 32 by sucking the gas (air) present in the second space 32 surrounded by the base member PHB, the second and third circumferential wall portions 62, 63, and the first plate member T1.

The third holding portion PH3 of the substrate holder PH includes a substantially annular fourth circumferential wall portion 82 which is formed on the base member PHB to surround the third circumferential wall portion 63 of the second holding portion PH2, an annular fifth circumferential wall portion 83 which is provided outside the fourth circumferential wall portion 82 and which is formed on the base member PHB to surround the fourth circumferential wall portion 82, a third convex support portion 86 which is formed on the base member PHB between the fourth circumferential wall portion 82 and the fifth circumferential wall portion 83, and a third suction port 81 which is formed on the base member PHB between the fourth circumferential wall portion 82 and the fifth circumferential wall portion 83. The fourth circumferential wall portion 82 is provided outside the third circumferential wall portion 63 with respect to the second space 32. The fifth circumferential wall portion 83 is provided further outside the fourth circumferential wall portion 82. The third support portion 86 and the third suction port 81 are formed as a plurality of third support portions 86 and a plurality of third suction ports 81, respectively, and uniformly between the fourth circumferential wall portion 82 and the fifth circumferential wall portion 83 respectively. The upper surface 82A of the fourth circumferential wall portion 82 and the upper surface 83A of the fifth circumferential wall portion 83 are opposite to or facing the back surface Te of the second plate member T2. The third suction ports 81 are connected to a third vacuum system 80 via flow passages 85 respectively. The third vacuum system 80 is provided to provide or generate the negative pressure in a third space 33 surrounded by the base member PHB, the fourth and fifth circumferential wall portions 82, 83, and the second plate member T2. The fourth and fifth circumferential wall portions 82, 83 function as an outer wall portions to surround the outer side of the third space 33 including the third support portions 86. The control unit CONT drives the third vacuum system 80 to attract and hold the second plate member T2 on the third support portions 86 by providing the negative pressure in the third space 33 by sucking the gas (air) present in the third space 33 surrounded by the base member PHB, the fourth and fifth circumferential wall portions 82, 83, and the second plate member T2.

The first vacuum system 40 for providing the negative pressure in the first space 31, the second vacuum system 60 for providing the negative pressure in the second space 32, and the third vacuum system 80 for providing the negative pressure in the third space 33 are independent from one another. The control unit CONT is capable of individually controlling the respective operations of the first vacuum system 40, the second vacuum system 60, and the third vacuum system 80. The control unit CONT is capable of independently performing the suction operation for the first space 31 by the first vacuum system 40, the suction operation for the second space 32 by the second vacuum system 60, and the suction operation for the third space 33 by the third vacuum system 80 respectively. For example, the control unit CONT controls the first vacuum system 40, the second vacuum system 60, and the third vacuum system 80 respectively so that the pressure in the first space 31, the pressure in the second space 32, and the pressure in the third space 33 may be different from one another.

In this embodiment, for example, a gap of about 0.1 to 1.0 mm is formed between the outer edge portion of the substrate P held by the first holding portion PH1 and the inner edge portion of the first plate member T1 provided around the substrate P. A predetermined gap, for example, a gap of about 0.1 to 1.0 mm is also formed between the outer edge portion of the first plate member T1 held by the second holding portion PH2 and the inner edge portion of the second plate member T2 provided around the first plate member T1.

A projection 150, which is adapted to the notch portion NT (or the orientation flat portion) formed for the substrate P, is formed for the first plate member T1 arranged around the substrate P in the same manner as in the embodiment described above. The first circumferential wall portion 42 and the second circumferential wall portion 62 also have shapes adapted to the notch portion NT of the substrate P.

The upper surface 42A of the first circumferential wall portion 42, the upper surface 62A of the second circumferential wall portion 62, and the upper surface 63A of the third circumferential wall portion 63 are flat surfaces in the same manner as in the embodiment described above. Further, the upper surface 82A of the fourth circumferential wall portion 82 and the upper surface 83A of the fifth circumferential wall portion 83 are also flat surfaces respectively.

The first support portion 46, which is included in the first holding portion PH1, is formed to have the same height as that of the first circumferential wall portion 42, or the first support portion 46 is formed to be slightly higher than the first circumferential wall portion 42. When the first space 31 is allowed to have the negative pressure, it is possible to make tight contact between the back surface Pb of the substrate P and the upper surface 42A of the first circumferential wall portion 42. The second support portion 66, which is included in the second holding portion PH2, is formed to be slightly higher than the second circumferential wall portion 62. Even when the second space 32 is allowed to have the negative pressure, the predetermined gap B is formed between the back surface Tb of the first plate member T1 and the upper surface 62A of the second circumferential wall portion 62. The third circumferential wall portion 63 is formed to be slightly lower than the second support portion 66, or the third circumferential wall portion 63 is formed to have an approximately same height as that of the second support portion 66. The upper surface 63A of the third circumferential wall portion 63 and the back surface Tb of the first plate member T1 make tight contact with each other.

The height of the second support portion 66 and the height of the second circumferential wall portion 62 can be determined so that the back surface Tb of the first plate member T1 and the upper surface 62A of the second circumferential wall portion 62 make tight contact with each other. The height of the second support portion 66 and the height of the third circumferential wall portion 63 can be also determined so that a small gap is formed between the back surface Tb of the first plate member T1 and the upper surface 63A of the third circumferential wall portion 63.

The fourth support portion 86, which is included in the third holding portion PH3, is formed to be slightly higher than the fourth circumferential wall portion 82 and the fifth circumferential wall portion 83, or the fourth support portion 86 is formed to have an approximately same height as that of the fourth circumferential wall portion 82 and the fifth circumferential wall portion 83. The upper surface 82A of the fourth circumferential wall portion 82, the upper surface 83A of the fifth circumferential wall portion 83, and the back surface Te of the second plate member T2 make tight contact with one another. A predetermined gap may be formed between the back surface Te of the second plate member T2 and the upper surface 82A of the fourth circumferential wall portion 82 and between the back surface Te and the upper surface 83A of the fifth circumferential wall portion 83.

In this embodiment, the first plate member T1 and the second plate member T2 are formed of different materials. The durability performance of the liquid repellence of the surface Ta of the first plate member T1 is higher than the durability performance of the liquid repellence of the surface Td of the second plate member T2.

In this embodiment, the first plate member T1, which is arranged around the substrate P, is formed of, for example, a fluorine-based resin material such as PTFE (polytetrafluoroethylene). On the other hand, the second plate member T2 is formed of silica glass (glass). The surface Td, the back surface Te, and the side surface Tf (surface opposite to or facing the first plate member T1) are coated with a liquid-repellent material. The liquid-repellent material includes, for example, fluorine-based resin materials such as polytetrafluoroethylene, acrylic resin materials, and the like in the same manner as described above. The plate member T composed of silica glass is coated with the liquid-repellent material as described above. Accordingly, the surface Td, the back surface Te, and the side surface Tf of the second plate member T2 are liquid-repellent with respect to the liquid LQ respectively.

As shown in FIG. 14, a reference portion 300, which is provided with reference marks MFM, PFM for defining the position of the substrate P with respect to the image of the pattern of the mask M to be formed via the projection optical system PL, is provided at a predetermined position on the surface Ta of the second plate member T2. A reference plate 400, which is used as the reference surface for the focus/leveling-detecting system, is provided at a predetermined position on the surface Td of the second plate member T2. The upper surface of the reference portion 300 and the upper surface of the reference plate 400 are substantially flush with the surface Pa of the substrate P held by the first holding portion PH1. The reference plate 400 and the reference portion 300 having the reference marks MFM, PFM are also coated with the liquid-repellent material. The upper surface of the reference portion 300 and the upper surface of the reference plate 400 are also liquid-repellent.

A width Ht of the annularly formed surface Ta of the first plate member T1 is formed to be larger than at least the projection area AR1. Accordingly, when the edge area E of the substrate P is subjected to the exposure, the exposure light beam EL is not radiated onto the second plate member T2. Accordingly, it is possible to suppress the deterioration of the liquid repellence of the surface Td of the second plate member T2. The material itself for forming the first plate member T1 to be irradiated with the exposure light beam EL is the liquid-repellent material (for example, PTFE). The durability performance of the liquid repellence of the surface Ta of the first plate member T1 is higher than the durability performance of the liquid repellence of the surface Td of the second plate member T2. Therefore, even when the exposure light beam EL is radiated, the liquid repellence is not deteriorated in the surface Td of the second plate member T2 to a great extent, thereby making it possible to maintain the liquid repellence for a long period of time. Although it is also conceivable that the second plate member T2 is formed of, for example, PTFE without forming the second plate member T2 of silica glass, the material for forming the second plate member T2 is preferably silica glass in order to form the reference marks MFM, PFM on the second plate member T2. When the reference marks MFM, PFM are formed on the surface Td of the second plate member T2, the upper surface of the substrate stage PST can be made to be the full flat surface. Accordingly, in this embodiment, the full flat surface having the liquid repellence is formed such that the second plate member T2, which is in the area not irradiated with the exposure light beam EL, is formed of silica glass, the reference marks MFM, PFM are formed on the surface Td; and the second plate member T2 formed with the reference marks MFM, PFM is coated with the liquid-repellent material. It is also allowable that only one of the reference mark MFM and the reference mark PFM is formed on the second plate member.

It is preferable that the width Ht of the surface Ta of the first plate member T1 is formed to be larger than the liquid immersion area AR2 formed on the side of the image plane of the projection optical system PL. Accordingly, when the edge area E of the substrate P is subjected to the liquid immersion exposure, then the liquid immersion area AR2 is arranged on the surface Ta of the first plate member T1, and the liquid immersion area AR2 is not arranged on the second plate member T2. Therefore, it is possible to avoid the inconvenience which would be otherwise caused such that the liquid LQ of the liquid immersion area AR2 inflows into the gap between the first plate member T1 and the second plate member T2.

When the first plate member T1 is exchanged, the second lifting member 57, provided at a position below or lower than the first plate member T1, is used to move the first plate member T1 upwardly and downwardly in the same manner as in the first embodiment. Although not shown, a lifting member is also provided at a position below or lower than the second plate member T2. When the second plate member T2 is exchanged, the second plate member T2 is moved upwardly and downwardly by using the lifting member. The second vacuum system 40 for attracting and holding the first plate member T1 and the third vacuum system 60 for attracting and holding the second plate member T2 are independent from each other. Therefore, it is possible to mutually independently perform the operation to attract and hold the first plate member T1 and release the first plate member T1 from being attracted and held and the operation to attract and hold the second plate member T2 and release the second plate member T2 from being attracted and held. Therefore, for example, the control unit CONT can execute the exchange of the first plate member T1 and the exchange of the second plate member T2 at different timings depending on the levels of the deterioration of liquid repellence of the first plate member T1 and the second plate member T2 respectively.

Also in this embodiment, the upper surface 42A of the first circumferential wall portion 42, the upper surface 46A of the first support portion 46, the upper surface 66A of the second support portion 66, the upper surface 62A of the second circumferential wall portion 62, the upper surface 63A of the third circumferential wall portion 63, the upper surface 86A of the third support portion 86, the upper surface 82A of the fourth circumferential wall portion 82, and the upper surface 83A of the fifth circumferential wall portion 83 have approximately the same height, although they are slightly different from each other in height. Therefore, the operability is satisfactory when the upper surfaces are subjected to, for example, the polishing treatment.

In this embodiment, the first plate member T1, which is composed of, for example, PTFE, is formed to be annular, and is arranged to surround the circumference of the substrate P. The second plate member T2, which is composed of silica glass, is formed to be annular, and is arranged to surround the first plate member T1 at the outside of the first plate member T1. However, for example, only a small area, which includes the reference portion 300 having the reference marks MFM, PFM, may be formed with the second plate composed of silica glass, and a substantial part of the area other than this small area may be formed with the first plate member composed of, for example, PTFE. In principle, it is desirable that the area of the upper surface, which is irradiated with the exposure light beam EL, is formed with the plate member composed of the liquid-repellent material including, for example, PTFE, and that the area, which includes the reference portion 300, is formed with the plate member composed of silica glass.

This embodiment has been explained as exemplified by the case using the liquid immersion exposure apparatus for projecting the image of the pattern of the mask M onto the substrate P through the liquid LQ, as an example. However, this embodiment is also applicable to a general dry exposure apparatus in which the image of the pattern of the mask M is projected onto the substrate P not through the liquid LQ. The first and second plate members T1, T2, which form the upper surface of the substrate stage PST, are attracted and held by the second and third holding portions PH2, PH3 respectively, and they are detachable (exchangeable) with respect to the base member PHB. Therefore, the plate member can be exchanged with a new plate member when it is intended to exchange the plate member, for example, due to the pollution and/or the adhesion of any foreign matter (impurity) onto the plate member.

The arrangement, in which the first plate and the second plate are used as in the sixth embodiment, is applicable to the second to fifth embodiments. The sixth embodiment, explained with reference to FIG. 14, is constructed such that the substrate holder PH has the two plate members, namely the first plate member and the second plate member. However, it is also allowable to adopt an arrangement in which the plate members are provided in an arbitrary number of not less than three. In this case, attracting-holding portions corresponding to the number of the plate members are provided on the base member PHB. In the construction in which the plurality of plate members are attracted and held with respect to the base member PHB, it is enough that only a predetermined plate member, which is included in the plurality of plate members and which requires the exchange, is exchanged.

The materials of the respective plates are not limited to those described above as well. It is appropriate to determine the optimum material while considering, for example, the presence or absence of the reference portion and the durability of the liquid-repelling performance.

In the embodiment described above, the upper surface and the side surface of the second circumferential wall portion 62 are liquid-repellent. However, when the liquid LQ is permitted to make inflow into the side of the back surface of the plate member T (T1, T2), there is no need that the upper surface and the side surface of the second circumferential wall portion 62 are liquid-repellent. On the contrary, it is also allowable that the upper surface and the side surface of the second circumferential wall portion 62 are liquid-attractive. In this case, it is also allowable to provide, for example, a recovery port for recovering the liquid LQ on the side the back surface of the plate member T (T1, T2).

In the sixth embodiment, the second to fifth circumferential wall portions are formed annularly to surround the first circumferential wall portion 42. However, it is possible to adopt various forms for the position and the shape of the second to fifth circumferential wall portions provided that the plate member T (T1, T2) can be attracted and held. In principle, it is enough that circumferential wall portion is formed so that the closed space (negative pressure space) for attracting and holding the plate member T (T1, T2) is formed between the base member PHB and the back surface of the plate member T (T1, T2). For example, it is also allowable to provide the circumferential wall portion so that a plurality of closes spaces (negative pressure spaces) are formed between one plate member T (T1, T2) and the base member PHB.

In the embodiment described above, the thickness of the plate member T (T1, T2) is approximately same as the thickness of the substrate P. However, the thickness of the plate member T (T1, T2) may be different from the thickness of the substrate P. In this case, it is desirable that the height of the support portion 66 (86) for the plate member T (T1, T2) or the height of the support portion 46 for the substrate P is set so that the surface of the substrate P attracted and held by the substrate holder PH is substantially flush with the surface of the plate member T (T1, T2).

In the embodiment described above, the plate member T, T1, T2 is held by the base member PHB in a vacuum attraction manner. However, it is also possible to use other holding mechanisms including, for example, an electrostatic chuck mechanism, an electromagnetic chuck mechanism, and a magnet chuck mechanism.

In each of the embodiments described above, the exposure apparatus EX is constructed to have one substrate stage PST. However, the present invention is also applicable to an exposure apparatus provided with two stages. This feature will be explained with reference to FIG. 16.

Figure 16:
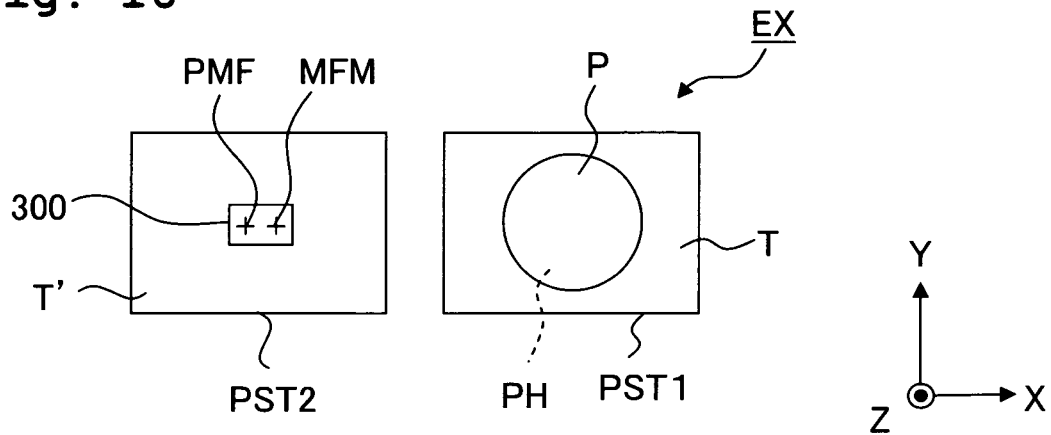
FIG. 16 schematically shows another embodiment of the exposure apparatus.

The exposure apparatus EX shown in FIG. 16 includes a substrate stage PST1 which has a substrate holder PH for holding the substrate P and which is movable in a state in which the substrate P is held thereon, and a measuring stage PST2 which is provided at a position aligned with the substrate stage PST1 and which is provided with the reference portion 300 as described above. The plate member T is attracted and held on the substrate holder PH disposed on the substrate stage PST1. On the other hand, the measuring stage PST2 is used exclusively for the measurement, and is the stage that does not hold the substrate P. The measuring stage PST2 is provided with a holding portion which attracts and holds a plate member T' having the reference portion 300. The plate member T', which has the reference portion 300, is attracted and held by the holding portion on the measuring stage PST. Although not shown, the measuring stage PST2 is provided with an optical sensor including, for example, an uneven illuminance sensor as described above. The substrate stage PST1 and the measuring stage PST2 are two-dimensionally movable mutually independently in the XY plane by a stage-driving unit including a linear motor and the like. Positions of the substrate stage PST1 and the measuring stage PST2 in the XY directions are measured by laser interferometers.

In the embodiment shown in FIG. 16, the liquid immersion area AR2 of the liquid LQ is formed on both of the substrate stage PST1 and the measuring stage PST2. Therefore, there is such a possibility that any foreign matter may be adhered to the upper surface of the plate member T disposed on the substrate stage PST1 and the upper surface of the plate member T' disposed on the measuring stage PST2, and/or any adhesion trace (water mark) of the liquid LQ may be formed. However, also in the embodiment shown in FIG. 16, it is possible to exchange the respective plate members T, T' of the substrate stage PST1 and the measuring stage PST2.

The present invention is also applicable to an exposure apparatus of the twin-stage type provided with two substrate stages for holding the substrate. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

The mechanism for forming the liquid immersion area AR2 on the side of the image plane of the projection optical system PL is not limited to those of the embodiments described above. It is possible to use mechanisms having various forms. For example, it is also possible to use a mechanism disclosed in European Patent Publication EP 1420298 (A2).

As described above, in the embodiment of the present invention, pure water is used as the liquid LQ. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also appropriate that the exposure apparatus is provided with an ultrapure water-producing unit.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE-polarized component), i.e., the component in the polarization direction along the longitudinal direction of the line pattern outgoes from the pattern of the mask (reticle). When the space between the projection optical system PL and the resist coated on the surface of the substrate P is filled with the liquid, the diffracted light of the S-polarized component (TE-polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is limited to one predetermined direction or when the hole pattern is clustered in one predetermined direction. For example, when a phase shift mask of the half tone type having a transmittance of 6% (pattern having a half pitch of about 45 nm) is illuminated by using the linear polarized illumination method and the dipole illumination method in combination, then the depth of focus (DOF) can be increased by about 150 nm as compared with the case using the random polarized light provided that the illumination σ, which is defined by a circumscribed circle of two light fluxes forming a dipole on the pupil plane of the illumination system is 0.95, the radii of the respective light fluxes at the pupil plane are 0.125σ, and the numerical aperture of the projection optical system PL is NA=1.2.

Further, for example, when the ArF excimer laser beam is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate due to the Wave Guide effect depending on the structure of the mask M (for example, the pattern fineness and the chromium thickness), and a large amount of the diffracted light beam of the S-polarized component (TE-polarized component) is radiated from the mask M as compared with the diffracted light beam of the P-polarized component (TM-component) which lowers the contrast. In such a case, it is desirable that the linear polarized illumination is used as described above. However, the high resolution performance can be obtained even when the numerical aperture NA of the projection optical system PL is large, for example, 0.9 to 1.3 even when the mask M is illuminated with the random polarized light beam.

When the substrate P is exposed with an extremely fine line-and-space pattern on the mask M, there is also such a possibility that the P-polarized component (TM-polarized component) may be larger than the S-polarized component (TE-polarized component) due to the Wire Grid effect. However, for example, when the ArF excimer laser beam is used as the exposure light beam, and the substrate P is exposed with a line-and-space pattern larger than 25 nm by using the projection optical system PL having a reduction magnification of about ¼, then a large amount of the diffracted light beam of the S-polarized component (TE-polarized component) is radiated from the mask M as compared with the diffracted light beam of the P-polarized component (TM-polarized component). Therefore, the high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis, as disclosed in Japanese Patent Application Laid-open No. 6-53120 as well as the linear polarized illumination (S-polarized illumination) adjusted to the longitudinal direction of the line pattern of the mask (reticle). In particular, when the pattern of the mask (reticle) includes not only the line pattern which extends in one predetermined direction but the pattern also includes line patterns which extend in a plurality of different directions in a mixed manner (the pattern also includes line-and-space patterns having different periodic directions in a mixed manner), then the high image formation performance can be obtained even when the numerical aperture NA of the projection optical system is large, by using, in combination, the zonal illumination method and the polarized illumination method in which the linear polarization is effected in a tangential direction of a circle having a center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: ¾) and the polarized illumination method in which the linear polarization is effected in the tangential direction of the circle about the center of the optical axis, then the depth of focus (DOF) can be increased by about 250 nm as compared with the case using the random polarized light provided that the illumination σ is 0.95, and the numerical aperture of the projection optical system PL is NA=1.00. When the pattern has a half pitch of about 55 nm, and the numerical aperture of the projection optical system is NA=1.2, then the depth of focus can be increased by about 100 nm.

In the embodiment of the present invention, the optical element 2 is attached to the end portion of the projection optical system PL. The lens can be used to adjust the optical characteristics of the projection optical system PL, including, for example, the aberration (for example, spherical aberration and coma aberration). The optical element, which is attached to the end portion of the projection optical system PL, may be an optical plate to be used to adjust the optical characteristic of the projection optical system PL. Alternatively, the optical element may be a plane-parallel through which the exposure light beam EL is transmissive.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, instead of allowing the optical element to be exchangeable.

The embodiment of the present invention is constructed such that the space between the projection optical system PL and the surface of the substrate P is filled with the liquid LQ. However, for example, another arrangement may be adopted such that the space is filled with the liquid LQ in a state in which a cover glass formed of a plane-parallel is attached to the surface of the substrate P. In this case, a part of the surface of the plate may be covered with the cover glass.

The liquid LQ is water in the embodiment of the present invention. However, the liquid LQ may be a liquid other than water. For example, when the light source of the exposure light beam EL is the $F_2$ laser, the $F_2$ laser beam is not transmitted through water. Therefore, in this case, liquids preferably usable as the liquid LQ may include, for example, a fluorine-based fluid such as fluorine-based oil and perfluoropolyether (PFPE) through which the $F_2$ laser beam is transmissive. In this case, the portion which makes contact with the liquid LQ is subjected to the liquid-attracting treatment by forming a thin film, for example, with a substance having a molecular structure of small polarity including fluorine. Alternatively, other than the above, it is also possible to use, as the liquid LQ, liquids (for example, cedar oil) which have the transmittance with respect to the exposure light beam EL, which have the refractive index as high as possible, and which are stable with respect to the photoresist coated on the surface of the substrate P and the projection optical system PL. Also in this case, the surface treatment is performed depending on the polarity of the liquid LQ to be used. It is also possible to use various fluids having desired refractive indexes, for example, a supercritical fluid or a gas having a high refractive index, in place of pure water for the liquid LQ.

The substrate P, which is usable in the respective embodiments described above, is not limited to the semiconductor wafer for producing the semiconductor device. Those applicable include, for example, a glass substrate for the display device, a ceramic wafer for the thin film magnetic head, and a master plate (synthetic silica glass, silicon wafer) for a mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus of such a system that the substrate P is subjected to the full field exposure with a reduction image of a first pattern in a state in which the first pattern and the substrate P are allowed to substantially stand still by using a projection optical system (for example, a dioptric type projection optical system having a reduction magnification of ⅛ and including no catoptric element). In this case, the present invention is also applicable to the full field exposure apparatus based on the stitch system in which the substrate P is thereafter subjected to the full field exposure with a reduction image of a second pattern while being partially overlaid with the first pattern in a state in which the second pattern and the substrate P are allowed to substantially stand still by using the projection optical system. As for the exposure apparatus based on the stitch system, the present invention is also applicable to the exposure apparatus based on the step-and-stitch system in which at least two patterns are partially overlaid and transferred on the substrate P, and the substrate P is successively moved.

As for the type of the exposure apparatus EX, the present invention is not limited to the exposure apparatus for the semiconductor device production which exposes the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask. In the embodiments described above, the light-transmissive type mask (reticle) is used, in which the predetermined light-shielding pattern (or phase pattern or dimming or light-reducing pattern) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be subjected to the exposure. The present invention is also applicable to the exposure apparatus (lithography system) in which a line-and-space pattern is formed on a wafer W by forming interference fringes on the wafer W, as disclosed in International Publication No. 2001/035168.

When the linear motor is used for the substrate stage PST and/or the mask stage MST, it is allowable to use any one of those of the air floating type using the air bearing and those of the magnetic floating type using the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposite to or facing one another, and each of the stages PST, MST is driven by the electromagnetic force. In this case, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

The exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, an overall adjustment is performed to secure the various accuracies as the entire exposure apparatus. It is desirable that the exposure apparatus is produced in a clean room in which, for example, the temperature and the cleanness are managed.

Figure 17:
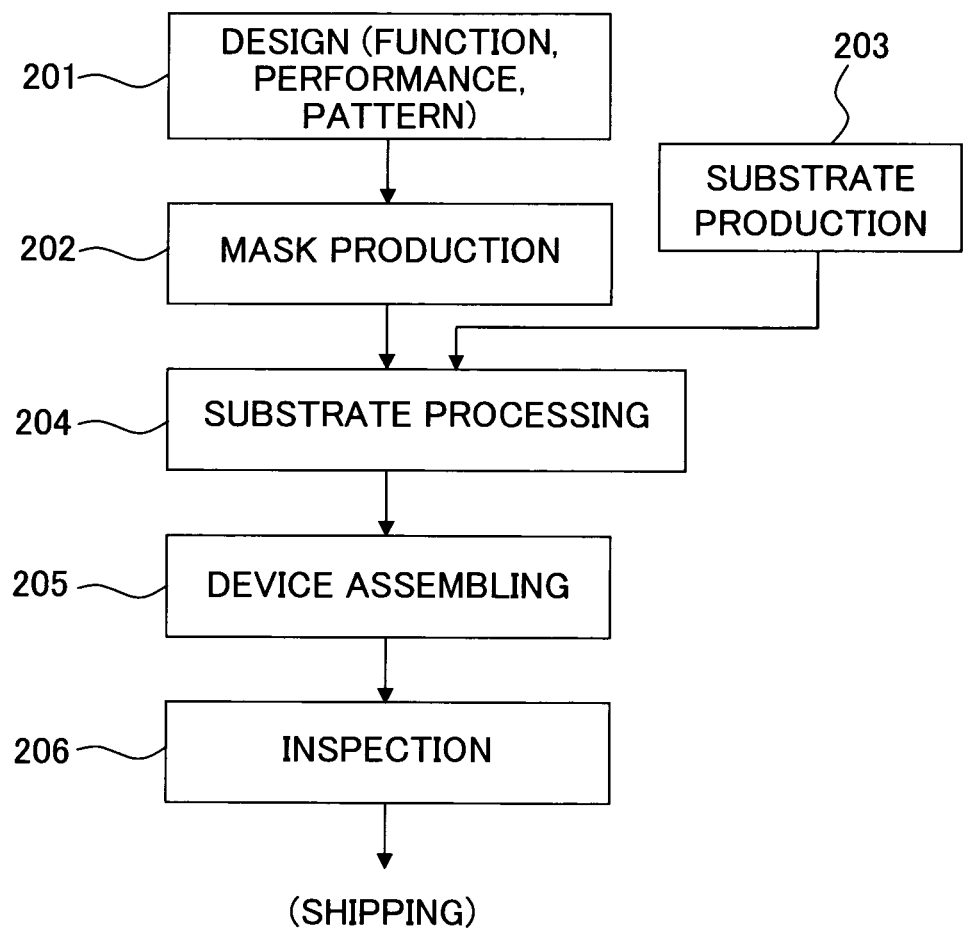
FIG. 17 shows a flow chart showing exemplary steps of producing a semiconductor device.
Figure 18:
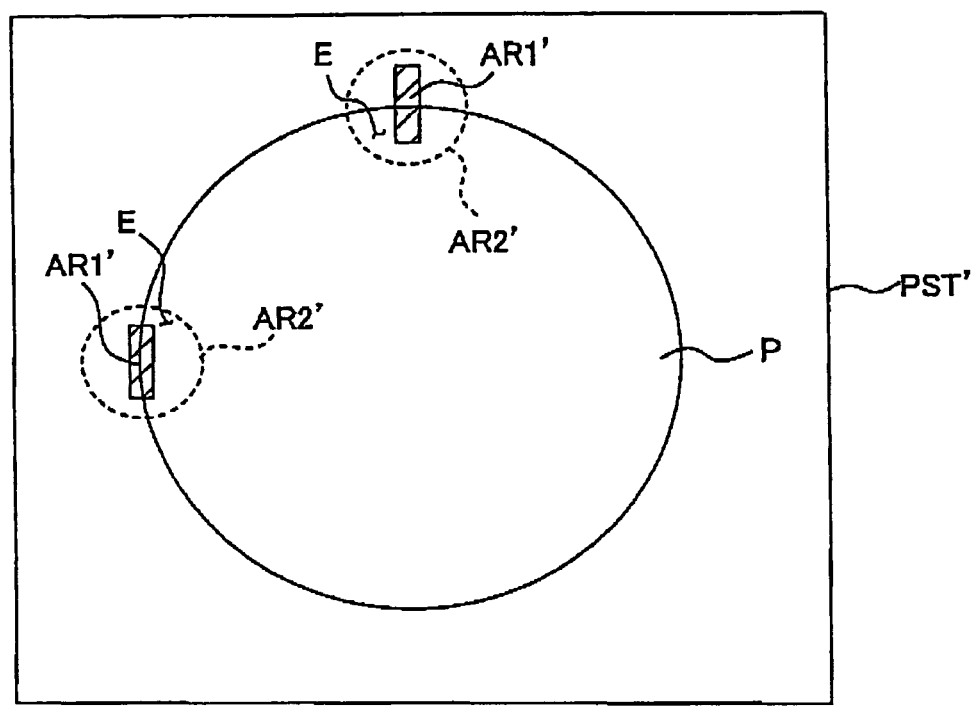
FIG. 18 schematically illustrates the problem involved in the conventional technique.

As shown in FIG. 17, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

INDUSTRIAL APPLICABILITY

According to the present invention, it is possible to easily perform the maintenance operation for the substrate-holding unit or the substrate stage and for the exposure apparatus. Further, it is possible to suppress the decrease in the rate of operation of the exposure apparatus. Therefore, it is possible to improve the productivity of the device production. According to the present invention, it is possible to easily perform the maintenance operation for the liquid immersion exposure apparatus. The substrate can be exposed satisfactorily in the state in which the inflow of the liquid is suppressed.

The invention claimed is:

1. A substrate-holding unit which holds a substrate, to be exposed with an exposure beam through a liquid, the substrate-holding unit comprising:
a base member;
a first holding portion which is formed on the base member and which holds the substrate, the liquid covering a first portion of an upper surface of the substrate including an area being exposed while leaving a second portion of the upper surface of the substrate not covered in the liquid; and
a second holding portion which is formed on the base member and which holds a plate in a vicinity of the substrate held by the first holding portion so that an upper surface of plate is provided around the upper surface of the substrate held by the first holding portion,
wherein the second holding portion has a first outer wall which surrounds the first holding portion, a second outer wall which surrounds the first outer wall, and a plurality of protrusions formed on the base member, the plurality of protrusions being provided between the first outer wall and the second outer wall,
the plate is held on the protrusions of the second holding portion by a negative pressure provided to a first space surrounded by the first and second outer walls, and a back surface of the plate,
the first holding portion has a support portion and a circumferential wall,
the substrate is held on the support portion by a negative pressure provided to a second space surrounded by the circumferential wall and formed on a side of a back surface of the substrate, and
the negative pressure provided to the first holding portion is controlled independently from the negative pressure provided to the second holding portion.

2. The substrate-holding unit according to claim 1, wherein the upper surface of the plate held by the second holding portion forms a flat portion, which is substantially flush with the upper surface of the substrate held by the first holding portion.

3. The substrate-holding unit according to claim 2, wherein the flat portion of the plate is provided to surround the substrate; and wherein a gap is formed between an edge of the substrate held by the first holding portion and an edge of the plate held by the second holding portion.

4. The substrate-holding unit according to claim 3, wherein the gap between the edge of the substrate and the edge of the plate is 0.1 to 1.0 mm.

5. The substrate-holding unit according to claim 1, wherein the support portion has a plurality of protrusions, the circumferential wall is formed on the base member; and the substrate is held on the protrusions of the support portion by the negative pressure provided to the second space surrounded by the base member, the circumferential wall, and the back surface of the substrate.

6. The substrate-holding unit according to claim 5, wherein the protrusions include a plurality of support pins.

7. The substrate-holding unit according to claim 1, wherein the plate is held on the protrusions of the second holding portion by the negative pressure provided to the first space surrounded by the base member, the first and second outer walls, and the back surface of the plate.

8. The substrate-holding unit according to claim 7, wherein the protrusions of the second holding portion include a plurality of support pins.

9. The substrate-holding unit according to claim 7, further comprising:
a first vacuum system which provides the negative pressure to the second space surrounded by the circumferential wall and formed on the side of the back surface of the substrate; and
a second vacuum system which is provided independently from the first vacuum system and which provides the negative pressure to the first space formed on the side of the back surface of the plate.

10. The substrate-holding unit according to claim 1, wherein the plate is provided exchangeably.

11. An exposure apparatus comprising the substrate-holding unit as defined in claim 1.

12. The exposure apparatus according to claim 11, wherein the substrate is exposed by projecting an image of a pattern through the liquid onto the substrate held by the first holding portion.

13. The exposure apparatus according to claim 12, wherein the base member is movable.

14. The exposure apparatus according to claim 13, wherein a mirror for an interferometer is formed on the base member to measure a position of the base member.

15. The exposure apparatus according to claim 12, wherein the upper surface of the plate is liquid-repellent with respect to the liquid.

16. The exposure apparatus according to claim 12, wherein the back surface of the plate is liquid-repellent with respect to the liquid.

17. The exposure apparatus according to claim 12, wherein the plate has a reference portion used for positioning the substrate with respect to the image of the pattern.

18. The exposure apparatus according to claim 11, wherein the plate is formed of silica glass.

19. The exposure apparatus according to claim 11, wherein the plate has a thickness which is approximately same as that of the substrate.

20. A method for producing a device, comprising:
exposing the substrate by the exposure apparatus as defined in claim 11; and
processing the exposed substrate.

21. The substrate-holding unit according to claim 1, further comprising:
a liquid recovery port which is formed on the base member and which recovers the liquid inflowed through a gap between the substrate held by the first holding portion and the plate held by the second holding portion.

22. The substrate-holding unit according to claim 21, wherein the second holding portion holds the plate on the protrusions of the second holding portion by providing the negative pressure to the first space surrounded by the base member, the first and second outer walls, and the back surface of the plate.

23. The substrate-holding unit according to claim 22, wherein the liquid recovery port is provided on the base member separately from a suction port which generates the negative pressure in the first space surrounded by the base member, the first and second outer walls, and the plate.

24. The substrate-holding unit according to claim 22, wherein:
the support portion has a plurality of protrusions formed on the base member, and the circumferential wall is formed on the base member;
the first holding portion holds the substrate on the protrusions of the support portion by providing the negative pressure to the second space surrounded by the base member, the circumferential wall, and the back surface of the substrate; and
the liquid recovery port is formed outside the second space formed on the side of the back surface of the substrate and the first space formed on the side of the back surface of the plate.

25. The substrate-holding unit according to claim 24, wherein the liquid recovery port is formed between the circumferential wall of the first holding portion and the first outer wall of the second holding portion.

26. The substrate-holding unit according to claim 24, wherein the base member has an inclined surface which inclines downwardly toward the liquid recovery port and which collects, to the liquid recovery port, the liquid inflowed through the gap formed between the substrate held by the first holding portion and the plate held by the second holding portion.

27. The substrate-holding unit according to claim 21, wherein the upper surface of the plate forms a flat portion, which is substantially flush with the upper surface of the substrate, around the substrate.

28. The substrate-holding unit according to claim 27, wherein the gap between an edge of the substrate and an edge of the plate is 0.1 to 1.0 mm.

29. The substrate-holding unit according to claim 27, wherein the flat portion is liquid-repellent.

30. The substrate-holding unit according to claim 21, wherein the liquid inflowed through the gap is recovered by the liquid recovery port during exchange of the substrate.

31. The substrate-holding unit according to claim 30, wherein the liquid recovery port formed on the base member is connectable to a vacuum system, and the liquid is sucked through the liquid recovery port during the exchange of the substrate.

32. The substrate-holding unit according to claim 21, wherein a side surface of the plate, which is opposite to a side surface of the substrate, is liquid-repellent.

33. The substrate-holding unit according to claim 21, wherein a thickness of the substrate is substantially same as a thickness of the plate.

34. An exposure apparatus comprising the substrate-holding unit as defined in claim 21, wherein the substrate is exposed by radiating the exposure beam through the liquid onto the substrate held by the substrate-holding unit.

35. A method for producing a device, the method comprising:
exposing the substrate with the exposure apparatus as defined in claim 34; and
processing the exposed substrate to produce the device.

36. The substrate-holding unit according to claim 21, wherein the base member is movable.

37. The substrate-holding unit according to claim 36, wherein a mirror for an interferometer is formed on the base member to measure a position of the base member.

38. The substrate-holding unit according to claim 1, wherein the circumferential wall is a continuous wall.

* * * * *